(12) United States Patent
Kondo

(10) Patent No.: US 10,523,357 B2
(45) Date of Patent: Dec. 31, 2019

(54) LASER COMPONENT AND LASER GENERATING APPARATUS

(71) Applicant: FUJI XEROX CO., LTD., Tokyo (JP)

(72) Inventor: Takashi Kondo, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 232 days.

(21) Appl. No.: 15/629,016

(22) Filed: Jun. 21, 2017

(65) Prior Publication Data

US 2018/0034578 A1   Feb. 1, 2018

(30) Foreign Application Priority Data

Jul. 27, 2016 (JP) ................. 2016-147879

(51) Int. Cl.
| | |
|---|---|
| *H04J 14/08* | (2006.01) |
| *H04J 3/06* | (2006.01) |
| *H01S 5/10* | (2006.01) |
| *H01S 5/14* | (2006.01) |
| *H04B 10/50* | (2013.01) |

(52) U.S. Cl.
CPC ............ *H04J 14/08* (2013.01); *H01S 5/1014* (2013.01); *H01S 5/141* (2013.01); *H04B 10/503* (2013.01); *H04B 10/506* (2013.01); *H04J 3/0682* (2013.01)

(58) Field of Classification Search
CPC ..... H01L 25/167; H01S 5/1014; H01S 5/141; H01S 5/146; H01S 5/4056
See application file for complete search history.

(56) References Cited

U.S. PATENT DOCUMENTS

| | | | |
|---|---|---|---|
| 6,192,059 B1* | 2/2001 | Karioja | H01S 5/14 372/20 |
| 2004/0076198 A1 | 4/2004 | Spoonhower et al. | |
| 2015/0037877 A1* | 2/2015 | Peng | G01N 21/6428 435/288.7 |
| 2015/0189761 A1* | 7/2015 | Chan | C09D 11/52 427/125 |
| 2018/0034578 A1* | 2/2018 | Kondo | H04B 10/506 |

FOREIGN PATENT DOCUMENTS

| | | |
|---|---|---|
| JP | 07-154021 A | 6/1995 |
| JP | 2001-517866 A | 10/2001 |
| JP | 2004-140371 A | 5/2004 |
| WO | 99/015934 A1 | 4/1999 |

* cited by examiner

*Primary Examiner* — Raj Jain
(74) *Attorney, Agent, or Firm* — Sughrue Mion, PLLC

(57) ABSTRACT

A laser component includes multiple laser devices arranged in an array to include different emission wavelengths, and a driving unit that, while switching each of the laser devices along the array into a turn-ON-enabled state that enables the laser device to turn to an ON state, brings one of the laser devices that has an emission wavelength corresponding to a predetermined wavelength into an ON state and maintains the ON state.

6 Claims, 28 Drawing Sheets

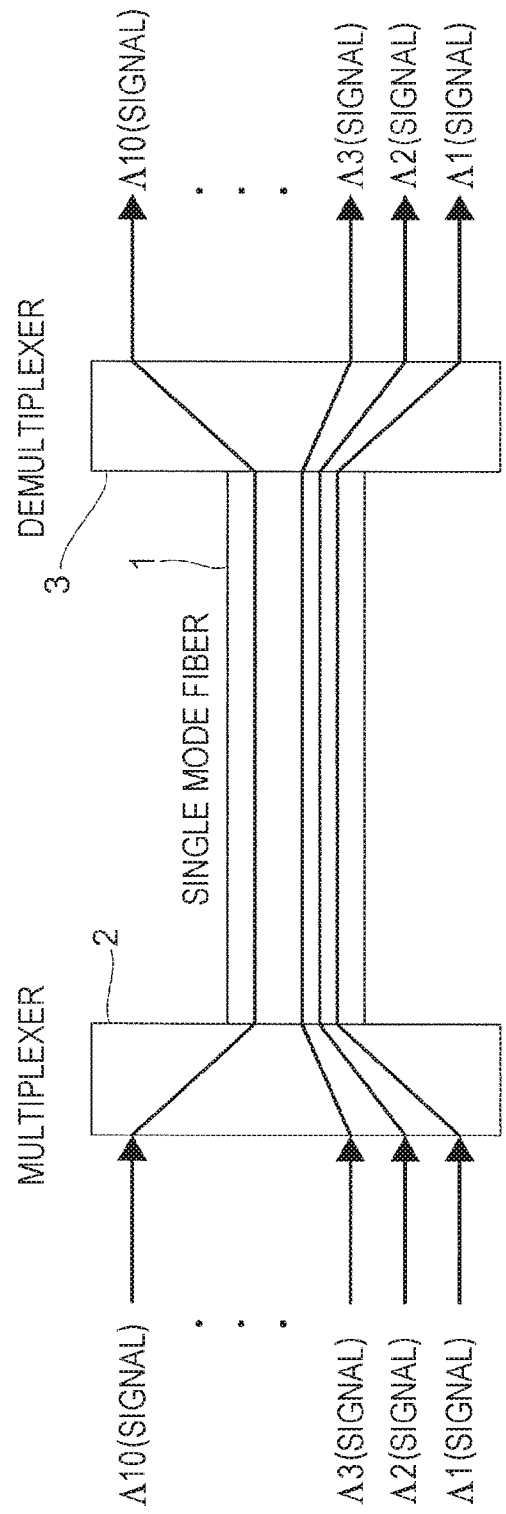

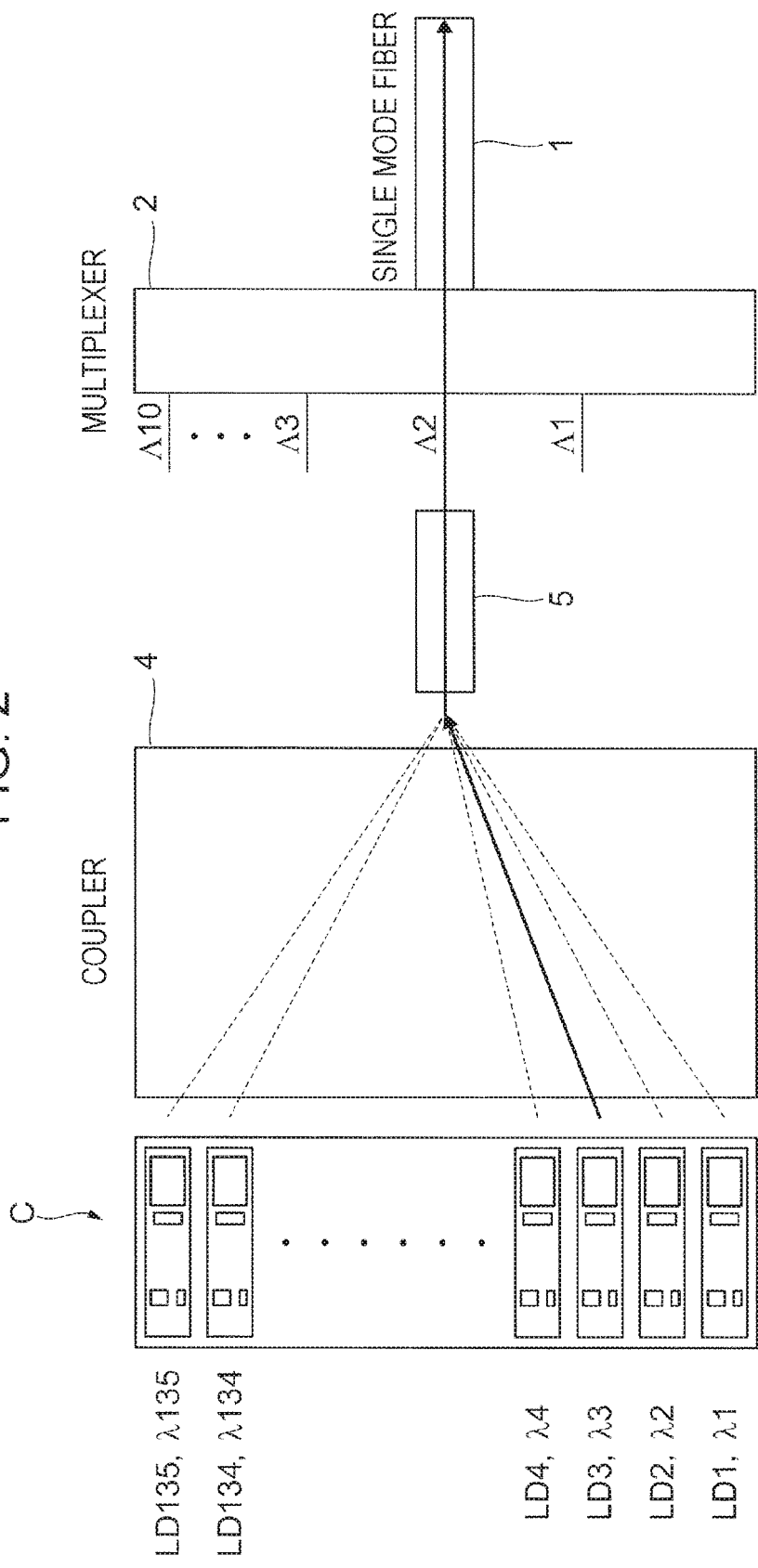

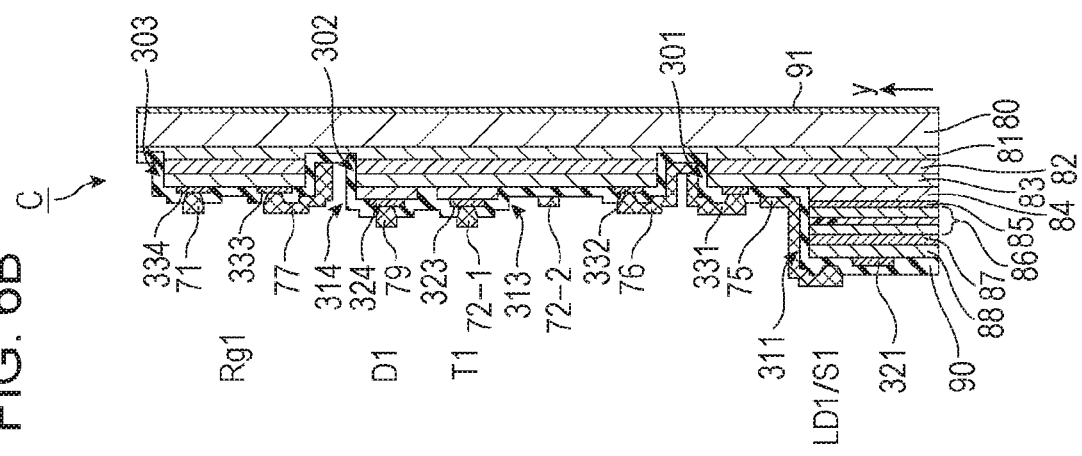
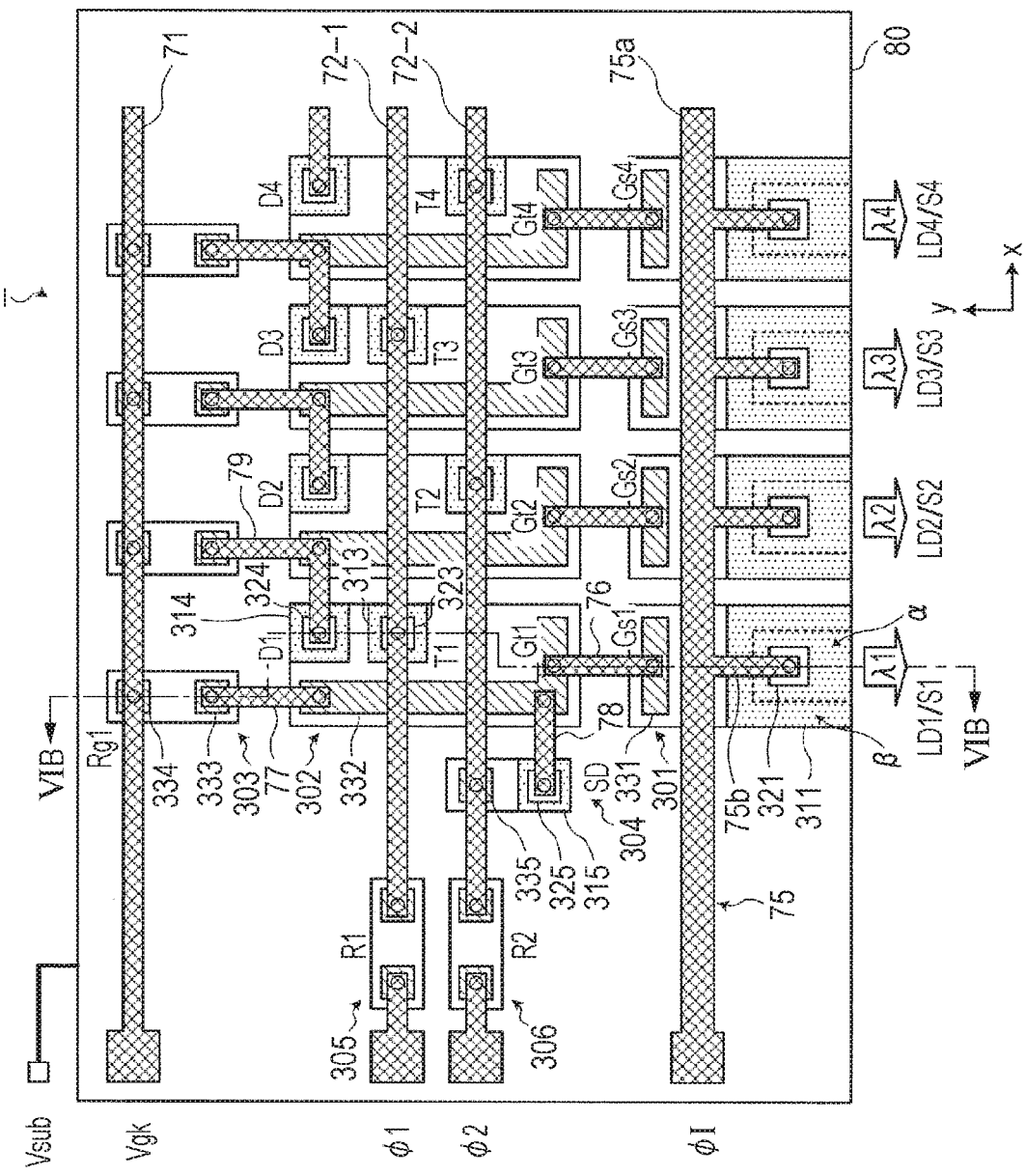

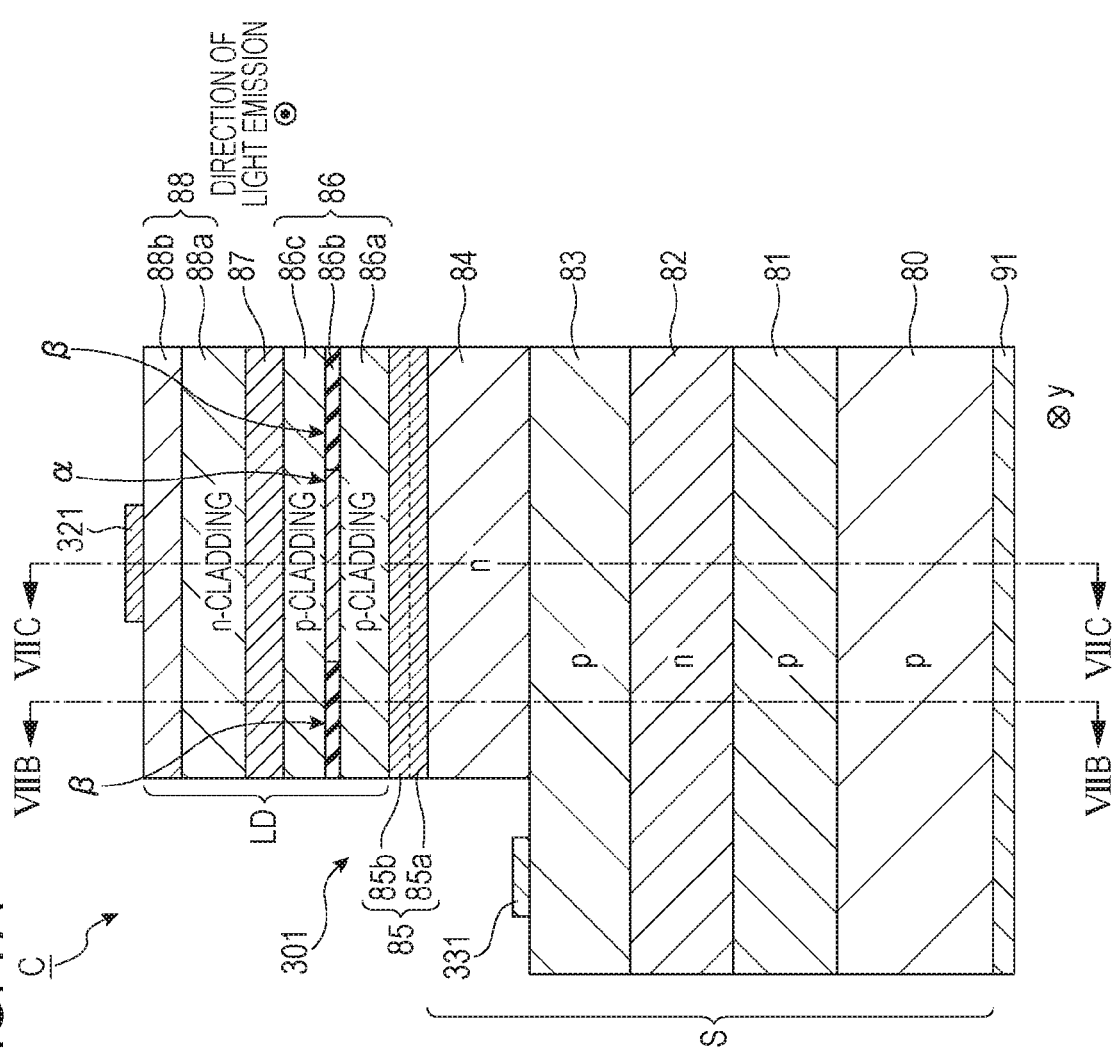

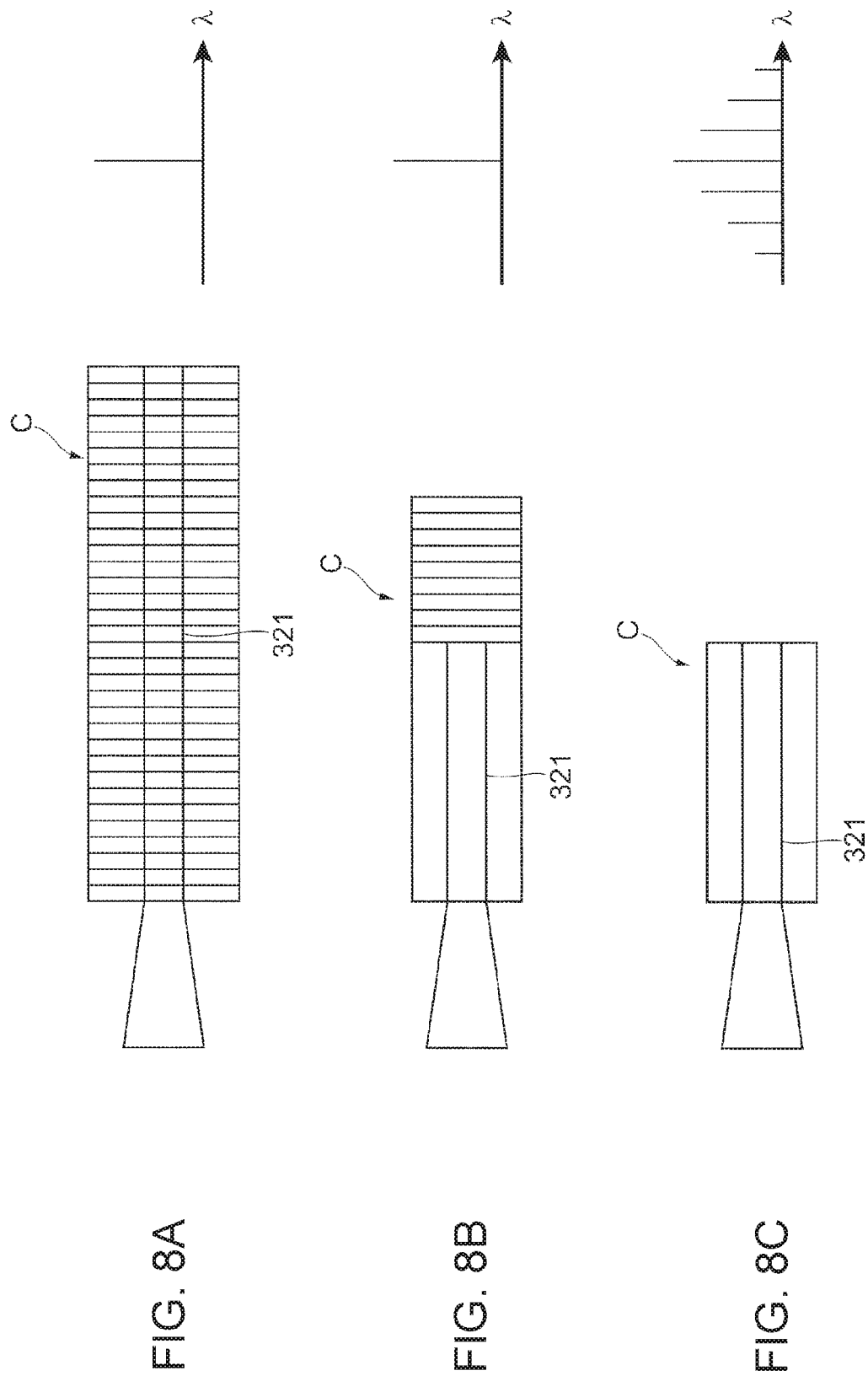

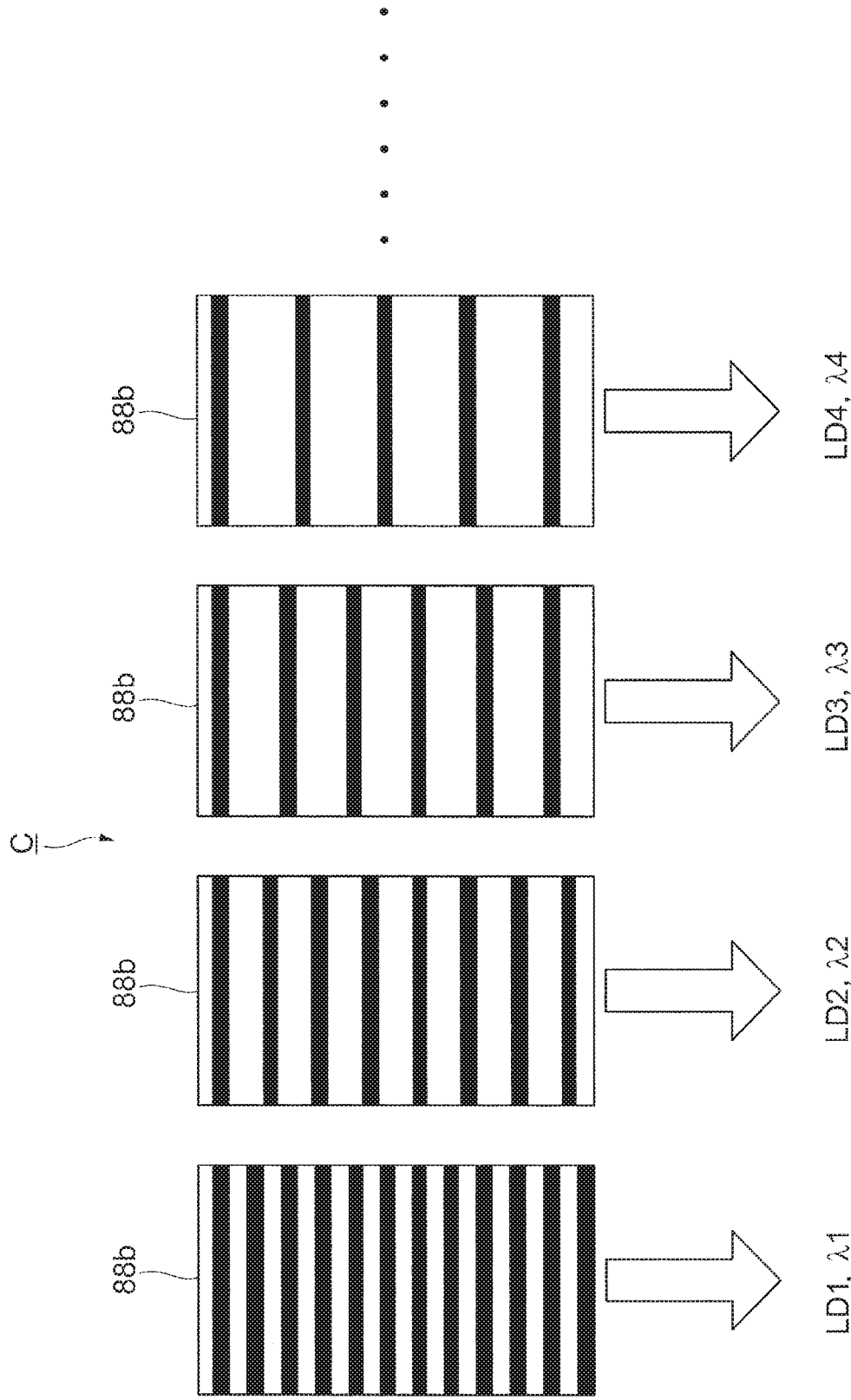

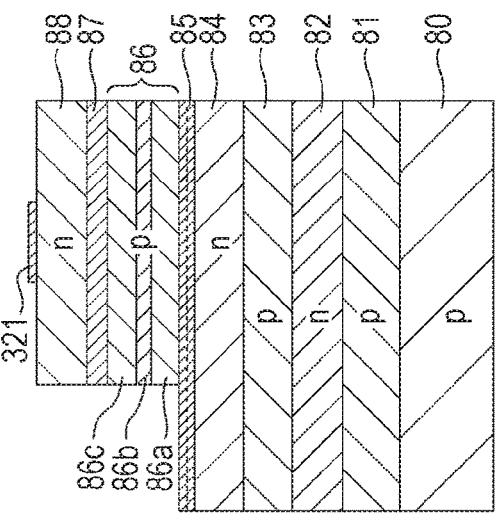
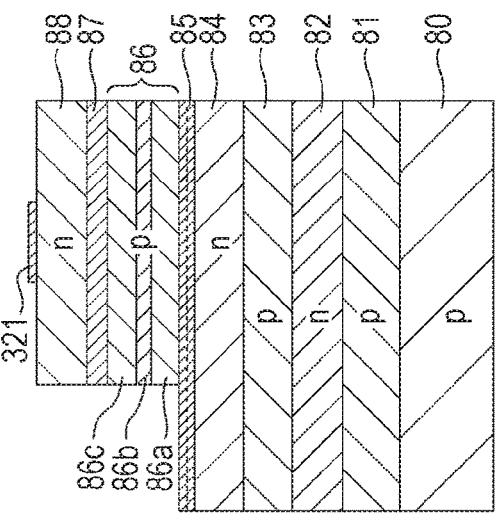
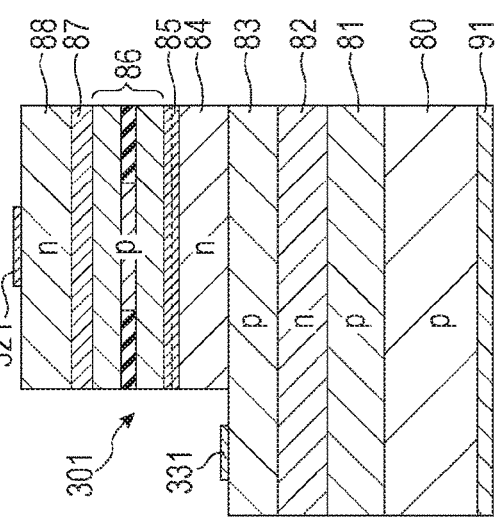
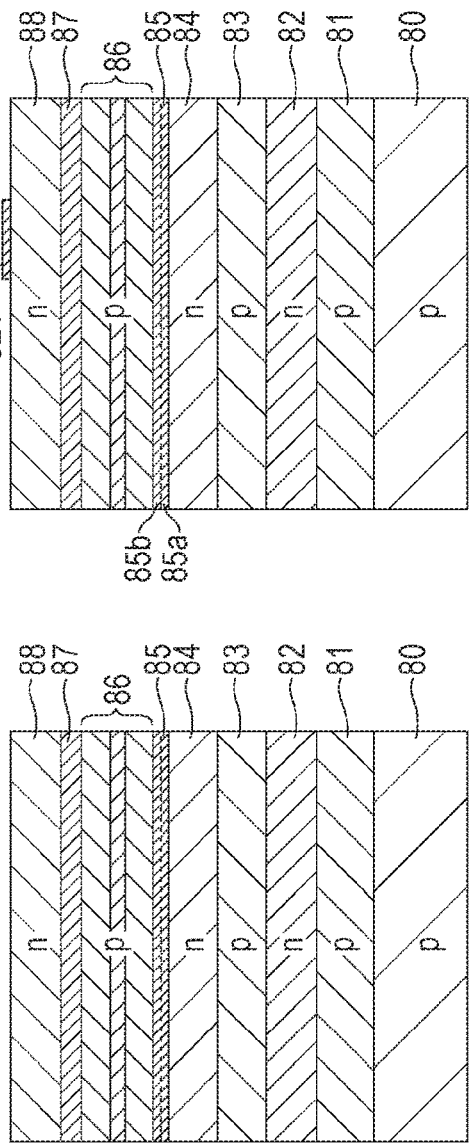
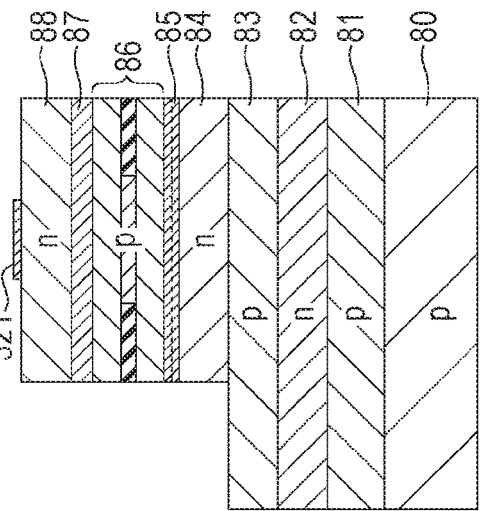
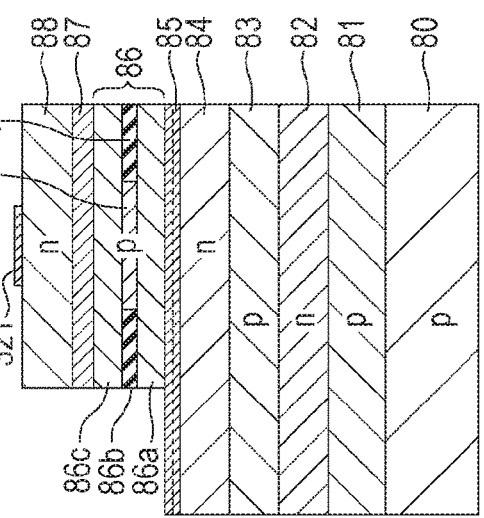

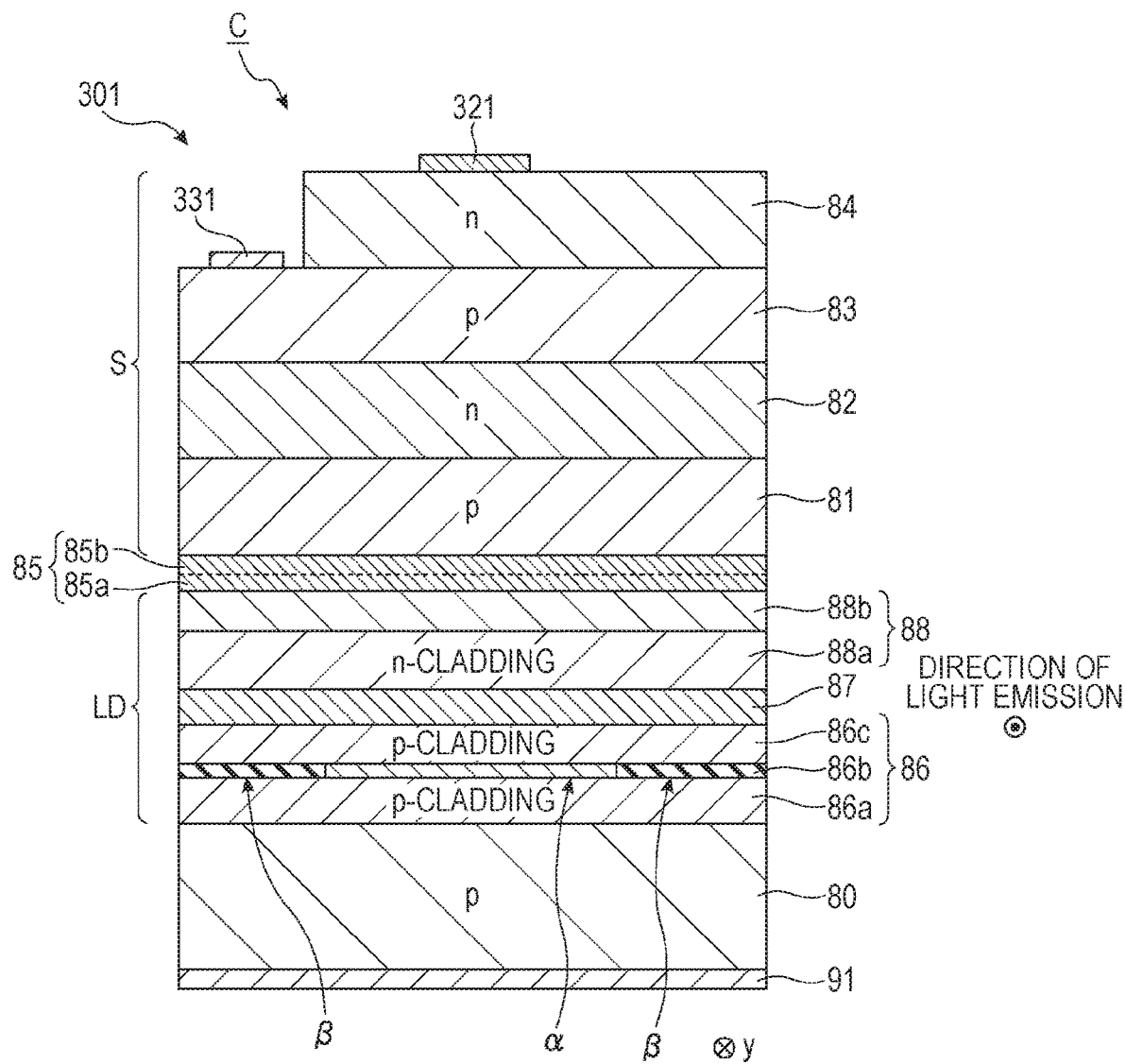

LASER COMPONENT AND LASER GENERATING APPARATUS

CROSS-REFERENCE TO RELATED APPLICATIONS

This application is based on and claims priority under 35 USC 119 from Japanese Patent Application No. 2016-147879 filed Jul. 27, 2016.

BACKGROUND

Technical Field

The present invention relates to a laser component and a laser generating apparatus.

SUMMARY

According to an aspect of the invention, there is provided a laser component including multiple laser devices arranged in an array to include different emission wavelengths, and a driving unit that, while switching each of the laser devices along the array into a turn-ON-enabled state that enables the laser device to turn to an ON state, brings one of the laser devices that has an emission wavelength corresponding to a predetermined wavelength into an ON state and maintains the ON state.

BRIEF DESCRIPTION OF THE DRAWINGS

Exemplary embodiments of the present invention will be described in detail based on the following figures, wherein:

FIG. 1 illustrates an overview of optical communication;

FIG. 2 illustrates a laser component that emits a wavelength of light according to a first exemplary embodiment;

FIGS. 4A to 4C illustrate the wavelength of light output by a laser component, of which FIG. 4A illustrates a state at a reference environmental temperature, FIG. 4B illustrates a state at an elevated environmental temperature above the reference environmental temperature, and FIG. 4C illustrates a state in which the laser diode made to emit light has been switched to another laser diode in response to a rise in environmental temperature;

FIGS. 6A and 6B are respectively an exemplary plan layout view and an exemplary cross-sectional view of the laser component according to the first exemplary embodiment, of which FIG. 6A is a plan layout view of the laser component, and FIG. 6B is a cross-sectional view taken along a line VIB-VIB in FIG. 6A;

FIGS. 7A to 7C are detailed illustrations of an island formed by stacking a setting thyristor and a laser diode, of which FIG. 7A is an enlarged cross-sectional view, FIG. 7B is a cross-sectional view taken along a line VIIB-VIIB in FIG. 7A, and FIG. 7C is a cross-sectional view taken along a line VIIC-VIIC in FIG. 7A;

FIGS. 8A to 8C each illustrate the structure of a laser diode, of which FIG. 8A illustrates a distributed feedback (DFB) laser, FIG. 8B illustrates a distributed Bragg reflector (DBR) laser, and FIG. 8C illustrates a Fabry-Perot (FP) laser;

FIG. 9 illustrates the relationship between the emission wavelength of each laser diode and the pitch of diffraction gratings;

FIGS. 10A to 10C illustrate a stacked structure of a setting thyristor and a laser diode in further detail, of which FIG. 10A is a schematic energy band diagram of the stacked structure of the setting thyristor and the laser diode, FIG. 10B is an energy band diagram of a tunnel junction layer in reverse biased condition, and FIG. 10C illustrates the current-voltage characteristics of the tunnel junction layer;

FIGS. 12A to 12F illustrate a method for fabricating a laser component, of which FIG. 12A illustrates a semiconductor laminate forming step, FIG. 12B illustrates a step of forming an n-ohmic electrode, FIG. 12C illustrates an etching step for exposing a tunnel junction layer, FIG. 12D illustrates a step of forming the current-blocking portion of a current confinement layer, FIG. 12E illustrates an etching step for exposing a p-gate layer, and FIG. 12F illustrates a step of forming a p-ohmic electrode and a back electrode;

FIGS. 13A to 13C illustrate materials forming a metal-like-conductivity group III-V compound layer, of which FIG. 13A illustrates the band gap of InNAs with respect to the composition ratio x of InN, FIG. 13B illustrates the band gap of InNSb with respect to the composition ratio x of InN, and FIG. 13C illustrates the lattice constants of group VI elements and group III-V compounds with respect to band gap;

FIGS. 18A and 18B illustrate the optical intensity of a laser diode, of which FIG. 18A illustrates optical intensity with respect to current, and FIG. 18B illustrates changes in optical intensity with respect to time;

FIG. 28 is a detailed illustration of an island formed by stacking a setting thyristor and a laser diode in a laser component according to an eighth exemplary embodiment.

DETAILED DESCRIPTION

Figure 3A:
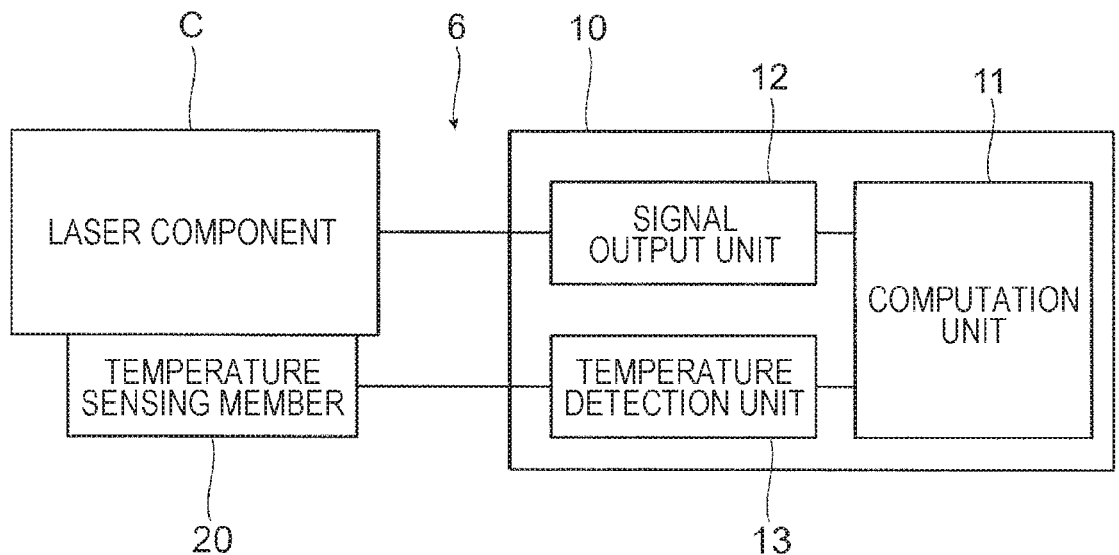
FIGS. 3A and 3B respectively illustrate the configuration of a laser generating unit, and how a wavelength λ emitted by each laser diode changes with environmental temperature T.

Hereinafter, exemplary embodiments of the present invention will be described in detail with reference to the accompanying drawings.

The following description uses chemical symbols to represent chemical elements, such as Al for aluminum.

First Exemplary Embodiment

Overview of Optical Communication

FIG. 1 illustrates an overview of optical communication.

The following components are used in optical communication: an optical fiber 1 that propagates light, a multiplexing unit 2 at the transmitting end that superimposes light beams of multiple wavelengths $\Lambda 1$ to $\Lambda 10$ (to be referred to as wavelength $\Lambda$ when not distinguished from each other) on each other, and a demultiplexing unit 3 at the receiving end that splits light into multiple wavelengths $\Lambda 1$ to $\Lambda 10$. The multiplexing unit 2 is sometimes referred to as multiplexer, and the demultiplexing unit 3 is sometimes referred to as demultiplexer.

Although FIG. 1 depicts 10 wavelengths $\Lambda 1$ to $\Lambda 10$, any number of wavelengths (e.g., 100) may be used.

A signal is carried on each wavelength $\Lambda$ of light. A laser (a laser component C described later) that emits light at wavelength $\Lambda$ is used as a light source.

The multiplexing unit 2 superimposes light beams of multiple wavelengths on each other into a single beam of light. That is, light beams are wavelength-multiplexed.

The optical fiber 1 is, for example, a single mode fiber made of silica glass that transmits wavelength-multiplexed light. For the optical fiber 1 described above, multiple bands (such as bands C, S, L, U, and O) are set in the range of wavelength $\Lambda$ from 1200 nm to 1700 nm.

The demultiplexing unit 3 splits wavelength-multiplexed light into individual wavelengths $\Lambda$.

Optical communication using wavelength-multiplexed light requires that the wavelength $\Lambda$ does not fluctuate. Unfortunately, a laser, which is a semiconductor device (semiconductor laser), experiences changes in emission (oscillation) wavelength as the environmental temperature changes. As will be described later, the wavelength increases as the environmental temperature (the temperature of the laser) rises, and decreases as the environmental temperature falls. Accordingly, if a single wavelength $\Lambda$ is to be assigned to a single semiconductor laser, a configuration is employed that ensures that the wavelength $\Lambda$ of the semiconductor laser does not fluctuate. For example, a semiconductor laser is used in combination with a Peltier element to control the environmental temperature of the semiconductor laser to a predetermined value. This method has been traditionally used to minimize fluctuations in the wavelength $\Lambda$ of the semiconductor laser.

Use of such a method has led to increased apparatus size at the transmitting end, and also increased operational cost due to large power consumption.

Accordingly, the laser component C according to the first exemplary embodiment employs the following configuration. That is, the laser component C includes multiple laser devices with different emission wavelengths. Of these laser devices, a given laser device that emits a predetermined wavelength of light is brought into the ON state, and if the wavelength of light emitted from this laser device is displaced (shifted) from the predetermined wavelength, the laser device is switched to another laser device that emits a predetermined wavelength of light to thereby minimize fluctuations in the wavelength of light emitted from the laser component C.

FIG. 2 illustrates the laser component C that emits a wavelength $\Lambda$ (wavelength $\Lambda 2$ in FIG. 2) of light according to the first exemplary embodiment. In FIG. 2, the optical fiber 1, the multiplexing unit 2, a coupling unit 4, and an optical amplifier 5 are illustrated in addition to the laser component C. The coupling unit 4 is sometimes referred to as coupler.

The following description assumes that the laser component C emits one wavelength $\Lambda 2$ used for the optical communication illustrated in FIG. 1. That is, to perform the optical communication illustrated in FIG. 1, the same number of laser components C as the number of wavelengths $\Lambda$ used (10 in FIG. 1) is to be used.

The laser component C includes laser diodes LD1 to LD135 (to be referred to as laser diode LD when not distinguished from each other) that, when an environmental temperature T is a reference environmental temperature $T_0$ (e.g., 25° C.), respectively emit (oscillates) light of wavelengths $\lambda 1$ to $\lambda 135$, for example. The laser diodes LD1 to LD135 are arranged to form a light emitting device (laser device) array (a light emitting unit 102). The laser component C is controlled by a control unit 10 described later to emit a predetermined wavelength $\lambda$ (wavelength $\lambda 3$ in FIG. 2) of light. That is, at the reference environmental temperature $T_0$, the wavelength $\lambda 3$ and the wavelength $\Lambda 2$ correspond to each other. As will be described later, when it is stated that the wavelength $\lambda 3$ and the wavelength $\Lambda 2$ correspond to each other, this includes not only when the two wavelengths completely coincide but also when the wavelength $\lambda 3$ falls within an allowable range within a wavelength channel ch (a wavelength channel ch2 for the wavelength $\Lambda 2$ as will be described later) that is set as the wavelength $\Lambda 2$.

The coupling unit 4 guides light emitted by the laser component C to the optical amplifier 5. In many cases, the coupling unit 4 generally refers to a component that guides all or some of beams of laser emitted by multiple laser devices to the optical fiber 1. In this regard, as illustrated in FIG. 2, the coupling unit 4 is designed to guide light emitted by each of multiple laser diodes LD assuming that the multiple laser diodes LD emit light simultaneously, and hence herein referred to as "coupling unit" even through the coupling unit 4 guides a single wavelength of light emitted by the laser component C.

Examples of the coupling unit 4 include a multi mode interference (MMI) waveguide, a grating, and an arrayed waveguide grating (AWG).

The multiplexer 2 mentioned above has the same configuration as that of the coupling unit 4.

The optical amplifier 5 amplifies the light that has passed through the coupling unit 4, and transmits the amplified light to the multiplexer 2. Examples of the optical amplifier 5 include a semiconductor optical amplifier (SOA) and an electroabsorption (EA) optical modulator.

The multiplexing unit 2 and the optical fiber 1 have been already described above.

Since the arrangement in FIG. 2 assumes that the laser component C emits light at wavelength Λ2 (=wavelength λ3), wavelengths of light other than the wavelength Λ2, that is, wavelengths Λ3 to Λ10 enter the multiplexing unit 2. Although not illustrated, the wavelengths Λ1 and Λ3 to Λ10 of light enter the multiplexing unit 2 from the corresponding laser components C via the corresponding coupling units 4 and the corresponding optical amplifiers 5.

The optical amplifier 5 may be disposed between the multiplexing unit 2 and the optical fiber 1. If the light entering the optical fiber 1 has a sufficient intensity and does not require amplification, the optical amplifier 5 may not be provided.

Figure 3B:
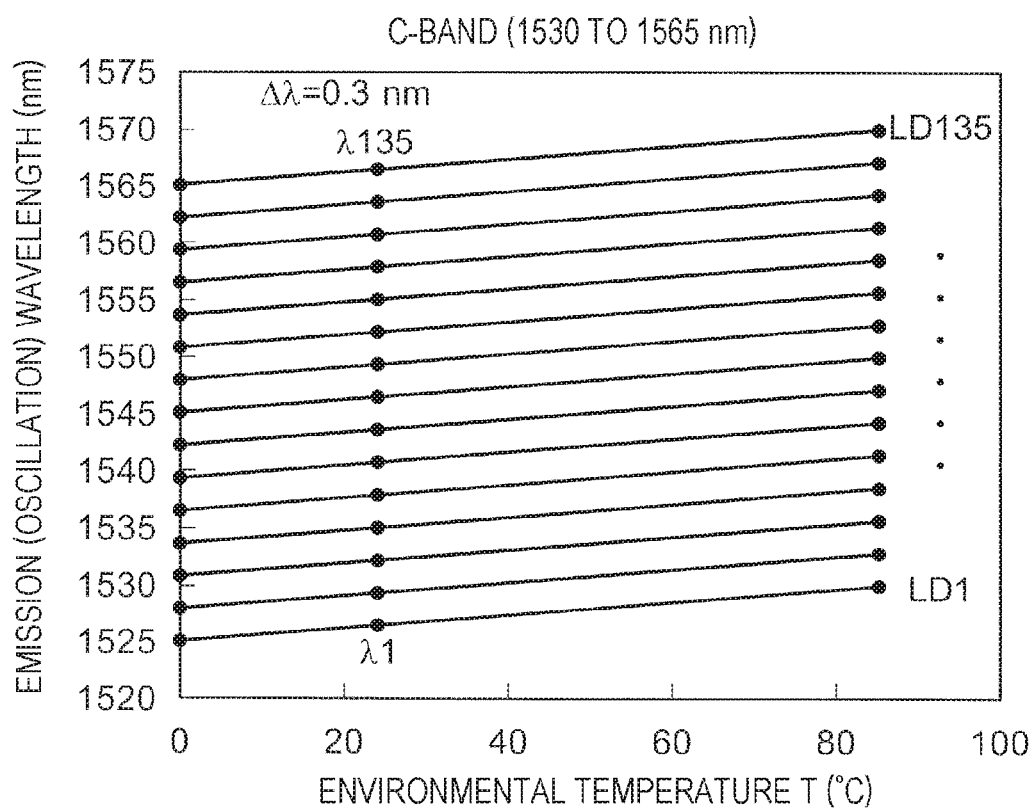

FIGS. 3A and 3B respectively illustrate the configuration of the laser generating unit 6, and how the wavelength λ emitted by the laser diode LD changes with environmental temperature T.

As illustrated in FIG. 3A, the laser generating unit 6 includes the laser component C, the control unit 10, and a temperature sensing member 20. The laser generating unit 6 is an example of a laser generating apparatus, the control unit 10 is an example of a controller, and the temperature sensing member 20 is an example of a temperature sensing unit.

The control unit 10 includes a computation unit 11, a signal output unit 12, and a temperature detection unit 13. The computation unit 11 includes components such as a central processing unit (CPU) that executes a computation process. The computation unit 11 is connected to the signal output unit 12 and the temperature detection unit 13. The signal output unit 12 is connected to the laser component C, in addition to the computation unit 11. The signal output unit 12 generates, based on the result of computation performed by the computation unit 11, a signal for driving the laser component C, and outputs (transmits) the signal to the laser component C. The temperature detection unit 13 is connected to the temperature sensing member 20, in addition to the computation unit 11. The temperature detection unit 13 converts the environmental temperature T sensed by the temperature sensing member 20 into a signal, and transmits the signal to the computation unit 11.

That is, the signal output unit 12 generates a signal based on the environmental temperature T sensed by the temperature sensing member 20, and outputs (transmits) the signal to the laser component C.

The temperature sensing member 20 may be any member that is disposed in contact with or in proximity to the laser component C to measure the environmental temperature T of the laser component C. Examples of the temperature sensing member 20 include a thermocouple and a thermistor.

For optical fibers made of silica glass (silica glass-based optical fibers) such as the optical fiber 1, the wavelength range from 1530 to 1565 nm is called C-band, which is widely used. Now, suppose that this wavelength range is to be covered, assuming that the wavelength spacing Δλ is 0.3 nm with the environmental temperatures T ranging from 0° C. to 85° C., for example. As illustrated in FIG. 3B, the wavelength emitted (oscillated) by the laser diode LD increases with increasing environmental temperature T, and decreases with decreasing environmental temperature T.

In this case, it is appreciated as illustrated in FIG. 3B that the wavelength range from 1530 to 1565 nm is covered by use of 135 laser diodes LD with Δλ of 0.3 nm. It is assumed that the laser diode LD1 emits the shortest wavelength λ of light, and the laser diode LD135 emits the longest wavelength λ of light.

That is, the resulting configuration may be such that the laser diode LD1 emits a wavelength of 1530 nm at 85° C., and the laser diode LD135 emits a wavelength of 1565 nm at 0° C.

Further, it is assumed that the reference environmental temperature $T_0$ is 25° C., and as for the wavelength λ of light emitted by the laser diode LD at this temperature, the laser diodes LD1 to LD135 respectively emit light of wavelengths λ1 to λ135. That is, it is assumed that the laser diodes LD1 to LD135 are arranged in increasing order of their emission wavelengths. This order may be reversed.

Next, an overview of operation of the laser component C is described below.

Figure 4A:
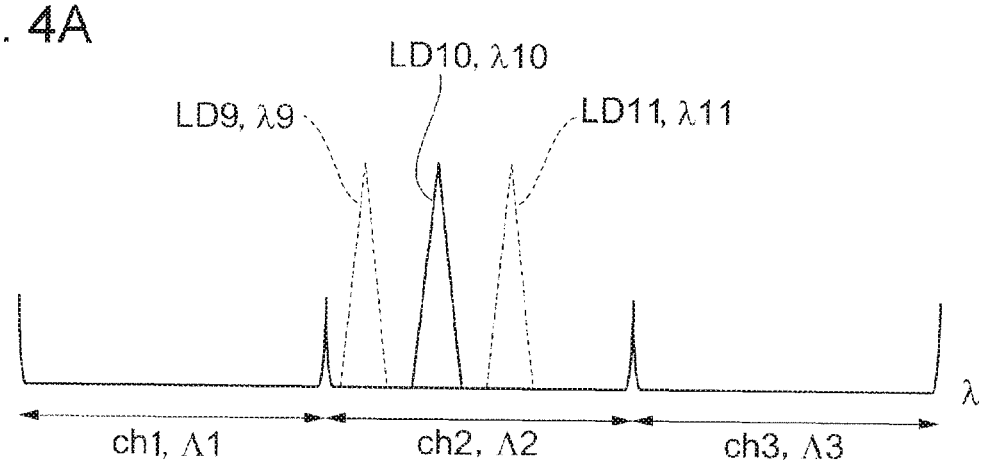
Figure 4B:
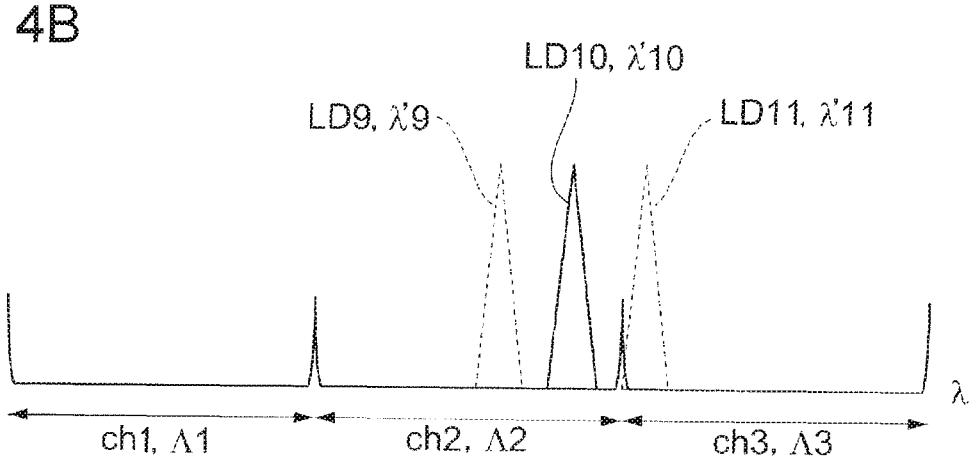
Figure 4C:
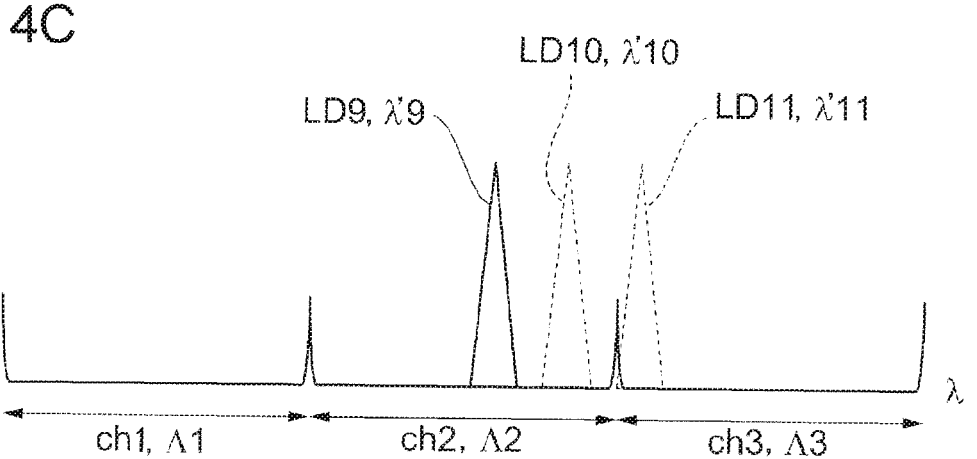

FIGS. 4A to 4C illustrate the wavelength λ of light output by the laser component C. FIG. 4A illustrates a state at the reference environmental temperature $T_0$, FIG. 4B illustrates a state at an elevated environmental temperature T above the reference environmental temperature $T_0$, and FIG. 4C illustrates a state in which the laser diode LD made to emit light has been switched to another laser diode LD in response to a rise in environmental temperature T.

The horizontal axis in FIGS. 4A, 4B, and 4C represents the wavelength Λ illustrated in FIG. 1. The wavelength Λ has a predetermined allowable range. The allowable range is herein referred to as wavelength channel ch. Even when the emission wavelength λ of the laser diode LD is within the allowable range, if the emission wavelength λ is displaced toward an end of the allowable range, it is possible that the emission wavelength λ is further displaced to lie outside the allowable range. Accordingly, if the emission wavelength λ of the laser diode LD is displaced toward an end of the wavelength channel ch (allowable range), it is desirable to switch the laser diode LD to another laser diode LD. The following describes such an operation.

In the example in FIG. 1, there are wavelength channels ch1 to ch10 (to be referred to as wavelength channel ch when not distinguished from each other).

It is assumed that the laser component C is specified (required) to output light of the wavelength Λ2, that is, wavelength channel ch2.

Suppose that, at the reference environmental temperature $T_0$, the wavelength λ10 emitted by the laser diode LD10 lies in the central portion of the wavelength channel ch2 as illustrated in FIG. 4A. As for the laser diodes LD9 and LD11 immediately upstream and downstream of the laser diode LD10, the respective wavelengths λ9 and λ11 that can be emitted by the laser diodes LD9 and LD11 lie immediately upstream and downstream of the wavelength λ10. The wavelengths λ that can be emitted by the other laser diodes LD are located far from the wavelength λ10.

Accordingly, the control unit 10 brings the laser diode LD10 of the laser component C to the ON state so that light of the wavelength λ10 is emitted from the laser diode LD10. The other laser diodes LD excluding the laser diode LD10, however, are placed in their OFF state to ensure that these laser diodes LD do not emit light.

Next, as illustrated in FIG. 4B, suppose that as the environmental temperature T rises from the reference environmental temperature $T_0$, the wavelength of light emitted by the laser diode LD10 is displaced to a wavelength λ'10, which lies closer to the longer-wavelength end of the wavelength channel ch2. At this time, the rise in environmental temperature T also causes the wavelengths of light that can be emitted by the laser diodes LD9 and LD11 to shift from the wavelengths λ9 and λ11 to wavelengths λ'9 and λ'11, respectively. At this time, the wavelength λ'9 of light that can be emitted by the laser diode LD9 is located in the central portion of the wavelength channel ch2.

Accordingly, as illustrated in FIG. 4C, the laser diode LD10 is shifted from the ON state to the OFF state, and the laser diode LD9 is shifted from the OFF state to the ON state. This allows the laser component C to continue to output light on the wavelength channel ch2 even when the environmental temperature T changes.

FIGS. 4A, 4B, and 4C are directed to a case where the environmental temperature T becomes higher than the reference environmental temperature $T_0$. In this regard, if the environmental temperature T becomes lower than the reference environmental temperature $T_0$, and the wavelength λ"11 of light emitted by the laser diode LD11 becomes located in the central portion of the wavelength channel ch2, the laser diode LD11 may be brought into the ON state instead of the laser diode LD10.

That is, the laser diodes LD1 to LD135 are sequentially switched to allow light included in the wavelength channel ch2 (wavelength Λ2) to be output when the environmental temperature T is in the range between 0° C. and 85° C.

The same applies to the other wavelength channels ch.

As described above, the laser component C according to the first exemplary embodiment is made to output light on a specified wavelength channel ch (wavelength Λ), without controlling the laser diode LD to a predetermined environmental temperature T by use of a Peltier element or other components. That is, since the laser component C includes multiple laser diodes LD that emit different wavelengths λ, the laser component C is capable of switching which laser diode LD is to be turned ON in response to a change in environmental temperature T, thus continuing to output light of a predetermined wavelength channel ch (wavelength Λ).

Information about how the wavelength of light emitted by the laser diode LD changes with environmental temperature T is known in advance. Accordingly, the computation unit 11 determines, through computation based on the environmental temperature T sensed by the temperature sensing member 20, which laser diode LD is capable of outputting light on the wavelength channel ch (wavelength Λ). Then, based on the result of the computation, the signal output unit 12 outputs (transmits), to the laser component C, a signal for bringing the corresponding laser diode LD into the ON state.

Laser Generator 6

A description is now given of the laser component C and the signal output unit 12 of the control unit 10 in the laser generating unit 6.

Figure 5:
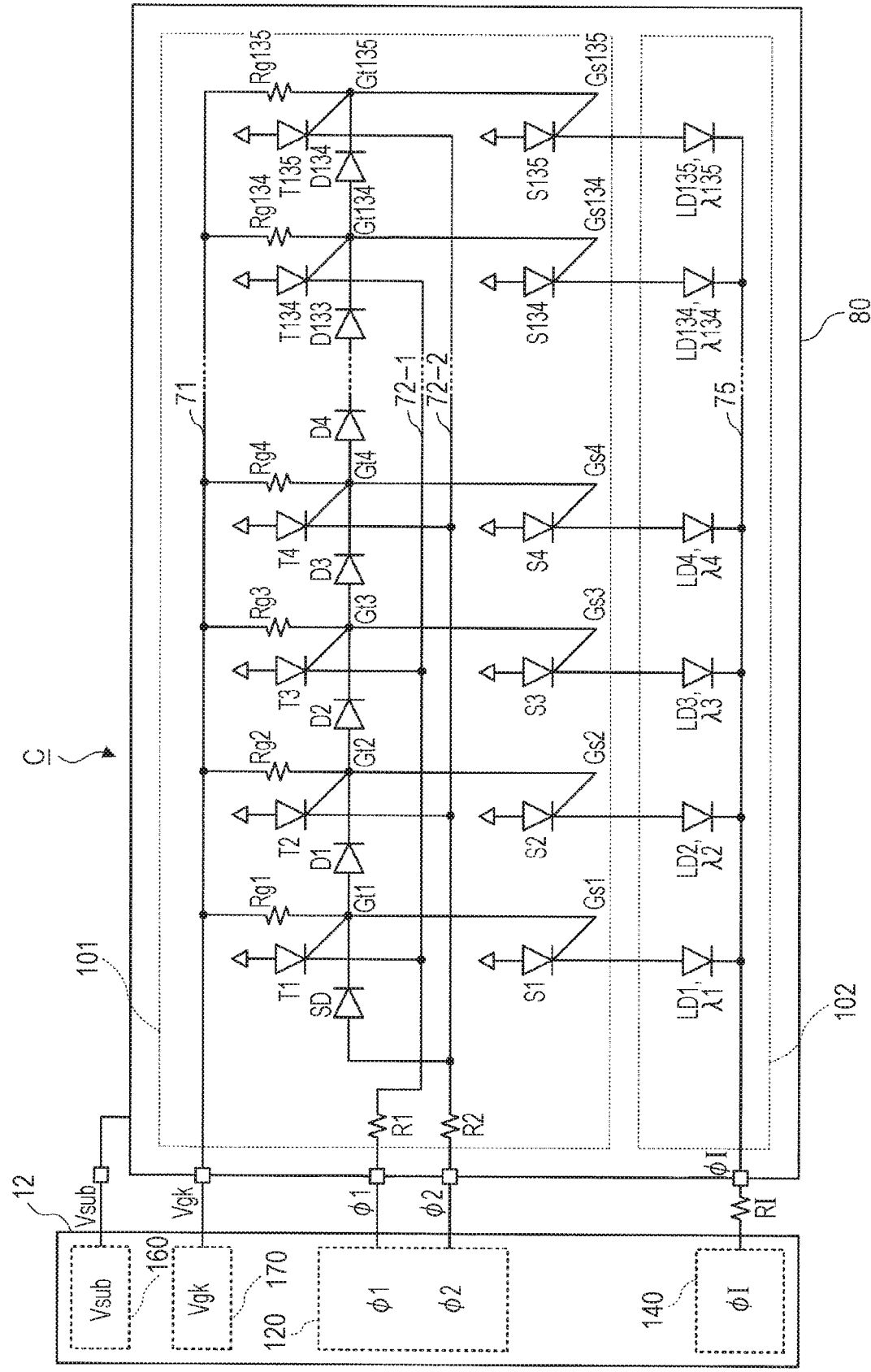
FIG. 5 is an equivalent circuit diagram of the laser component according to the first exemplary embodiment, and illustrates a signal output unit.

FIG. 5 is an equivalent circuit diagram of the laser component C according to the first exemplary embodiment, and illustrates the signal output unit 12.

Signal Output Unit 12

The signal output unit 12 includes a transfer signal generating unit 120 that transmits transfer signals ϕ1 and ϕ2 (to be referred to as transfer signal ϕ when not distinguished from each other) to the laser component C.

The signal output unit 12 also includes a lighting signal generating unit 140 that transmits a lighting signal ϕI to the laser component C.

Further, the signal output unit 12 includes a reference-potential supply unit 160 that supplies a reference potential Vsub, which serves as the reference for potential, to the laser component C, and a power-supply-potential supply unit 170 that supplies a power supply potential Vgk for driving the laser component C.

Laser Component C

The laser component C includes the light emitting unit 102 formed by a light emitting device (laser device) array made up of the laser diodes LD1 to LD135. In this case, the laser diodes LD1 to LD135 emit light of different wavelengths (emission wavelengths/oscillation wavelengths) λ1 to λ135 at the reference environmental temperature $T_0$. It is assumed that the spacing Δλ between the wavelengths λ1 to λ135 is uniform at, for example, Δλ=0.3 nm. Further, the wavelengths λ1 to λ135 are assumed to be in increasing order as illustrated in FIG. 3B. The wavelengths λ1 to λ135 may be in decreasing order.

Not all of the wavelengths λ1 to λ135 may be different. It suffices that multiple different wavelengths be included. Further, Δλ may not be uniform.

Irrespective of whether the laser diodes LD1 to LD135 are arranged in increasing or decreasing order of their emission wavelengths λ1 to λ135, the emission wavelength may differ for every single laser diode LD, or may differ for every multiple number of laser diodes LD, for example, every two laser diodes LD or every three laser diodes LD.

When it is stated in the following description that the emission wavelengths are in increasing or decreasing order along the array of the laser diodes LD, this refers to not only when the emission wavelength differs for every single laser diode LD but also when the emission wavelength differs for every multiple number of laser diodes LD.

The laser component C includes setting thyristors S1 to S135 (to be referred to as setting thyristor S when not distinguished from each other). Of the laser diodes LD1 to LD135 and the setting thyristors S1 to S135, the laser diode LD and the setting thyristor S that are assigned the same number are electrically connected in series.

As illustrated in FIG. 6B described later, the laser diodes LD are stacked over the corresponding setting thyristors S that are arranged in lines over a substrate 80.

The laser component C includes transfer thyristors T1 to T135 (to be referred to as transfer thyristor T when not distinguished from each other), which are arranged in lines in a manner similar to the laser diodes LD1 to LD135 and the setting thyristors S1 to S135.

Although the transfer thyristors T will be described as an example of transfer elements in the following, any circuit elements that are sequentially switched ON may be used. For example, circuit elements that combine components such as a shift register and multiple transistors may be used.

With each two of the transfer thyristors T1 to T135 paired in numerical order, the laser component C includes coupling diodes D1 to D134 (to be referred to as coupling diode D when not distinguished from each other) each located between each two paired transfer thyristors T.

Further, the laser component C includes power line resistors Rg1 to Rg135 (to be referred to as power line resistor Rg when not distinguished from each other).

The laser component C includes a single start diode SD. Further, the laser component C includes current-limiting resistors R1 and R2. The current-limiting resistors R1 and R2 are respectively disposed to prevent excessive current from flowing through transfer signal lines 72-1 and 72-2 described later on which the transfer signals ϕ1 and ϕ2 are respectively transmitted.

In this case, the setting thyristors S1 to S135, the transfer thyristors T1 to T135, the power line resistors Rg1 to Rg135, the coupling diodes D1 to D134, the start diode SD, and the current-limiting resistors R1 and R2 constitute a driving unit 101.

The laser diodes LD1 to LD135 of the light emitting unit 102, and the setting thyristors S1 to S135 and the transfer thyristors T1 to T135 of the driving unit 101 are arranged in numerical order from the left in FIG. 5. Further, the coupling diodes D1 to D134, and the power line resistors Rg1 to Rg135 are also arranged in numerical order from the left in FIG. 5.

The driving unit 101 and the light emitting unit 102 are arranged in this order from the top in FIG. 5.

In the first exemplary embodiment, the light emitting unit 102 includes 135 laser diodes LD, and the driving unit 101 includes 135 setting thyristors S, 135 transfer thyristors T, and 135 power line resistors Rg. The number of coupling diodes D is 134, which is one less than the number of transfer thyristors T.

The number of components such as the laser diodes LD is not limited to the above but may be any predetermined number. The number of transfer thyristors T may be greater than the number of laser diodes LD.

The laser diodes LD mentioned above are two-terminal semiconductor devices each including an anode terminal (anode) and a cathode terminal (cathode). The thyristors (the setting thyristors S and the transfer thyristors T) are semiconductor devices with three terminals including an anode terminal (anode), a gate terminal (the gate), and a cathode terminal (cathode). The coupling diodes D and the start diode SD are two-terminal semiconductor devices each including an anode terminal (anode) and a cathode terminal (cathode).

As will be described later, depending on the case, the laser diodes LD, the thyristors (the setting thyristors S and the transfer thyristors T), the coupling diodes D, and the start diode SD may not necessarily include an anode terminal, a gate terminal, or a cathode terminal that is constructed as an electrode. Accordingly, in the following description, the term "terminal" will be sometimes omitted and the notations in parentheses will be used instead.

Next, electrical connection of various elements in the laser component C will be described.

The respective anodes of the transfer thyristor T and the setting thyristor S are connected to the substrate 80 of the laser component C (anode-common configuration).

These anodes are supplied with the reference potential Vsub from the reference-potential supply unit 160 of the signal output unit 12 via a back electrode 91 (see FIG. 6B described later), which is a Vsub terminal disposed on the back of the substrate 80.

This connection represents an example of configuration when the substrate 80 is a p-type substrate. The polarity is reversed if an n-type substrate is used. If an intrinsic (i-type) substrate with no impurity doped is to be used, a terminal for supplying the reference potential Vsub is disposed at the side of the substrate 80 where the driving unit 101 and the light emitting unit 102 are located.

The cathodes of the odd-numbered transfer thyristors T1, T3, and so on are connected to the transfer signal line 72-1 along the array of the transfer thyristors T. The transfer signal line 72-1 is connected to a φ1 terminal via the current-limiting resistor R1. The transfer signal φ1 is transmitted to the φ1 terminal from the transfer signal generating unit 120 of the signal output unit 12.

The cathodes of the even-numbered transfer thyristors T2, T4, and so on are connected to the transfer signal line 72-2 along the array of the transfer thyristors T. The transfer signal line 72-2 is connected to a φ2 terminal via the current-limiting resistor R2. The transfer signal φ2 is transmitted to the φ2 terminal from the transfer signal generating unit 120 of the signal output unit 12.

The cathodes of the laser diodes LD1 to LD135 are connected to a lighting signal line 75. The lighting signal line 75 is connected to a φI terminal. The lighting signal φI is transmitted to the φI terminal from the lighting signal generating unit 140 of the signal output unit 12. The lighting signal φI supplies a current for lighting the laser diodes LD1 to LD135 to the laser diodes LD1 to LD135.

Respective gates Gt1 to Gt135 (to be referred to as gate Gt when not distinguished from each other) of the transfer thyristors T1 to T135 are connected to respective gates Gs1 to Gs135 (to be referred to as gate Gs when not distinguished from each other) of the same-numbered setting thyristors S1 to S135 in one-to-one correspondence. Thus, of the gates Gt1 to Gt135 and the gates Gs1 to Gs135, the gate Gt and the gate Gs that are assigned the same number are electrically at the same potential. Accordingly, for example, the notation "gate Gt1 (the gate Gs1)" will be used to indicate that these gates are at the same potential.

With each two of the respective gates Gt1 to Gt135 of the transfer thyristors T1 to T135 paired in numerical order, the coupling diodes D1 to D134 are each connected between each two paired gates Gt. That is, the coupling diodes D1 to D134 are each connected in series so as to be sandwiched between each two of the gates Gt1 to Gt135. As for the orientation of the coupling diode D1, the coupling diode D1 is connected such that current flows from the gate Gt1 to the gate Gt2. The same applies to the other coupling diodes D2 to D134.

The gate Gt (the gate Gs) of each of the transfer thyristors T is connected to a power supply line 71 via the power line resistor Rg provided in correspondence with the transfer thyristor T. The power supply line 71 is connected to a Vgk terminal. The Vgk terminal is supplied with the power supply potential Vgk from the power-supply-potential supply unit 170 of the signal output unit 12.

The gate Gt1 of the transfer thyristor T1 is connected to the cathode terminal of the start diode SD. The anode of the start diode SD is connected to the transfer signal line 72-2.

FIGS. 6A and 6B are respectively an exemplary plan layout view and an exemplary cross-sectional view of the laser component C according to the first exemplary embodiment. FIG. 6A is a plan layout view of the laser component C, and FIG. 6B is a cross-sectional view taken along a line VIB-VIB in FIG. 6A.

The illustration in FIG. 6A focuses on the portion of the laser component C corresponding to the laser diodes LD1 to LD4, the setting thyristors S1 to S4, and the transfer thyristors T1 to T4. The Vsub terminal (the back electrode 91) disposed on the back of the substrate 80 is depicted to be extended to the outside of the substrate 80.

FIG. 6B, which is a cross-section taken along a line IVB-IVB in FIG. 6A, depicts the following components from the bottom: the laser diode LD1/the setting thyristor S1, the transfer thyristor T1, the coupling diode D1, and the power line resistor Rg1. The laser diode LD1 and the setting thyristor S1 are stacked together.

In FIGS. 6A and 6B, major elements, terminals, and other components are designated by corresponding reference signs.

First, the cross-sectional structure of the laser component C will be described with reference to FIG. 6B.

A p-type anode layer 81 (p-anode layer 81), an n-type gate layer 82 (n-gate layer 82), a p-type gate layer 83 (p-gate layer 83), and an n-type cathode layer 84 (n-cathode layer 84) are disposed in the stated order over the p-type substrate 80 (substrate 80). The notations in parentheses will be used in the following description. The same applies to other cases.

A tunnel junction (tunnel diode) layer 85 is disposed over the n-cathode layer 84.

Further, a p-type anode layer 86 (p-anode layer 86), a light emitting layer 87, and an n-type cathode layer 88 (n-cathode layer 88) are disposed over the tunnel junction layer 85.

The p-anode layer 81, the n-gate layer 82, the p-gate layer 83, the n-cathode layer 84, the tunnel junction layer 85, the p-anode layer 86, the light emitting layer 87, and the n-cathode layer 88, which are semiconductor layers, are stacked in the stated order through epitaxial growth. To form multiple islands (islands 301, 302, 303, and so on described later) that are separated from each other, semiconductor layers between the islands are removed by etching (mesa etching). The p-anode layer 81 may or may not be separated. In FIG. 6B, a part of the p-anode layer 81 is separated in the thickness direction. The p-anode layer 81 may double as the substrate 80.

As illustrated in FIG. 6B, the laser component C is provided with a protective layer 90 made of a translucent insulating material disposed so as to cover the surfaces and lateral sides of the above-mentioned islands. These islands and wiring lines such as the power supply line 71, the transfer signal lines 72-1 and 72-2, and the lighting signal line 75 are connected via through-holes (indicated by circles in FIG. 6A) provided in the protective layer 90. In the following, a description will not be given of the protective layer 90 and the through-holes.

As illustrated in FIG. 6B, the back electrode 91, which serves as the Vsub terminal, is disposed on the back of the substrate 80.

The p-anode layer 81, the n-gate layer 82, the p-gate layer 83, and the n-cathode layer 84 are used to form components such as the setting thyristor S, the transfer thyristor T, the coupling diode D, and the power line resistor Rg (the setting thyristor S1, the transfer thyristor T1, the coupling diode D1, and the power line resistor Rg1 in FIG. 6B).

As used herein, the names of the p-anode layer 81, the n-gate layer 82, the p-gate layer 83, and the n-cathode layer 84 correspond to their functions (actions) when these layers form the setting thyristor S and the transfer thyristor T. That is, the p-anode layer 81 acts as an anode, the n-gate layer 82 and the p-gate layer 83 each act as a gate, and the n-cathode layer 84 acts as a cathode. As will be described later, these layers have different functions (actions) when these layers form the coupling diode D and the power line resistor Rg.

The p-anode layer 86, the light emitting layer 87, and the n-cathode layer 88 form the laser diode LD (the laser diode LD1 in FIG. 6B).

The p-anode layer 86 and the n-cathode layer 88 are named similarly as descried above. That is, the names of these layers correspond to their functions (actions) when these layers form the laser diode LD. That is, the p-anode layer 86 acts as an anode, and the n-cathode layer 88 acts as a cathode. The p-anode layer 86 and the n-cathode layer 88 function as cladding layers of the laser diode LD. Accordingly, the p-anode layer 86 and the n-cathode layer 88 will be sometimes respectively referred to as p-anode (cladding) layer 86 and n-cathode (cladding) layer 88.

The laser diode LD emits light along the surface of the substrate 80 (as indicated by an empty arrow in FIG. 6A). The laser diodes LD1, LD2, LD3, and so on emit light of different wavelengths λ1, λ2, λ3, and so on.

The side of the laser diode LD that emits light is cleaved except for a current-blocking portion β of a current confinement layer 86b included in the p-anode layer 86.

As described below, some of the multiple islands may not include some of the multiple layers including the p-anode layer 81, the n-gate layer 82, the p-gate layer 83, the n-cathode layer 84, the tunnel junction layer 85, the p-anode layer 86, the light emitting layer 87, and the n-cathode layer 88. For example, the island 302 does not include a part or all of the tunnel junction layer 85, the p-anode layer 86, the light emitting layer 87, and the n-cathode layer 88.

Further, some of the multiple islands may not include a part of its constituent layer. For example, although the island 302 includes the p-anode layer 81, the n-gate layer 82, the p-gate layer 83, and the n-cathode layer 84, the island 302 includes only a part of the n-cathode layer 84.

Next, the plan layout of the laser component C will be described with reference to FIG. 6A.

The island 301 is provided with the setting thyristor S1 and the laser diode LD1. The island 302 is provided with the transfer thyristor T1 and the coupling diode D1. The island 303 is provided with the power line resistor Rg1. The island 304 is provided with the start diode SD. The island 305 is provided with the current-limiting resistor R1, and the island 306 is provided with the current-limiting resistor R2.

In the laser component C, multiple islands similar to the islands 301, 302, and 303 are formed in parallel. Like the islands 301, 302, and 303, these islands are provided with components such as the setting thyristors S2, S3, S4, and so on, the laser diodes LD2, LD3, LD4, and so on, the transfer thyristors T2, T3, T4, and so on, and the coupling diodes D2, D3, D4, and so on.

Now, the islands 301 to 306 will be described in detail with reference to FIGS. 6A and 6B.

As illustrated in FIG. 6A, the island 301 is provided with the setting thyristor S1 and the laser diode LD1.

The setting thyristor S1 is formed by the p-anode layer 81, the n-gate layer 82, the p-gate layer 83, and the n-cathode layer 84. A p-type ohmic electrode 331 (p-ohmic electrode 331), which is disposed over the p-gate layer 83 exposed by removing the n-cathode layer 88, the light emitting layer 87, the p-anode layer 86, the tunnel junction layer 85, and the n-cathode layer 84, is formed as an electrode that serves as the gate Gs1 (to be sometimes referred to as gate terminal Gs1).

The laser diode LD1 is formed by the p-anode layer 86, the light emitting layer 87, and the n-cathode layer 88. The laser diode LD1 is stacked over the n-cathode layer 84 of the setting thyristor S1 with the tunnel junction layer 85 interposed therebetween. An n-type ohmic electrode 321 (n-ohmic electrode 321) disposed over the n-cathode layer 88 (region 311) serves as the cathode terminal.

The p-anode layer 86 includes the current confinement layer 86b (see FIGS. 7A to 7C described later). The current confinement layer 86b is provided to confine the current flowing through the laser diode LD to the central portion of the laser diode LD. In this regard, the peripheral portion of the laser diode LD contains many defects caused by mesa etching. Thus, non-radiative recombination tends to occur at such defects. Accordingly, the current confinement layer 86 is provided to ensure that the central portion of the laser diode LD serves as a current-passing portion α that readily allows current to flow, whereas the peripheral portion of the laser diode LD serves as a current-blocking portion β that does not readily allow current to flow. As indicated by the laser diode LD1 in FIG. 6A, the area inside the broken line is the current-passing portion α, and the area outside the broken line is the current-blocking portion β.

The current confinement layer 86b will be described later.

The presence of the current confinement layer 86b reduces electric power consumed by non-radiative recombination, leading to reduced power consumption and improved light extraction efficiency. Light extraction efficiency refers to the amount of light that can be extracted per unit supplied electric power.

The island 302 is provided with the transfer thyristor T1 and the coupling diode D1.

The transfer thyristor T1 is formed by the p-anode layer 81, the n-gate layer 82, the p-gate layer 83, and the n-cathode layer 84. That is, an n-ohmic electrode 323, which is disposed over the n-cathode layer 84 (a region 313) exposed by removing the n-cathode layer 88, the light emitting layer 87, the p-anode layer 86, and the tunnel junction layer 85, serves as the cathode electrode. In some instances, an $n^{++}$ layer 85a of the tunnel junction layer 85 may not be removed, and the n-ohmic electrode 323 may be disposed over the $n^{++}$ layer 85a of the tunnel junction layer 85. Further, a p-ohmic electrode 332, which is disposed over the p-gate layer 83 exposed by removing the n-cathode layer 84, is formed as a terminal serving as the gate Gt1 (to be sometimes referred to as gate terminal Gt1).

Likewise, the coupling diode D1 provided in the island 302 is formed by the p-gate layer 83 and the n-cathode layer 84. That is, an n-ohmic electrode 324, which is disposed over the n-cathode layer 84 (a region 314) exposed by removing the n-cathode layer 88, the light emitting layer 87, the p-anode layer 86, and the tunnel junction layer 85, serves as the cathode electrode. In some instances, the $n^{++}$ layer 85a of the tunnel junction layer 85 may not be removed, and the n-ohmic electrode 324 may be disposed over the $n^{++}$ layer 85a of the tunnel junction layer 85. Further, the p-ohmic electrode 332, which is disposed over the p-gate layer 83 exposed by removing the n-cathode layer 84, serves as the anode terminal. In this case, the anode terminal of the coupling diode D1 is the same as the gate Gt1 (the gate terminal Gt1).

The power line resistor Rg1 provided in the island 303 is formed by the p-gate layer 83. The power line resistor Rg1 is a resistor formed by the portion of the p-gate layer 83 between a p-ohmic electrode 333 and a p-ohmic electrode 334, which are disposed over the p-gate layer 83 exposed by removing the n-cathode layer 88, the light emitting layer 87, the p-anode layer 86, the tunnel junction layer 85, and the n-cathode layer 84.

The start diode SD provided in the island 304 is formed by the p-gate layer 83 and the n-cathode layer 84. That is, an n-ohmic electrode 325, which is disposed over the n-cathode layer 84 (a region 315) exposed by removing the n-cathode layer 88, the light emitting layer 87, the p-anode layer 86, and the tunnel junction layer 85, serves as the cathode electrode. In some instances, the $n^{++}$ layer 85a of the tunnel junction layer 85 may not be removed, and the n-ohmic electrode 325 may be disposed over the $n^{++}$ layer 85a of the tunnel junction layer 85. Further, a p-ohmic electrode 335, which is disposed over the p-gate layer 83 exposed by removing the n-cathode layer 84, serves as the anode terminal.

The current-limiting resistor R1 provided in the island 305, and the current-limiting resistor R2 provided in the island 306 are disposed in the same manner as with the power line resistor Rg1 provided in the island 303. Each of the current-limiting resistor R1 and the current-limiting resistor R2 is a resistor formed by the portion of the p-gate layer 83 between two p-ohmic electrodes (no reference signs attached).

FIG. 6A illustrates the connection between various elements.

The lighting signal line 75 includes a trunk portion 75a and multiple branch portions 75b. The trunk portion 75a is disposed to extend in the direction in which the laser diodes LD are arranged in lines. The branch portions 75b are branched out from the trunk portion 75a, and connected to the n-ohmic electrode 321, which is the cathode terminal of the laser diode LD1 provided in the island 301. The same applies to the cathode terminals of the other laser diodes LD.

The lighting signal line 75 is connected to the φI terminal disposed near the laser diode LD1.

The transfer signal line 72-1 is connected to the n-ohmic electrode 323, which is the cathode terminal of the transfer thyristor T1 provided in the island 302. The cathode terminals of the other odd-numbered transfer thyristors T provided in islands similar to the island 302 are also connected with the transfer signal line 72-1. The transfer signal line 72-1 is connected to the φ1 terminal via the current-limiting resistor R1 provided in the island 305.

The transfer signal line 72-2 is connected to an ohmic electrode (no reference sign attached) that serves as the cathode terminal of each of the even-numbered transfer thyristors T provided in islands to which no reference signs are attached. The transfer signal line 72-2 is connected to the φ2 terminal via the current-limiting resistor R2 provided in the island 306.

The power supply line 71 is connected to the p-ohmic electrode 334, which is one terminal of the power line resistor Rg1 provided in the island 303. Likewise, one terminal of each of the other power line resistors Rg is connected to the power supply line 71. The power supply line 71 is connected to the Vgk terminal.

The p-ohmic electrode 331 (the gate terminal Gs1) of the laser diode LD1 provided in the island 301 is connected to the p-ohmic electrode 332 (the gate terminal Gt1) of the island 302 via a connection wiring line 76.

The p-ohmic electrode 332 (the gate terminal Gt1) is connected to the p-ohmic electrode 333 (the other terminal of the power line resistor Rg1) of the island 303 via a connection wiring line 77.

The n-ohmic electrode 324 (the cathode terminal of the coupling diode D1) provided in the island 302 is connected to a p-type ohmic electrode (no reference sign attached), which is the gate terminal Gt2 of the adjacent transfer thyristor T2, via a connection wiring line 79.

Although not described here, the same as described above applies to components such as the other laser diodes LD, setting thyristors S, transfer thyristors T, and coupling diodes D.

The p-ohmic electrode 332 (the gate terminal Gt1) of the island 302 is connected to the n-ohmic electrode 325 (the cathode terminal of the start diode SD) provided in the island 304 via a connection wiring line 78. The p-ohmic electrode 335 (the anode terminal of the start diode SD) is connected to the transfer signal line 72-2.

The above-mentioned connection and configuration are employed when the substrate 80 used is a p-type substrate, and the polarity is reversed if an n-type substrate is used. If an i-type substrate is used, a terminal connected to the reference-potential supply unit 160 that supplies the reference potential Vsub is provided at the side of the substrate where the driving unit 101 and the light emitting unit 102 are located. The connection and configuration in this case are the same as either those employed when a p-type substrate is used or those employed when an n-type substrate is used.

Stacked Structure of Setting Thyristor S and Laser Diode LD

FIGS. 7A to 7C are detailed illustrations of the island 301 formed by stacking the setting thyristor S and the laser diode LD. FIG. 7A is an enlarged cross-sectional view, FIG. 7B is a cross-sectional view taken along a line VIIB-VIIB in FIG. 7A, and FIG. 7C is a cross-sectional view taken along a line VIIC-VIIC in FIG. 7A. The protective layer 90 is not illustrated in FIGS. 7A to 7C. The same applies hereinafter. FIG. 7A represents a cross-section of the island 301 illustrated in FIGS. 6A and 6B, as viewed in the −y direction in FIG. 6A. Because the p-ohmic electrode 331 becomes invisible in this state, the portion corresponding to the p-ohmic electrode 331 is viewed from the −x direction in FIG. 6A. The same applies hereinafter. FIGS. 7B and 7C are cross-sectional views taken in the y direction.

As described above, the laser diode LD is stacked over the setting thyristor S with the tunnel junction layer 85 interposed therebetween. That is, the setting thyristor S and the laser diode LD are electrically connected in series.

The setting thyristor S is formed by the p-anode layer 81, the n-gate layer 82, the p-gate layer 83, and the n-cathode layer 84. That is, the setting thyristor S has a four-layer, p-n-p-n structure.

The tunnel junction layer 85 includes the $n^{++}$ layer 85a doped with a high concentration of n-type impurities (dopants), and a $p^{++}$ layer 85b doped with a high concentration of p-type impurities.

The laser diode LD includes the p-anode layer 86, the light emitting layer 87, and the n-cathode layer 88.

The light emitting layer 87 has a quantum well structure formed by an alternate stack of well and barrier layers. The light emitting layer 87 may be an intrinsic (i-type) layer with no impurity doped. The light emitting layer 87 may have a structure other than a quantum well structure, for example, a quantum line (quantum wire) or quantum box (quantum dot) structure.

The p-anode layer 86 is made up of the following stack of layers: a lower p-anode layer 86a, the current confinement layer 86b, and an upper p-anode layer 86c. The current confinement layer 86b includes the current-passing portion α and the current-blocking portion β. As illustrated in FIG. 6A, the current-passing portion α is located in the central portion of the laser diode LD, whereas the current-blocking portion β is located in the peripheral portion of the laser diode LD.

Further, the n-cathode layer 88 includes a lower n-cathode layer 88a and an upper diffraction grating layer (diffraction grating layer) 88b. The upper diffraction grating layer 88b, which is a portion with diffraction gratings (banded irregularities) formed at predetermined pitches, is contiguous with the lower n-cathode layer 88a. That is, first, the n-cathode layer 88 is stacked, and then its surface is formed into a banded pattern. The portion of the n-cathode layer 88 that has a diffraction grating pattern formed in this way serves as the upper diffraction grating layer 88b, and the portion of the n-cathode layer 88 that has no diffraction grating pattern serves as the lower n-cathode layer 88a. The pitch of the diffraction gratings provided in the upper diffraction grating layer 88b determines the wavelength emitted (oscillated) by the laser diode LD.

The diffraction grating layer may not necessarily be provided in the location mentioned above. For instance, a part of the light emitting layer 87 may serve as the diffraction grating layer, or a part of the lower p-anode layer 86a or the upper p-anode layer 86c in the p-anode layer 86 may serve as the diffraction grating layer.

As illustrated in FIG. 7C, light is emitted from a region (light emitting region) corresponding to the light emitting layer 87 located below the n-ohmic electrode 321, which is disposed over the upper diffraction grating layer 88b.

FIGS. 8A to 8C each illustrate the structure of the laser diode LD. FIG. 8A illustrates a distributed feedback (DFB) laser, FIG. 8B illustrates a distributed Bragg reflector (DBR) laser, and FIG. 8C illustrates a Fabry-Perot (FP) laser.

Like the laser component C illustrated in FIGS. 7A, 7B, and 7C, the DFB laser illustrated in FIG. 8A has diffraction gratings disposed over the light emitting region below the n-ohmic electrode 321. With a DBF laser, the wavelength to be emitted (emission wavelength) is selected by the diffraction grating, and a single wavelength of light is emitted. The DBR laser illustrated in FIG. 8B has diffraction gratings outside the light emitting region located below the n-ohmic electrode 321. With such a DBR laser as well, the wavelength to be emitted (emission wavelength) is selected by the diffraction grating, and a single wavelength of light is emitted. In contrast, with the FP laser illustrated in FIG. 8C, laser oscillation is achieved by confining light between reflection surfaces created by, for example, cleaving of a crystal. The FP laser has no diffraction grating, and hence emits multiple wavelengths of light.

It is desirable to use a DFB laser or a DBR laser for the laser component C according to the first exemplary embodiment. The laser diodes LD illustrated in FIGS. 7A, 7B, and 7C are DFB lasers.

FIG. 9 illustrates the relationship between the emission wavelength of each laser diode LD and the pitch of diffraction gratings.

As the pitch of diffraction gratings in the upper diffraction grating layer 88b is increased in the order of the laser diodes LD1, LD2, LD3, and so on, the wavelengths λ1, λ2, λ3, and so on emitted by the corresponding laser diodes LD increase in this order.

Tunnel Junction Layer 85

Figure 10A:
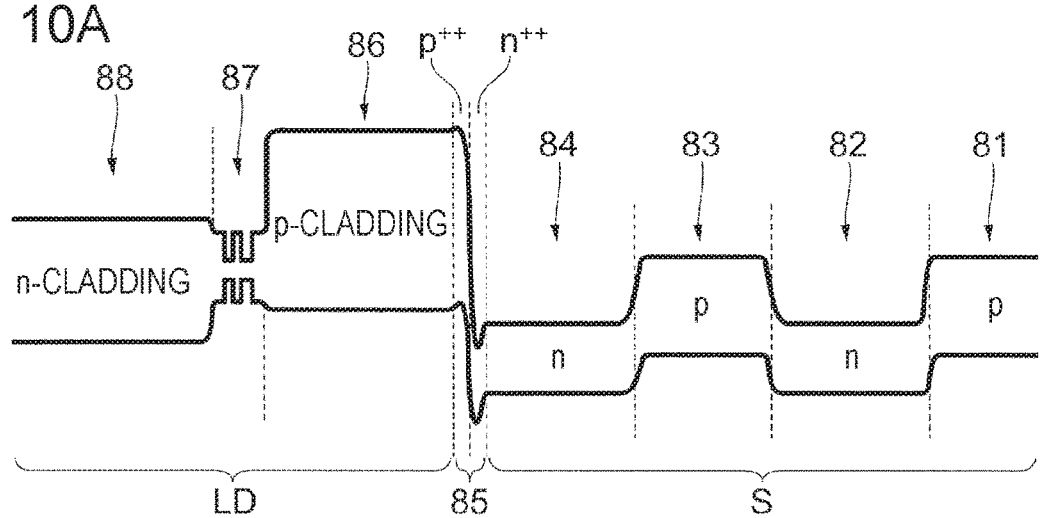
Figure 10B:
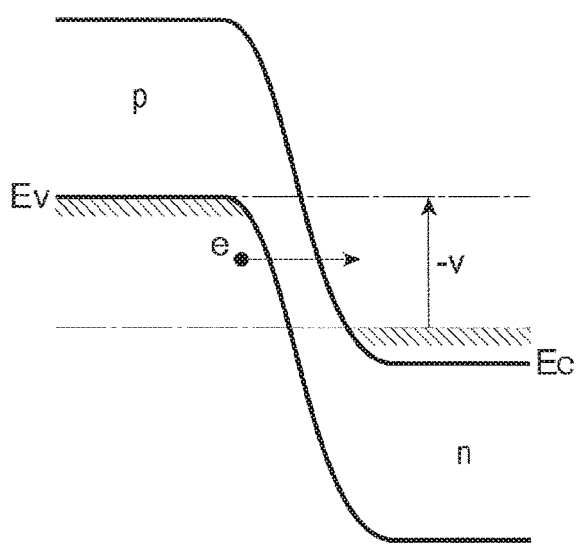
Figure 10C:
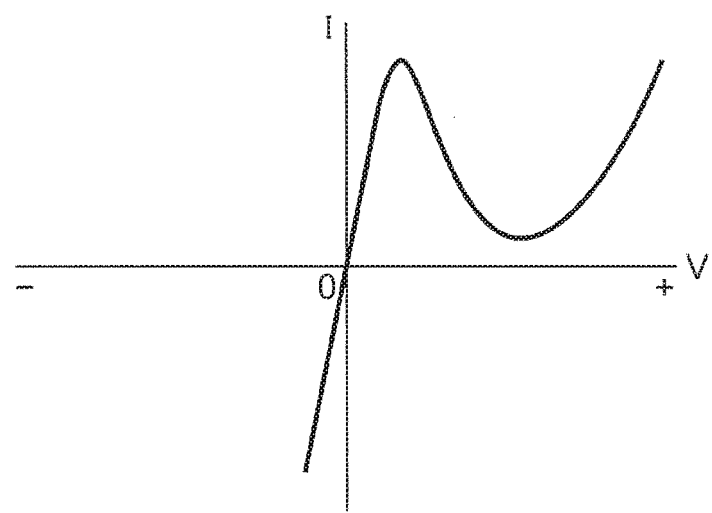

FIGS. 10A to 10C illustrate the stacked structure of the setting thyristor S and the laser diode LD in further detail. FIG. 10A is a schematic energy band diagram of the stacked structure of the setting thyristor S and the laser diode LD, FIG. 10B is an energy band diagram of the tunnel junction layer 85 in reverse biased condition, and FIG. 10C illustrates the current-voltage characteristics of the tunnel junction layer 85.

As illustrated in the energy band diagram of FIG. 10A, when a voltage is applied between the n-ohmic electrode 321 and the back electrode 91 illustrated in FIG. 7A such that the laser diode LD and the setting thyristor S become forward biased, the portion between the $n^{++}$ layer 85a and the $p^{++}$ layer 85b of the tunnel junction layer 85 becomes reverse biased.

The tunnel junction layer 85 (tunnel junction) represents a junction between the $n^{++}$ layer 85a doped with a high concentration of n-type impurities, and the $p^{++}$ layer 85b doped with a high concentration of p-type impurities. Hence, the depletion region is narrow, and upon application of a forward bias, electrons tunnel through from the conduction band on the side of the $n^{++}$ layer 85a into the valence band on the side of the $p^{++}$ layer 85b. This gives rise to appearance of negative resistance characteristics.

In contrast, as illustrated in FIG. 10B, upon application of a reverse bias (−V) to the tunnel junction layer 85 (tunnel junction), the potential Ev of the valence band on the side of the $p^{++}$ layer 85b becomes higher than the potential Ec of the conduction band on the side of the n++ layer 85a. Then, electrons tunnel through from the valence band on the side of the p++ layer 85b into the conduction band on the side of the n++ layer 85a. Such tunneling of electrons occurs more readily as the applied reverse bias voltage (−V) increases. That is, as illustrated in FIG. 10C, the tunnel junction layer 85 (tunnel junction) readily conducts current in reverse biased condition.

Consequently, as illustrated in FIG. 10A, when the setting thyristor S turns ON, current flows between the setting thyristor S and the laser diode LD even when the tunnel junction layer 85 is under reverse bias. This causes the laser diode LD to emit light (light up).

In this case, the setting thyristor S is enabled to turn to the ON state when the transfer thyristor T connected with the setting thyristor S turns ON and shifts to the ON state. Then, when the lighting signal ϕI goes to "Lo" described later, the setting thyristor S turns ON and shifts to the ON state, and causes (sets) the laser diode LD to light up. Hence, the name "setting thyristor" is used herein.

Thyristors

Next, the basic operation of thyristors (the transfer thyristor T and the setting thyristor S) will be described. As described above, a thyristor is a semiconductor device with the following three terminals: an anode terminal (anode), a cathode terminal (cathode), and a gate terminal (the gate). The thyristor is formed by, for example, stacking the following semiconductor layers made of GaAs, GaAlAs, AlAs, or other materials over the substrate 80: p-type semiconductor layers (the p-anode layer 81 and the p-gate layer 83), and n-type semiconductor layers (the n-gate layer 82 and the n-cathode layer 84). That is, the thyristor has a p-n-p-n structure. In this case, it is assumed, for example, that the forward potential (diffusion potential) Vd of the p-n junction formed by a p-type semiconductor layer and an n-type semiconductor layer is 1.5 V.

The following description assumes, for example, that the reference potential Vsub supplied to the back electrode 91 (see FIGS. 6B and 7A), which is the Vsub terminal, is a high-level potential (to be labeled "H" hereinafter) of 0 V, and the power supply potential Vgk supplied to the Vgk terminal is a low-level potential (to be labeled "L" hereinafter) of −3.3 V.

The anode of each thyristor is at the reference potential Vsub ("H" (0 V)) supplied to the back electrode 91.

A thyristor in its OFF state with no current flowing between the anode and the cathode goes to the ON state (turns ON) when a potential lower than (a negative potential larger in absolute value than) a threshold voltage is applied to the cathode. In this regard, the threshold voltage of the thyristor has a value equal to the potential at the gate minus the forward potential Vd (1.5 V) of the p-n junction.

Once turned ON, the potential at the gate of the thyristor becomes close to the potential of the anode. Since the anode is set to the reference potential Vsub ("H" (0 V)) in this case, the potential of the gate becomes 0 V ("H"). The cathode of the thyristor in its ON state is at a potential close to a value that is equal to the potential of the anode minus the forward potential Vd (1.5 V) of the p-n junction. Since the anode is set to the reference potential Vsub ("H" (0 V)) in this case, the cathode of the thyristor in the ON state is at a potential close to −1.5 V (a negative potential larger than 1.5 V in absolute value). The potential of the cathode is set in relation to the power supply that supplies current to the thyristor that is in the ON state.

A thyristor in its ON state goes to the OFF state (turns OFF) when the cathode is placed at a potential (a negative potential that is small in absolute value, 0 V, or a positive potential) higher than a potential required to maintain the ON state (a potential close to −1.5 V mentioned above).

When a potential lower than (a negative potential larger in absolute value than) a potential required to maintain the ON state is continuously applied to the cathode of a thyristor in its ON state to supply a current (holding current) that allows the thyristor to maintain the ON state, the thyristor maintains its ON state.

The setting thyristor S is stacked together and electrically connected in series with the laser diode LD. Hence, the voltage applied to the cathode (the n-cathode layer 84) of the setting thyristor S has a value equal to the potential of the lighting signal ϕI divided between the setting thyristor S and the laser diode LD. The following description assumes that the voltage applied to the laser diode LD is −1.7 V. The following description also assumes that when the setting thyristor S is in its OFF state, −3.3 V is applied to the setting thyristor S. That is, it is assumed that the lighting signal ϕI ("Lo") applied to light the laser diode LD is −5 V.

The voltage applied to the laser diode LD is to be varied with the emission wavelength or light intensity. This may be accomplished by adjusting the voltage ("Lo") of the lighting signal ϕI.

Since a thyristor is formed by a semiconductor such as GaAs, in some cases, light emission occurs between the n-gate layer 82 and the p-gate layer 83 while the thyristor is in the ON state. The amount of light emitted by a thyristor is determined by the area of the cathode and the current passed between the cathode and the anode. Accordingly, for cases where light emitted from the thyristor is not utilized, as is the case with the transfer thyristor T, for example, such unnecessary light may be minimized by reducing the area of the cathode, blocking light with an electrode (the n-ohmic electrode 323 of the transfer thyristor T1), or other methods.

Operation of Laser Generator 6

Next, operation of the laser generating unit 6 will be described.

Timing Chart

Figure 11:
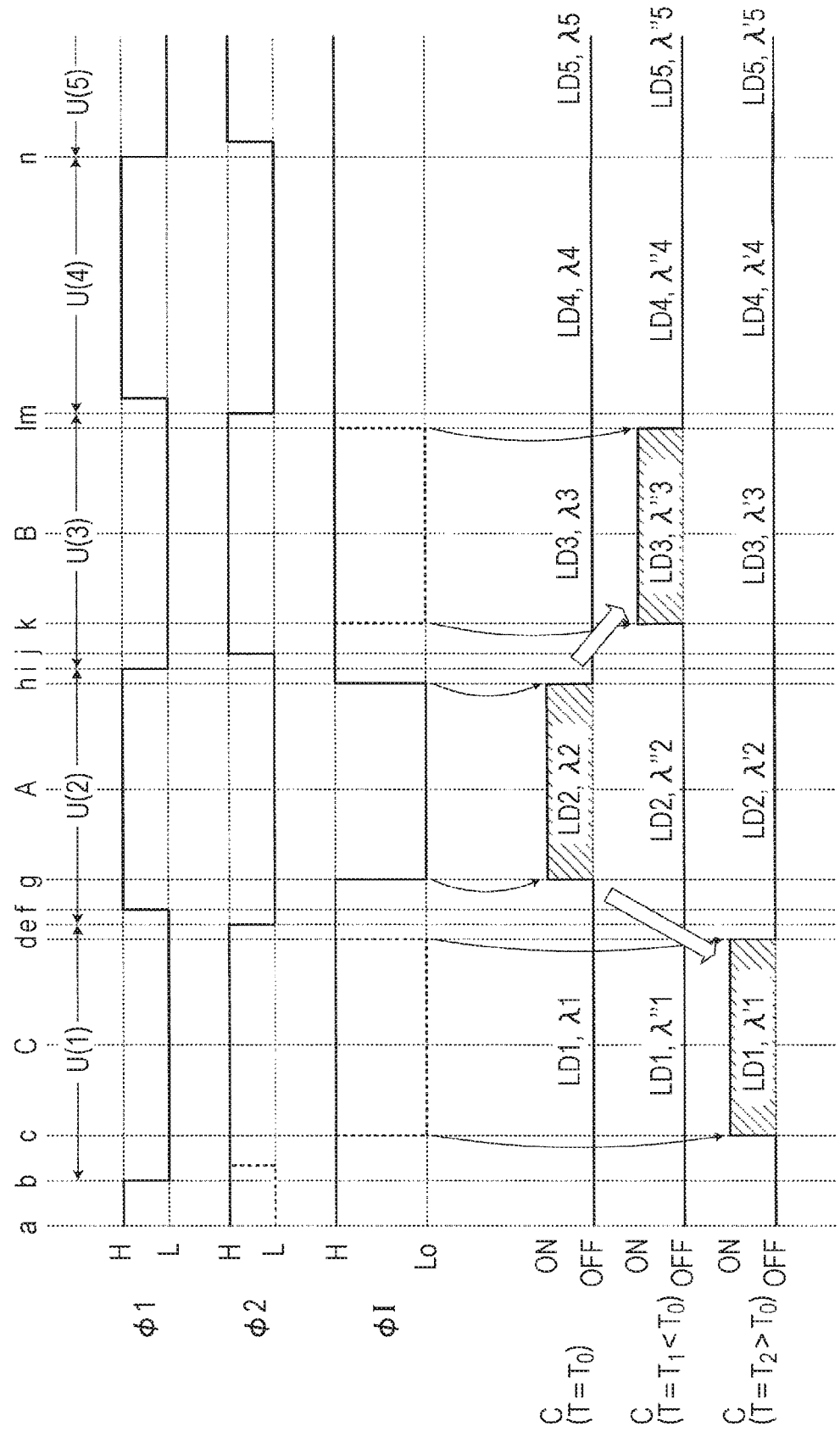
FIG. 11 is a timing chart illustrating the operation of a laser generating unit.

FIG. 11 is a timing chart illustrating the operation of the laser generating unit 6.

FIG. 11 is a timing chart illustrating control of lighting (light emission) (to be referred to as lighting control) of five laser diodes LD, the laser diodes LD1 to LD5, of the laser component C. For the sake of simplicity, it is assumed in FIG. 11 that the laser diode LD2 is to be lit when the environmental temperature T is the reference environmental temperature $T_0$. That is, it is assumed that the wavelength λ2 emitted by the laser diode LD2 lies in the central portion of the wavelength channel ch of wavelength Λ to which the laser component C belongs.

Thus, the laser diode LD1 and the laser diodes LD3, LD4, and LD5 are not lit.

Now, suppose that the environmental temperature T has lowered to an environmental temperature $T_1$ ($T_1<T_0$). Then, the respective wavelengths λ1 to λ5 of the laser diodes LD1 to LD5 are displaced (shifted) to shorter wavelengths λ"1 to λ"5. Then, conversely to FIG. 4B, the wavelength λ"2 of the laser diode LD2 is displaced (shifted) toward the shorter-wavelength end of the wavelength channel ch. Meanwhile, the wavelength λ"3 of the laser diode LD3 enters (shifts to) the central portion of the wavelength channel ch. Accordingly, the laser diode LD to be lit is switched from the laser diode LD2 to the laser diode LD3.

Conversely, suppose that the environmental temperature T has risen to an environmental temperature $T_2$ ($T_2>T_0$). Then, the respective wavelengths λ1 to λ5 of the laser diodes LD1 to LD5 are displaced (shifted) to longer wavelengths λ'1 to λ'5. Then, similarly as described above with reference to FIG. 4B, the wavelength λ'2 of the laser diode LD2 is displaced (shifted) toward the longer-wavelength end of the wavelength channel ch. Meanwhile, the wavelength λ'1 of the laser diode LD1 is displaced (shifted) toward the central portion of the wavelength channel ch. Accordingly, the laser diode LD to be lit is switched from the laser diode LD2 to the laser diode LD1.

In the above description, reference signs are used in a manner consistent with those in FIGS. 4B and 4C such that the wavelength λ shifts to the wavelength λ' when the environmental temperature T rises, and shifts to the wavelength λ" when the environmental temperature T falls.

A detailed description will be given below of a method for switching which laser diode LD is to be lit.

It is assumed that in FIG. 11, time passes in alphabetical order from time a to time n. Time A is set between time g and time h, time B is set between time k and time l, and time C is set between time c and time d. It is assumed that times a, b, c, and so on in the timing chart differ for each timing chart.

The laser diodes LD1, LD2, LD3, and LD4 are brought into to a state that enables these laser diodes LD to light up (to be referred to as lighting-enabled state) (a state that enables these laser diodes LD to turn to the ON state) (to be referred to as turn-ON-enabled state) respectively in periods U(1), U(2), U(3), and U(4). Being brought into a lighting-enabled state (a turn-ON-enabled state) will be herein sometimes referred to as being "lighting-controlled". The laser diodes LD that are numbered 5 or higher are subsequently lighting-controlled in the same manner.

It is assumed in this case that the periods U(1), U(2), U(3), and so on are of the same length, and will be referred to as period U when not distinguished from each other.

Each of the transfer signals φ1 and φ2, which are respectively transmitted to the φ1 and φ2 terminals (see FIG. 5 and FIG. 6A) of the laser component C from the transfer signal generating unit 120 of the signal output unit 12, is a signal having two levels of potentials, "H" (0 V) and "L" (−3.3 V). Each of the transfer signals φ1 and φ2 repeats its waveforms every two consecutive periods U (e.g., the period U(1) and the period U(2)).

In the following description, "H" (0 V) and "L" (−3.3 V) will be sometimes abbreviated as "H" and "L", respectively.

The transfer signal φ1 shifts from "H" (0 V) to "L" (−3.3 V) at the start time b of the period U(1), and shifts from "L" to "H" at time f. Then, at the end time i of the period U(2), the transfer signal φ1 shifts from "H" to "L".

The transfer signal φ2, which is at "H" (0 V) at the start time b of the period U(1), shifts from "H" (0 V) to "L" (−3.3 V) at time e. Then, the transfer signal φ2 shifts from "L" to "H" at the end time i of the period U(2).

A comparison between the transfer signal φ1 and the transfer signal φ2 reveals that the transfer signal φ2 corresponds to the transfer signal φ1 shifted backward by the period U on the time axis. For the transfer signal φ2, the waveform indicated by a broken line in the period U(1) and the waveform in the period U(2) are repeated in the period U(3) and onward. The waveform of the transfer signal φ2 in the period U(1) differs from the waveform in the period U(3) and onward because the period U(1) corresponds to the period in which the laser generating unit 6 starts its operation.

As will be described later, the pair of the transfer signals φ1 and φ2 causes the ON state to be propagated in the numerical order of the transfer thyristors T. As a result, the laser diode LD having the same number as the transfer thyristor T that is in the ON state is specified (selected) as the laser diode LD that is to be lighting-controlled. The term "specify (select)" in this context means to bring the laser diode LD into a lighting-enabled state (a turn-ON-enabled state).

Next, the lighting signal φI transmitted to the φI terminal of the laser component C from the lighting signal generating unit 140 of the signal output unit 12 will be described. The lighting signal φI has two levels of potentials, "H" (0 V) and "Lo" (−5 V).

In the following, the lighting signal φI will be described with respect to the period U(2) in which the laser diode LD2 of the laser component C is lighting-controlled. The lighting signal φI, which is at "H" (0 V) at the start time e of the period U(2), shifts from "H" (0 V) to "L" (−5 V) at time g. Then, the lighting signal φI shifts from "Lo" to "H" at time h, and stays at "H" at time i. The lighting signal φI is "H" at other times.

Now, with reference also to FIG. 5, the operation of the laser component C will be described with reference to the timing chart illustrated in FIG. 11. The periods U(1) and U(2) in which the laser diodes LD1 and LD2 are respectively lighting-controlled will be described below. In this case, the laser diode LD2 is the laser diode to be lit.

Time a

At time a, the reference-potential supply unit 160 of the signal output unit 12 sets the reference potential Vsub to "H" (0 V). The power-supply-potential supply unit 170 sets the power supply potential Vgk to "L" (−3.3 V). Then, the Vsub terminal of the laser component goes to "H". Likewise, the Vgk terminal of the laser generating unit 6 goes to "L". Thus, the back electrode 91 of the laser component C goes to "H", and the power supply line 71 of the laser component C goes to "L" (see FIG. 5).

Then, the transfer signal generating unit 120 of the signal output unit 12 sets each of the transfer signals φ1 and φ2 to "H" (0 V). This causes the φ1 and φ2 terminals of the laser component C to become "H". At this time, the potential of the transfer signal line 72-1 connected to the φ1 terminal via the current-limiting resistor R1 also becomes "H", and the potential of the transfer signal line 72-2 connected to the φ2 terminal via the current-limiting resistor R2 also becomes "H".

Further, the lighting signal generating unit 140 of the signal output unit 12 sets the lighting signal φI to "H" (0 V). As a result, the φI terminal of the laser component C goes to "H" via the current-limiting resistor RI, and the lighting signal line 75 connected to the φI terminal also goes to "H" (0 V).

Since the respective anode terminals of the transfer thyristor T and the setting thyristor S are connected to the back electrode 91, these anode terminals are set to "H".

The respective cathodes of the odd-numbered transfer thyristors T1, T3, T5, and so on, which are connected to the transfer signal line 72-1, are set to "H" (0 V). The respective cathodes of the even-numbered transfer thyristors T2, T4, T6, and so on, which are connected to the transfer signal line 72-2, are set to "H". Since the anode and cathode of each of these transfer thyristors T are both "H", these transfer thyristors T are in their OFF state.

The cathode terminal of the laser diode LD is connected to the lighting signal line 75 that is at "H" (0 V). In this regard, the laser diode LD and the setting thyristor S are connected in series via the tunnel junction layer 85. Since the cathode of the laser diode LD is "H", and the anode of the setting thyristor S is "H", the laser diode LD and the setting thyristor S are in their OFF state.

The gate Gt1 is connected to the cathode of the start diode SD as described above. The gate Gt1 is connected to the power supply line 71 that is at the power supply potential Vgk ("L" (−3.3 V)), via the power line resistor Rg1. The anode terminal of the start diode SD is connected to the transfer signal line 72-2, and connected to the φ2 terminal, which is at "H" (0 V), via the current-limiting resistor R2. Thus, the start diode SD is in forward bias, and the cathode (the gate Gt1) of the start diode SD is at a potential (−1.5 V) equal to the potential at the anode of the start diode SD ("H" (0 V)) minus the forward potential Vd (1.5 V) of the p-n junction. When the gate Gt1 becomes −1.5 V, the coupling diode D1 becomes forward biased because its anode (the gate Gt1) is at −1.5 V and its cathode is connected to the power supply line 71 ("L" (−3.3 V)) via the power line resistor Rg2. Thus, the potential of the gate Gt2 becomes −3 V, which is a value equal to the potential (−1.5 V) of the gate Gt1 minus the forward potential Vd (1.5 V) of the p-n junction. However, the effect of the anode of the start diode SD being "H" (0 V) does not extend to the gates Gt that are numbered 3 or higher, and the potential of each of these gates Gt is at "L" (−3.3 V), which is the potential of the power supply line 71.

Since the gate Gt is the same as the gate Gs, the gate Gs is at the same potential as the gate Gt. Thus, the threshold voltage of the transfer thyristor T and the setting thyristor S has a value equal to the potential at the gate Gt or Gs minus the forward potential Vd (1.5 V) of the p-n junction. That is, the threshold voltage of the transfer thyristor T1 and the setting thyristor S1 is −3 V, the threshold voltage of the transfer thyristor T2 and the setting thyristor S2 is −4.5 V, and the threshold voltage of the transfer thyristor T and the setting thyristor S that are numbered 3 or higher is −4.8 V.

Time b

At time b illustrated in FIG. 11, the transfer signal φ1 shifts from "H" (0 V) to "L" (−3.3 V). This causes the laser component C to start its operation.

When the transfer signal φ1 shifts from "H" to "L", the potential of the transfer signal line 72-1 shifts from "H" (0 V) to "L" (−3.3 V) via the φ1 terminal and the current-limiting resistor R1. Then, the transfer thyristor T1, which has a threshold voltage of −3 V, turns ON. At this time, the odd-numbered transfer thyristors T numbered 3 or higher, which have their cathode terminals connected to the transfer signal line 72-1, are unable to turn ON because their threshold voltage is −4.8 V. Meanwhile, the even-numbered transfer thyristors T are unable to turn ON because the transfer signal φ2 is "H" (0 V) and the transfer signal line 72-2 is "H" (0 V).

As the transfer thyristor T1 turns ON, the potential of the transfer signal line 72-1 changes to −1.5 V, which is a value equal to the potential at the anode ("H" (0 V)) minus the forward potential Vd (1.5 V) of the p-n junction.

When the transfer thyristor T1 turns ON, the potential of the gate Gt1/Gs1 becomes "H" (0 V), which is the potential at the anode of the transfer thyristor T1. Then, the potential of the gate Gt2 (the gate Gs2) becomes −1.5 V, the potential of the gate Gt3 (the gate Gs3) becomes −3 V, and the potential of the gates Gt (the gates Gs) that are numbered 4 or higher becomes "L".

As a result, the threshold voltage of the setting thyristor S1 becomes −1.5 V, the threshold voltage of the transfer thyristor T2 and the setting thyristor S2 becomes −3 V, the threshold voltage of the transfer thyristor T3 and the setting thyristor S3 becomes −4.5 V, and the threshold voltage of the transfer thyristor T and the setting thyristor S that are numbered 4 or higher becomes −4.8 V.

However, since the transfer signal line 72-1 is at a potential close to −1.5 V due to the transfer thyristor T1 that is in the ON state, the odd-numbered transfer thyristors T that are in their OFF state do not turn ON. Since the transfer signal line 72-2 is "H" (0 V), the even-numbered transfer thyristors T do not turn ON. Since the lighting signal line 75 is "H" (0 V), none of the laser diodes LD lights up.

Immediately after time b (which refers in this case to when a steady state is reached following a change in thyristors or other components occurring as a result of a change in signal potential at time b), the transfer thyristor T1 is in the ON state, and the transfer thyristors T other than the transfer thyristor T1, the setting thyristors S, and the laser diodes LD are in their OFF state.

Time c

Time c is the timing to shift the laser diode LD1 from the ON state to the ON state to light the laser diode LD1. However, since the laser diode LD1 is not to be lit in this case, the lighting signal φI is "H" (0 V) at time c. The laser diode LD1 and the setting thyristor S1 thus maintain their OFF state.

Immediately after time c, the transfer thyristor T1 is in the ON state, and the laser diode LD1 and the setting thyristor S1 are in the OFF state.

Time d

Time d represents the timing to shift the laser diode LD1 to the OFF state if the laser diode LD1 is ON. However, since the laser diode LD1 is not to be lit in this case, the lighting signal φI is "H" (0 V) in the period from time c to time d. Thus, the laser diode LD1 and the setting thyristor S1 maintain their OFF state.

Immediately after time d, the transfer thyristor T1 is in the ON state, and the laser diode LD1 and the setting thyristor S1 are in the OFF state.

Time e

At time e, the transfer signal φ2 shifts from "H" (0 V) to "L" (−3.3 V). At this point, the period U(1) for performing lighting-control of the laser diode LD1 ends, and the period U(2) for performing lighting-control of the laser diode LD2 begins.

When the transfer signal φ2 shifts from "H" to "L", the potential of the transfer signal line 72-2 shifts from "H" to "L" via the φ2 terminal. The transfer thyristor T2 has a threshold voltage set to −3 V as described above, and thus turns ON. As a result, the potential of the gate terminal Gt2 (the gate terminal Gs2) becomes "H" (0 V), the potential of the gate Gt3 (the gate Gs3) becomes −1.5 V, and the potential of the gate Gt4 (the gate Gs4) becomes −3 V. Then, the potential of the gate Gt (the gate Gs) numbered 5 or higher becomes "L" (−3.3 V).

As a result, the threshold voltage of the setting thyristor S2 becomes −1.5V, the threshold voltage of the transfer thyristor T3 and the setting thyristor S3 becomes −3 V, the threshold voltage of the transfer thyristor T4 and the setting thyristor S4 becomes −4.5 V, and the threshold voltage of the setting thyristor T and the setting thyristor S that are numbered 5 or higher becomes −4.8 V.

Immediately after time e, the transfer thyristors T1 and T2 are in their ON state.

Time f

At time f, the transfer signal φ1 shifts from "L" (−3.3 V) to "H" (0 V).

When the transfer signal φ1 shifts from "L" to "H", the potential of the transfer signal line 72-1 shifts from "L" to "H" via the φ1 terminal. Then, the anode and cathode of the transfer thyristor T1 that is in its ON state both become "H", causing the transfer thyristor T1 to turn OFF. Then, the potential of the gate Gt1 (the gate Gs1) changes toward the power supply potential Vgk ("L" (−3.3 V)) of the power supply line 71 via the power line resistor Rg1. This brings the coupling diode D1 into a state (reverse biased state) in which a potential is applied to the coupling diode D1 in a direction that does not allow current flow. Therefore, the effect of the gate Gt2 (the gate Gs2) being "H" (0 V) does not extend to the gate Gt1 (the gate Gs1). That is, the threshold voltage of the transfer thyristor T having the gate Gt connected by the coupling diode D that is in reverse bias becomes −4.8 V, and thus such a thyristor T is not turned ON by the transfer signal φ1 or φ2 that is at "L" (−3.3 V).

Immediately after time f, the transfer thyristor T2 is in its ON state.

Time g

At time g, the lighting signal φI shifts from "H" (0 V) to "Lo" (−5 V).

When the lighting signal φI shifts from "H" to "Lo", the lighting signal line 75 shifts from "H" (0 V) to "Lo" (−5 V) via the current-limiting resistor RI and the φI terminal. Then, a voltage of −3.3 V, which equals −5V plus 1.7 V applied to the laser diode LD, is applied to the setting thyristor S2, and the setting thyristor S2 having a threshold voltage of −1.5 V turns ON. The laser diode LD2 is thus brought into the ON (lit) state. This places the lighting signal line 75 at a potential close to −3.2 V (a negative potential larger than 3.2 V in absolute value). At this time, although the threshold voltage of the setting thyristor S3 is set at −3 V, the voltage applied to the setting thyristor S3 is −1.5 V, which equals −3.2 V plus a voltage of 1.7 V applied to the laser diode LD. Thus, the setting thyristor S3 does not turn ON.

Time A

At time A, the transfer thyristor T2 and the setting thyristor S2 are in their ON state, and the laser diode LD2 is in its ON (lit) state. The laser diode LD2 emits light with the wavelength λ2. At this time, the wavelength λ2 lies in the central portion of the wavelength channel ch specified by the laser component C. Accordingly, the laser diode LD2 may be maintained in the ON (lit) state. That is, the transfer signals φ1 and φ2, and the lighting signal φI are maintained in the state at time A.

Now, suppose that the environmental temperature T has fallen to the environmental temperature $T_1$. As described above, the laser diode LD to be lit is switched from the laser diode LD2 to the laser diode LD3 at this time. The following describes a method for switching from the laser diode LD2 to the laser diode LD3.

Time h

At time h, the lighting signal φI is shifted from "Lo" (−5 V) to "H" (0 V).

When the lighting signal φI shifts from "Lo" to "H", the potential of the lighting signal line 75 shifts from −3.2 V to "H" (0 V) via the current-limiting resistor RI and the φI terminal. Then, the cathode of the laser diode LD2 and the anode of the setting thyristor S2 both become "H". Thus, the setting thyristor S2 turns OFF, and the laser diode LD2 becomes OFF (extinguished).

Immediately after time h, the transfer thyristor T2 is in its ON state.

Time i

At time i, the transfer signal φ1 is shifted from "H" (0 V) to "L" (−3.3 V). At this point, the period U(2) for performing lighting-control of the laser diode LD2 ends, and the period U(3) for performing lighting-control of the laser diode LD3 begins.

When the transfer signal φ1 shifts from "H" to "L", the potential of the transfer signal line 72-1 shifts from "H" to "L" via the φ1 terminal. As with time e, since the threshold voltage of the transfer thyristor T3 is set to −3 V, the transfer thyristor T3 turns ON. As a result, the potential of the gate terminal Gt3 (the gate terminal Gs3) becomes "H" (0 V), the potential of the gate Gt4 (the gate Gs4) becomes −1.5 V, and the potential of the gate Gt5 (the gate Gs5) becomes −3 V. Then, the potential of the gate Gt (the gate Gs) numbered 6 or higher becomes "L" (−3.3 V).

As a result, the threshold voltage of the setting thyristor S3 becomes −1.5V, the threshold voltage of the transfer thyristor T4 and the setting thyristor S4 becomes −3 V, the threshold voltage of the transfer thyristor T5 and the setting thyristor S5 becomes −4.5 V, and the threshold voltage of the setting thyristor T and the setting thyristor S that are numbered 6 or higher becomes −4.8 V.

Immediately after time i, the transfer thyristors T2 and T3 are in their ON state.

Time j

At time j, the transfer signal φ2 is shifted from "L" (−3.3 V) to "H" (0 V).

When the transfer signal φ2 shifts from "L" (−3.3 V) to "H" (0 V), as with time f, the transfer thyristor T2 in its ON state turns OFF.

Immediately after time j, the transfer thyristor T3 is in its ON state.

Time k

At time k, the lighting signal φI is shifted from H" (0 V) to "Lo" (−5 V) as indicated by a broken line.

When the lighting signal φI shifts from "H" (0 V) to "Lo" (−5 V), as with time g, the setting thyristor S3 whose threshold voltage is −1.5 V turns ON, and the laser diode LD3 goes to the ON (lit) state.

Time B

At time B, the transfer thyristor T3 and the setting thyristor S3 are in their ON state, and the laser diode LD3 is lit (emitting light). The laser diode LD3 emits light with the wavelength λ"3. At this time, the wavelength λ"3 lies in the central portion of the wavelength channel ch specified by the laser component C. Accordingly, the laser diode LD3 may be continued to be lit (emitting light). That is, the transfer signals φ1 and φ2, and the lighting signal φI are maintained in the state at time B.

Now, suppose that the environmental temperature T has risen to the environmental temperature $T_2$. As described above, the laser diode LD to be lit is switched from the laser diode LD2 to the laser diode LD1 at this time. This may be accomplished by using the transfer signals φ1 and φ2 to transfer the lighting-enabled state down to the laser diode LD135, followed by sequentially bringing the laser diodes LD into the lighting-enabled state again beginning with the laser diode LD1. Alternatively, this may be accomplished by setting the signals (the transfer signals φ1 and φ2 and the lighting signal φI) to "H" to initialize the laser component C, followed by sequentially bringing the laser diodes LD into the lighting-enabled state beginning with the laser diode LD1. In this case, the laser diode LD1 may be shifted from the OFF state to the ON (lit) state. Then, the transfer signals φ1 and φ2, and the lighting signal φI may be maintained in the state at time C.

Due to the tendency regarding changes in the wavelength of the laser diodes LD with environmental temperature T, switching between the laser diodes LD becomes faster if the next laser diode LD to be lit is placed downstream of the laser diode LD that is being currently lit in the array.

As described above, the gate terminals Gt of the transfer thyristors T are connected to each other via the corresponding coupling diodes D. Thus, a change in the potential of a given gate Gt causes a change in the potential of the gate Gt connected via the coupling diode D that is in forward biased condition to the gate Gt whose potential has changed. This in turn causes a change in the threshold voltage of the transfer thyristor T that has the gate whose potential has changed. When the threshold voltage of the transfer thyristor T has a value higher than (a negative value smaller in absolute value than) "L" (−3.3 V), the transfer thyristor T turns ON at the timing when the transfer signal ϕ1 or the transfer signal ϕ2 shifts from "H" (0 V) to "L" (−3.3 V).

At this time, since the threshold voltage is −1.5 V for the setting thyristor S whose gate Gs is connected to the gate Gt of the transfer thyristor T that is in the ON state, the setting thyristor S turns ON when the lighting signal ϕI shifts from "H" (0 V) to "Lo" (−5 V), and the laser diode LD connected in series with the setting thyristor S turns to the ON (lit) state.

That is, as the transfer thyristor T is placed in the ON state, the laser diode LD to be lighting-controlled is specified, and the setting thyristor S is set to a state that enables the laser diode LD to light up. Then, the lighting signal ϕI at "Lo" (−5 V) causes the setting thyristor S to turn ON, and also causes the laser diode LD connected in series with the setting thyristor S to light up.

Method for Fabricating Laser Component C

A method for fabricating the laser component C will be described. In the following, the method will be described with reference to the cross-section of the island 301 illustrated in FIG. 7A that is formed by stacking the setting thyristor S and the laser diode LD.

FIGS. 12A to 12F illustrate a method for fabricating the laser component C. FIG. 12A illustrates a semiconductor laminate forming step, FIG. 12B illustrates a step of forming the n-ohmic electrode 321, FIG. 12C illustrates an etching step for exposing the tunnel junction layer 85, FIG. 12D illustrates a step of forming the current-blocking portion β of the current confinement layer 86b, FIG. 12E illustrates an etching step for exposing the p-gate layer 83, and FIG. 12F illustrates a step of forming the p-ohmic electrode 331 and the back electrode 91.

In FIGS. 12A to 12F, multiple steps are collectively illustrated in some cases.

These steps will be described below in order.

The semiconductor laminate forming step illustrated in FIG. 12A involves epitaxially growing, over the substrate 80 that is a p-type substrate, the p-anode layer 81, the n-gate layer 82, the p-gate layer 83, the n-cathode layer 84, the tunnel junction layer 85, the p-anode layer 86, the light emitting layer 87, and the n-cathode layer 88 in the stated order to form a semiconductor laminate. FIGS. 12A to 12F only depict the conductivity types of these layers, such as "p" and "n".

Although the substrate 80 is made of a p-type GaAs material in this example, the substrate 80 may be made of an n-type GaAs material, or an intrinsic (i-type) GaAs material with no impurity doped. Alternatively, the substrate 80 may be a semiconductor substrate made of InP, GaN, InAs, or other group III-V or group II-VI materials, a semiconductor substrate made of a group IV material such as Si or Ge, or a substrate made of sapphire or other materials. If the substrate used is changed, a material that substantially matches (including a strain structure, a strain relaxation layer, and metamorphic growth) the lattice constant of the substrate is used as the material to be monolithically stacked over the substrate. In one example, a material such as InAs, InAsSb, or GaInAsSb is used as a material stacked over an InAs substrate, a material such as InP or InGaAsP is used as a material stacked over an InP substrate, a material such as GaN, AlGaN, or InGaN is used as a material stacked over a GaN substrate or a sapphire substrate, and a material such as Si, SiGe, or GaP is used as a material stacked over a Si substrate. For cases where the process involves crystal growth followed by bonding to another support substrate, the semiconductor material used does not need to be substantially lattice-matched to the support substrate. Further, the above step may be applied to the fabrication of a light emitting component using not only a semiconductor material but also an organic material having a p- or n-type conductivity similarly to a semiconductor material.

The p-anode layer 81 is a p-type $Al_{0.9}GaAs$ layer with an impurity concentration of $1 \times 10^{18}/cm^3$, for example. The Al composition may be varied in the range from 0 to 1. The p-anode layer 81 may be made of GaInP or other materials.

The n-gate layer 82 is an n-type $Al_{0.9}GaAs$ layer with an impurity concentration of $1 \times 10^{17}/cm^3$, for example. The Al composition may be varied in the range from 0 to 1. The n-gate layer 82 may be made of GaInP or other materials.

The p-anode layer 83 is a p-type $Al_{0.9}GaAs$ layer with an impurity concentration of $1 \times 10^{17}/cm^3$, for example. The Al composition may be varied in the range from 0 to 1. The p-gate layer 83 may be made of GaInP or other materials.

The n-cathode layer 84 is an n-type $Al_{0.9}GaAs$ layer with an impurity concentration of $1 \times 10^{18}/cm^3$, for example. The Al composition may be varied in the range from 0 to 1. The n-cathode layer 84 may be made of GaInP or other materials.

The tunnel junction layer 85 is formed by a junction (see FIG. 12B) of the $n^{++}$ layer 85a doped with a high concentration of n-type impurities and the $p^{++}$ layer 85b doped with a high concentration of p-type impurities. The $n^{++}$ layer 85a and the $p^{++}$ layer 85b each have a high impurity concentration of, for example, $1 \times 10^{20}/cm^3$. The impurity concentration of a typical junction is on the order of $10^{17}/cm^3$ to $10^{18}/cm^3$. Examples of combinations of the $n^{++}$ layer 85a and the $p^{++}$ layer 85b (to be referred to as $n^{++}$ layer 85a/$p^{++}$ layer 85b hereinafter) include $n^{++}GaInP/p^{++}GaAs$, $n^{++}GaInP/p^{++}AlGaAs$, $n^{++}GaAs/p^{++}GaAs$, $n^{++}AlGaAs/p^{++}AlGaAs$, $n^{++}InGaAs/p^{++}InGaAs$, $n^{++}GaInAsP/p^{++}GaInAsP$, and $n^{++}GaAsSb/p^{++}GaAsSb$. These combinations may be changed with each other.

The p-anode layer 86 is formed by stacking the lower p-anode layer 86a, the current confinement layer 86b, and the upper p-anode layer 86c in this order (see FIG. 12C).

The lower p-anode layer 86a and the upper p-anode layer 86c are, for example, p-type $Al_{0.9}GaAs$ layers with an impurity concentration of $1 \times 10^{18}/cm^3$. The Al composition may be varied in the range from 0 to 1. These layers may be made of GaInP or other materials.

The current confinement layer 86b is made of, for example, a p-type AlGaAs material with a high concentration of impurities such as AlAs or Al. The material used may be any material that, as Al is oxidized to form $Al_2O_3$, provides increased electrical resistance to confine the current path.

The light emitting layer 87 has a quantum well structure formed by an alternate stack of well and barrier layers. The well layer is made of, for example, GaAs, AlGaAs, InGaAs, GaAsP, AlGaInP, GaInAsP, or GaInP, and the barrier layer is made of, for example, AlGaAs, GaAs, GaInP, or GaInAsP.

The light emitting layer 87 may be made of quantum lines (quantum wires) or quantum boxes (quantum dots). The light emitting layer 87 may be formed by a combination of a well layer, a barrier layer, and spacer layers disposed above and below these layers. The light emitting layer 87 may be formed by, for example, a resonator structure.

The n-cathode layer 88 is, for example, an n-type $Al_{0.9}GaAs$ layer with an impurity concentration of $1×10^{18}/cm^3$. The Al composition may be varied in the range from 0 to 1. The n-cathode layer 88 may be made of GaInP or other materials.

These semiconductor layers are stacked by, for example, metal organic chemical vapor deposition (MOCVD) or molecular beam epitaxy (MBE) to form a semiconductor laminate.

In the step of forming the n-ohmic electrode 321 illustrated in FIG. 12B, first, the n-ohmic electrode 321 is formed over the n-cathode layer 88.

The n-ohmic electrode 321 is made of, for example, Au (AuGe) containing Ge that allows for easy ohmic contact to an n-type semiconductor layer such as the n-cathode layer 88.

The n-ohmic electrode 321 is formed by, for example, a lift-off method.

In the etching step for exposing the tunnel junction layer 85 illustrated in the FIG. 12C, the n-cathode layer 88, the light emitting layer 87, and the p-anode layer 86 over the tunnel junction layer 85 are etched away around the laser diode LD.

This etching may be performed by wet etching using a sulfuric acid-based etchant (with a weight ratio between sulfuric acid, aqueous hydrogen peroxide, and water=1:10:300) or other etchants, or by anisotropic drying etching (e.g., RIE) using, for example, boron chloride.

In the step of forming the current-blocking portion β of the current confinement layer 86b illustrated in FIG. 12D, the current confinement layer 86b, which has its side surface exposed by the etching step performed for exposing the tunnel junction layer 85, is oxidized from the side surface to form the current-blocking portion β that blocks current. The portion of the current confinement layer 86b left unoxidized serves as the current-passing portion α.

The oxidation of the current confinement layer 86b from its side surface is performed by, for example, oxidizing Al of the current confinement layer 86b made of AlAs, AlGaAs, or other materials by steam oxidation at a temperature of 300° C. to 400° C. At this time, oxidation proceeds from the exposed side surface, and the current-blocking portion β made of $Al_2O_3$, which is an oxide of Al, is formed around the laser diode LD.

The current-blocking portion β may be formed by, instead of oxidation of AlAs, implantation of hydrogen ($H_2$). That is, the lower p-anode layer 86a and the upper p-anode layer 86c may be deposited not separately but contiguously as the p-anode layer 86, followed by implantation of hydrogen ($H_2$) ions into the portion of the p-anode layer 86 that is to become the current-blocking portion β. This imparts insulating properties to materials such as $Al_{0.9}GaAs$ to form the current-blocking portion β.

In the etching step for exposing the p-gate layer 83 illustrated in FIG. 12E, the tunnel junction layer 85 and the n-cathode layer 84 are etched to expose the p-gate layer 83.

This etching may be performed by wet etching using a sulfuric acid-based etchant (with a weight ratio between sulfuric acid, aqueous hydrogen peroxide, and water=1:10:300), or by anisotropic drying etching using, for example, boron chloride.

If, in the etching step illustrated in FIG. 12C performed for exposing the tunnel junction layer 85, the p-gate layer 83 is exposed instead of the tunnel junction layer 85, this may cause Al included in the p-gate layer 83 to be oxidized in the step of forming the current-blocking portion β illustrated in FIG. 12D. Such oxidation of Al included in the p-gate layer 83 causes, for example, surface roughness, or poor adhesion of the p-ohmic electrode 331 described later. Accordingly, the step of forming the current-blocking portion β is performed with the tunnel junction layer 85 exposed.

In the step of forming the p-ohmic electrode 331 and the back electrode 91 illustrated in FIG. 12F, first, the p-ohmic electrode 331 is formed over the p-gate layer 83.

The p-ohmic electrode 331 is made of, for example, Au (AuZn) containing Zn that allows for easy ohmic contact to a p-type semiconductor layer such as the p-gate layer 83.

The p-ohmic electrode 331 is formed by, for example, a lift-off method. At this time, the other p-ohmic electrodes may be formed simultaneously.

Next, the back electrode 91 is formed on the back of the substrate 80.

As with the p-ohmic electrode 331, the back electrode 91 is made of, for example, AuZn.

In addition to the steps mentioned above, the fabrication process includes steps such as forming the protective layer 90, forming through-holes in the protective layer 90, forming wiring lines (the connection wiring lines 76 and 77), and forming, by means of cleavage, an emitting surface from which a laser beam is emitted.

The method for fabricating the laser component C has been described above with respect to a portion of the island 301 formed by stacking the setting thyristor S and the laser diode LD.

The other islands including the transfer thyristors T, the coupling diodes D, the power line resistor Rg1, and current-limiting resistors R1 to R6, such as the islands 302 to 306, are formed through a process including, in addition to the above-mentioned steps, the steps of exposing the surface of the n-cathode layer 84, and forming components such as an n-ohmic electrode 322 or 323 over the n-cathode layer 84 that has been exposed. The step of forming wiring lines includes forming lines such as the power supply line 71, the transfer signal lines 72-1 and 72-2, and the lighting signal line 75.

In the above-mentioned example, the p-ohmic electrode 331 is formed over the p-gate layer 83 to serve as the gate terminal Gs of the setting thyristor S. Alternatively, the gate terminal Gs of the setting thyristor S may be disposed over the n-gate layer 82. The same applies to the transfer thyristor T.

Instead of forming the current confinement layer 86b in the p-anode layer 86, the current confinement layer 86b may be formed in the p-anode layer 81.

In the first exemplary embodiment, the laser diode LD and the setting thyristor S are stacked with the tunnel junction layer 85 interposed therebetween. In this case, the tunnel junction layer 85 of the laser diode LD becomes reverse biased. In this regard, a tunnel junction has a characteristic of allowing current to flow even in reversed biased condition.

If the tunnel junction layer 85 is not provided, the junction between the laser diode LD and the setting thyristor S is reverse biased. Accordingly, to allow current to flow through the laser diode LD and the setting thyristor S, a voltage that causes the reverse biased junction to break down needs to be applied. This translates into increased driving voltage.

Therefore, stacking the laser diode LD and the setting thyristor S with the tunnel junction layer 85 interposed therebetween helps to keep the driving voltage lower than that required if the tunnel junction layer 85 is not provided between the laser diode LD and the setting thyristor S.

As described above, the tunnel junction layer 85 allows current to flow relatively easily in reverse biased condition.

However, the junction between the n-cathode layer 84 and the p-anode layer 86, which is not a tunnel junction, does not readily allow current to flow under a reverse bias that does not cause the junction to break down. Accordingly, the tunnel junction layer 85 may be formed in the portion corresponding to the current-passing portion α, and the tunnel junction layer 85 may not be formed in the portion corresponding to the current-blocking portion β. In this case, after deposition of the tunnel junction layer 85, a part of the tunnel junction layer 85 is etched away, and then the p-anode layer 86 is epitaxially grown so as to bury the tunnel junction layer 85 that is left to remain. The area around the tunnel junction layer 85 that is left to remain may be buried by the n-cathode layer 84 instead of the p-anode layer 86. This configuration may be employed for applications that use semiconductor materials for which it is difficult to use steam oxidation.

The following describes a modification of the laser component C according to the first exemplary embodiment. The modification described below uses, instead of the tunnel junction layer 85, a group III-V compound layer that exhibits metal-like conductivity and epitaxially grows into a group III-V compound semiconductor layer. In this case, the "tunnel junction layer 85" in the foregoing description of the first exemplary embodiment may be read as "metal-like-conductivity group III-V compound layer 85" described below.

Figure 13A:
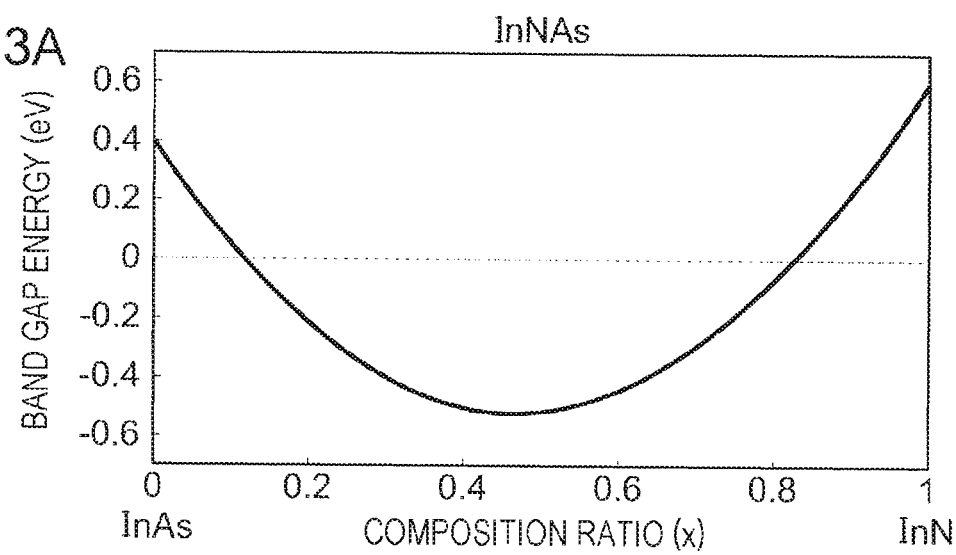
Figure 13B:
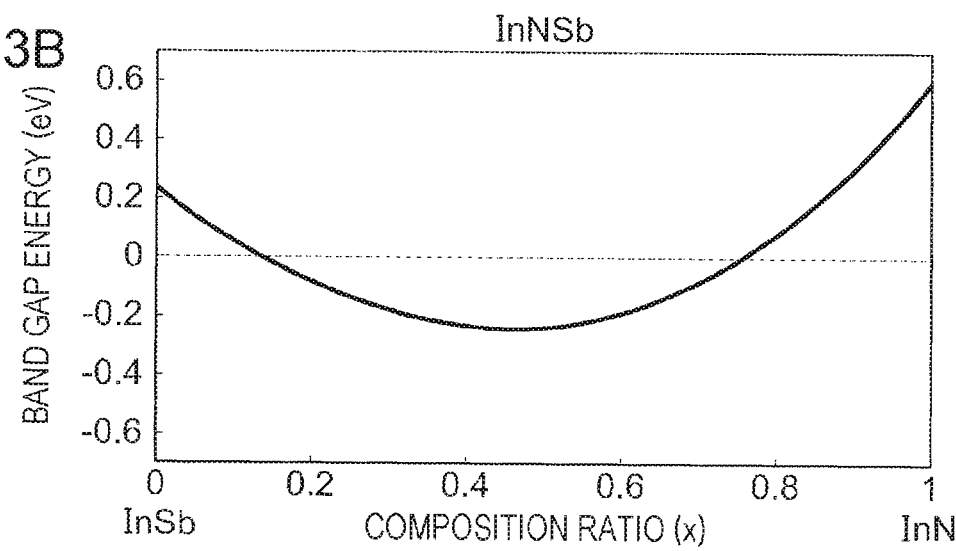
Figure 13C:
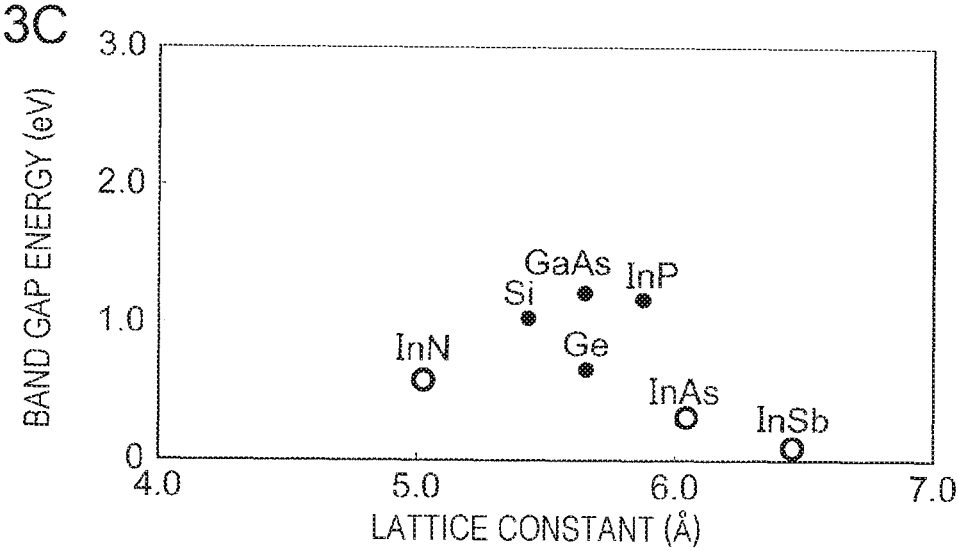

FIGS. 13A to 13C illustrate materials forming the metal-like-conductivity group III-V compound layer. FIG. 13A illustrates the band gap of InNAs with respect to the composition ratio x of InN, FIG. 13B illustrates the band gap of InNSb with respect to the composition ratio x of InN, and FIG. 13C illustrates the lattice constants of group VI elements and group III-V compounds with respect to band gap.

FIG. 13A illustrates band gap energy (eV) with respect to InNAs, which is a compound of InN having a composition ratio x (x=0 to 1) and InAs having a composition ratio (1−x).

FIG. 13B illustrates band gap energy (eV) with respect to InNSb, which is a compound of InN having a composition ratio x (x=0 to 1) and InSb having a composition ratio (1−x).

InNAs and InNSb, which are each herein described as an example of a material forming the metal-like-conductivity group III-V compound layer, are known to have a negative band gap energy in a certain range of composition ratios x as illustrated in FIGS. 13A and 13B. Having a negative band gap energy means having no band gap. Hence, such a material exhibits conductivity characteristics (conduction characteristics) similar to those of metals. In other words, metal-like conductive characteristics (conductivity) mean that as with metals, current is allowed to flow in the presence of a potential gradient.

As illustrated in FIG. 13A, InNAs has a negative band gap energy when, for example, the composition ratio x of InN is in the range of approximately 0.1 to approximately 0.8.

As illustrated in FIG. 13B, InNSb has a negative band gap energy when, for example, the composition ratio x of InN is in the range of approximately 0.2 to approximately 0.75.

That is, InNAs and InNSb exhibit metal-like conductive characteristics (conductivity) in the above-mentioned ranges.

In regions with small band gap energies outside the above-mentioned ranges, the electrons have energy due to thermal energy, allowing the electrons to transition across a small band gap. Thus, these materials exhibit characteristics that readily allow current to flow in the presence of a potential gradient, as with when the band gap energy is negative or as with metals.

Even if InNAs and InNSb contain elements such as Al, Ga, Ag, and P, depending on the composition, the band gap energy of these materials can be maintained to be near zero or negative, which allows current to flow in the presence of a potential gradient.

Further, as illustrated in FIG. 13C, group III-V compounds (semiconductors) such as GaAs and InP have lattice constants ranging from 5.6 Å to 5.9 Å. These lattice constants are close to the lattice constant of Si, which is approximately 5.43 Å, and to the lattice constant of Ge, which is approximately 5.66 Å.

In contrast, InN, which is likewise a group III-V compound, has a lattice constant of approximately 5.0 Å in the case of the zinc blend structure, and InAs has a lattice constant of approximately 6.06 Å. Hence, the lattice constant of InNAs, which is a compound of InN and InAs, can take values close to 5.6 Å to 5.9 Å, which coincide with the range of lattice constants of materials such as GaAs.

InSb, which is a group III-V compound, has a lattice constant of approximately 6.48 Å. Since the lattice constant of InN is approximately 5.0 Å, the lattice constant of InNSb, which is a compound of InSb and InN, can take values close to 5.6 Å to 5.9 Å, which coincide with the range of lattice constants of materials such as GaAs.

That is, InNAs and InNSb can be epitaxially grown monolithically over a layer of a group III-V compound (semiconductor) such as GaAs. Further, a layer of a group III-V compound (semiconductor) such as GaAs can be epitaxially grown monolithically over a layer of InNAs or InNSb.

Therefore, if the laser diode LD and the setting thyristor S are stacked to be connected in series with each other such that, instead of the tunnel junction layer 85, a metal-like-conductivity group III-V compound layer is interposed between the laser diode LD and the setting thyristor S, this prevents or reduces reverse biasing of the junction between the p-anode layer 86 of the laser diode LD and the n-cathode layer 84 of the setting thyristor S.

A metal-like-conductivity group III-V compound layer readily allows current to flow. However, the junction between the n-cathode layer 84 and the p-anode layer 86 does not readily allow current to flow under a reverse bias that does not cause the junction to break down. Accordingly, the metal-like-conductivity group III-V compound layer may be formed in the portion corresponding to the current-passing portion α, and the metal-like-conductivity group III-V compound layer may not be formed in the portion corresponding to the current-blocking portion β.

As described above, the laser component C according to the first exemplary embodiment is formed by stacking the setting thyristor S and the laser diode LD. Thus, the laser component C constitutes a self-scanning light emitting device (SLED) array in which the laser diodes LD are sequentially specified (selected) by means of the transfer thyristor T and the setting thyristor S. This configuration reduces the number of terminals provided in the laser component C, leading to miniaturization of the laser component C and the laser generating unit 6. Such a sequential specifying (selecting) action is herein sometimes referred to as transfer.

In some cases, the laser diode LD is not disposed over the setting thyristor S, and the setting thyristor S is used as a laser diode. That is, in some cases, the p-anode layer 81 and the n-cathode layer 84 of the setting thyristor S serve as cladding layers, and the light emitted at the junction of the n-gate layer 82 and the p-gate layer 83 in the ON state is used as a laser beam. In such cases, it is not possible to set the transfer characteristics due to the transfer thyristor T and the setting thyristor S, and the light emission characteristics of the laser diode (the setting thyristor S) individually (independently). This makes it difficult to achieve improvements such as faster driving, higher optical output, higher efficiency, lower power consumption, and lower cost.

Further, suppose that, for example, a thyristor (the setting thyristor S) is used as a laser device to emit light at 780 nm. In this case, to construct a quantum well structure using AlGaAs, the composition ratio of Al is set to 30%. In this case, if etching for exposing the gate is performed, Al is oxidized, making it impossible to form the gate terminal.

In contrast, in the first exemplary embodiment, light emission is performed by the laser diode LD, and transfer is performed by the transfer thyristor T and the setting thyristor S. Thus, light emission and transfer are separated from each other. The setting thyristor S is not required to emit light. This allows the laser diode LD to be constructed as a quantum well structure to improve characteristics such as light emission characteristics, and also makes it possible to improve characteristics such as the transfer characteristics due to the transfer thyristor T and the setting thyristor S. That is, this configuration allows the laser diode LD of the light emitting unit 102, and the transfer thyristor T and the setting thyristor S of the driving unit 101 to be set individually (independently). This makes it easy to achieve improvements such as faster driving, higher optical output, higher efficiency, lower power consumption, and lower cost.

Figure 14:
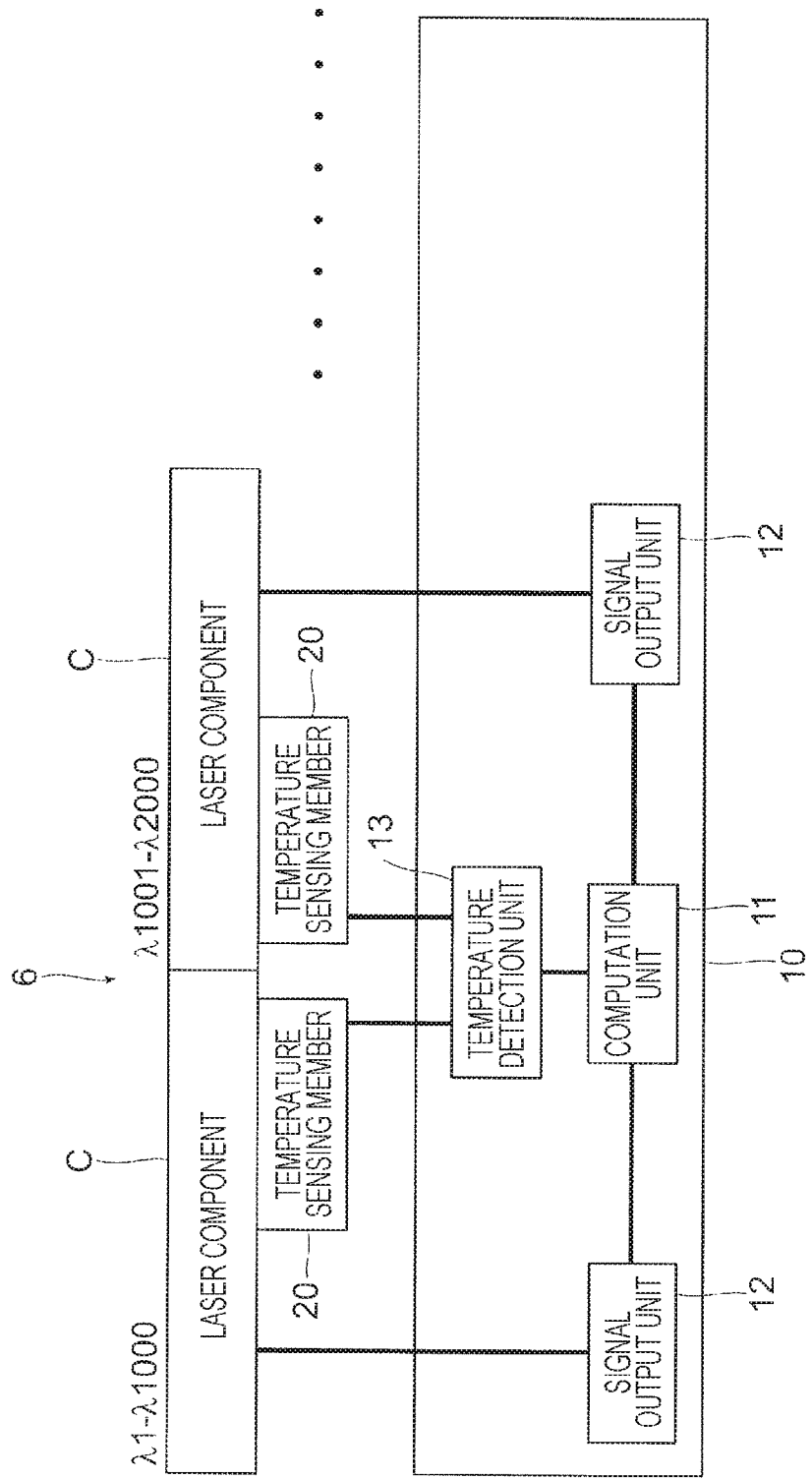
FIG. 14 illustrates a laser generating unit including multiple laser components.

FIG. 14 illustrates the laser generating unit 6 including multiple laser components C. The laser generating unit 6 includes the following laser components C arranged in parallel in the same plane: the laser component C that emits light at wavelengths λ1 to λ1000, the laser component C that emits light at wavelengths λ1001 to λ2000, and the laser components C that emit light at wavelengths different from the wavelengths mentioned above. The temperature sensing member 20 is provided for each laser component C. The control unit 10 includes the computation unit 11, the signal output unit 12 provided for each laser component C, and the temperature detection unit 13. The temperature detection unit 13 is connected to the computation unit 11, and to the temperature sensing member 20 provided for each laser component C. The computation unit 11 is connected to the signal output unit 12 provided for each laser component C.

Each temperature sensing member 20 may be provided not for every single laser component C but for every multiple number of laser components C. The number of temperature sensing members 20 may be one.

The laser components C are driven individually based on the result of computation performed by the computation unit 11. Using multiple laser components C that differ in emission wavelength as described above allows for increased bandwidth.

Since the laser components C are each provided with the signal output unit 12 as described above, the laser components C are made to operate in parallel. Such parallel operation enables faster switching of the laser diodes LD (wavelengths).

Second Exemplary Embodiment

With the laser component C of the laser generating unit 6 according to the first exemplary embodiment, the laser diodes LD are sequentially selected by using the transfer thyristors T. With the laser component C of the laser generating unit 6 according to a second exemplary embodiment, the setting thyristors S are used as transfer thyristors.

The configuration of the second exemplary embodiment is otherwise the same as that of the first exemplary embodiment, and thus differences from the first exemplary embodiment will be described below.

With the laser component C according to the first exemplary embodiment, as described above with reference to FIG. 5, the gate Gs of the setting thyristor S is connected to the gate Gt of the transfer thyristor T. This means that it is possible to substitute the setting thyristor S for the transfer thyristor T, and cause the setting thyristor S to act as the transfer thyristor T.

Figure 15:
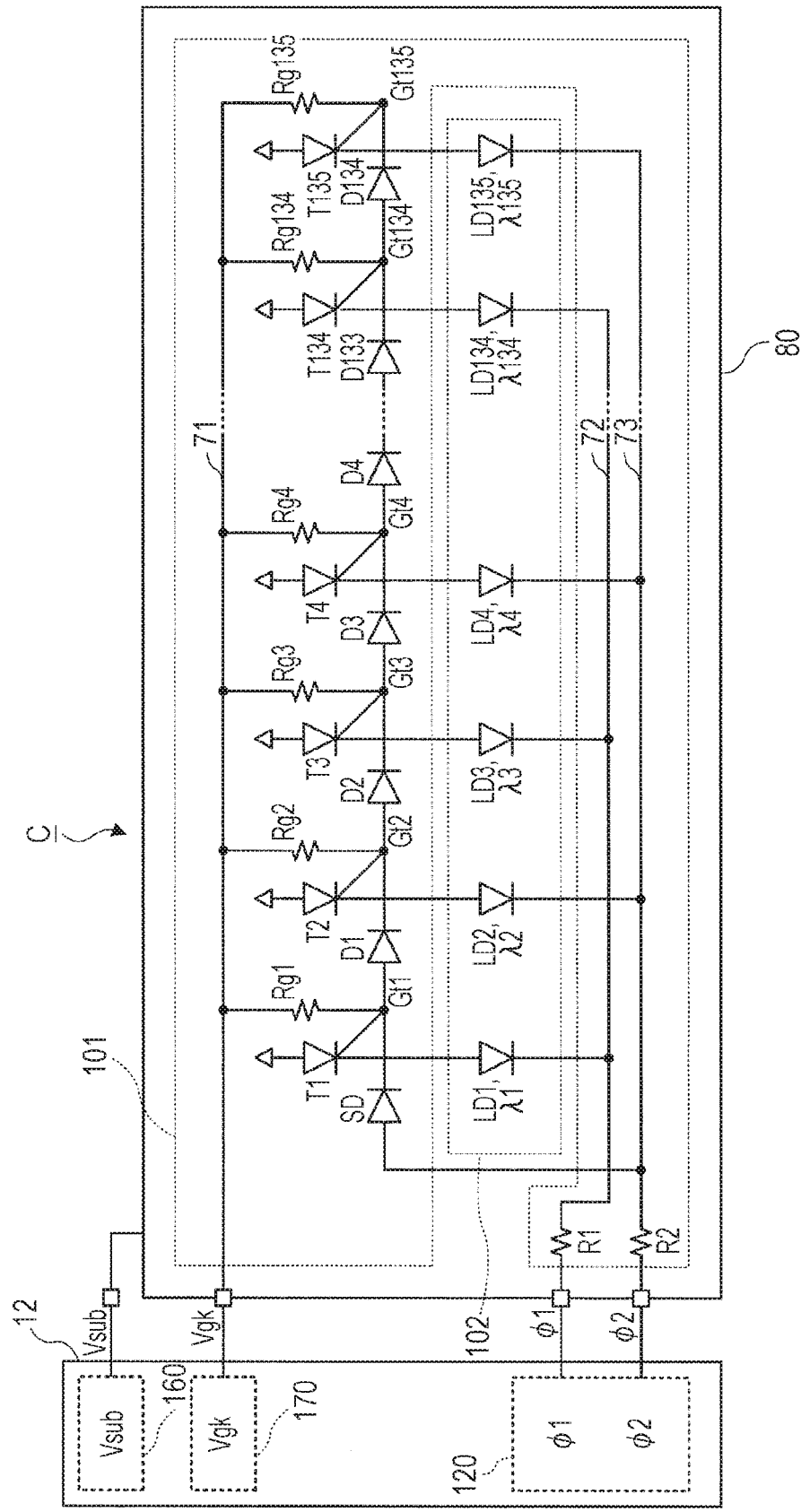
FIG. 15 is an equivalent circuit diagram of a laser component according to a second exemplary embodiment, and illustrates a signal output unit that outputs signals such as signals used to drive the laser component.

FIG. 15 is an equivalent circuit diagram of the laser component C according to the second exemplary embodiment, and illustrates the signal output unit 12 that outputs signals such as signals used to drive the laser component C.

The signal output unit 12 does not include the lighting signal generating unit 140.

The configuration of the laser component C is such that the transfer thyristors T illustrated in FIG. 5 are removed, and the setting thyristors S serve as the transfer thyristors T. Otherwise, the configuration according to the second exemplary embodiment is the same as that of the laser component C according to the first exemplary embodiment illustrated in FIG. 5.

It may be conceivable to change the "L" level of the transfer signals φ1 and φ2 to "Lo" in the timing chart according to the first exemplary embodiment illustrated in FIG. 11. "Lo" refers to a potential that causes the setting thyristor S of the laser component C according to the first exemplary embodiment to turn ON, and also causes the laser diode LD to light up.

However, if the "L" level of the transfer signals φ1 and 02 is changed to "Lo", this causes, for example, the laser diode LD1 to light up in the period from time b to time f illustrated in FIG. 11.

Accordingly, if the laser diode LD is not to be lit, it is desirable to set the transfer signals φ1 and φ2 to a "Lo'" level, which represents a level that causes the setting thyristor S to turn ON but causes the laser diode LD to light up in low light quantity condition. The quantity of light emitted by the laser diode LD at the "Lo'" level corresponds to the ON state of level "0" described later, which is equivalent to a state in which the laser diode LD is not lit.

Figure 16:
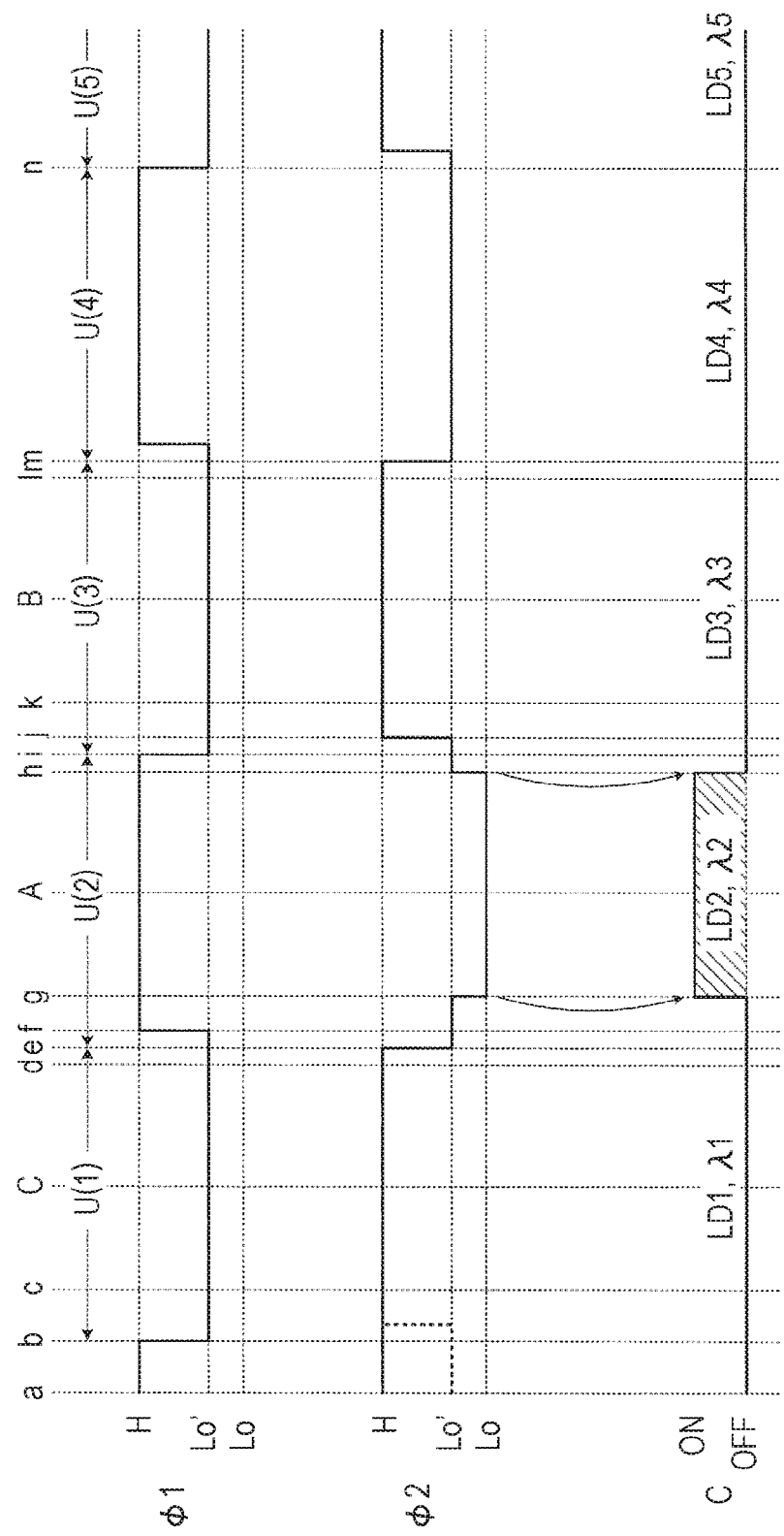
FIG. 16 is a timing chart illustrating the operation of a laser generating unit according to the second exemplary embodiment.

FIG. 16 is a timing chart illustrating the operation of the laser generating unit 6 according to the second exemplary embodiment. Features that are similar to those in FIG. 11 described above with reference to the first exemplary embodiment will be denoted by the same reference signs to avoid repetitive descriptions, and differences from the first exemplary embodiment will be described. It is assumed in this case as well that the laser diode LD2 is the laser diode LD to be lit.

The lighting signal φI illustrated in FIG. 11 is not provided. Instead, the transfer signals φ1 and φ2 are changed from those in the first exemplary embodiment.

At time b, the transfer signal φ1 shifts from "H" (0 V) to "Lo'". Then, the transfer thyristor T1 turns ON, and the laser diode LD1 lights up in low light quantity condition.

Time c is the timing to shift from "Lo'" to "Lo" (5 V) for cases where the laser diode LD1 is to be lit. Since the laser diode LD1 is not to be lit in this case, "Lo'" is maintained. Time d is the timing to shift from "Lo" (5 V) to "Lo'" for cases where the laser diode LD1 is to be lit. Since the laser diode LD1 is not to be lit in this case, "Lo'" is maintained.

Then, at time e, the transfer signal φ2 shifts from "H" (0 V) to "Lo'". Then, the transfer thyristor T2 turns ON, and the laser diode LD2 lights up in low light quantity condition.

Next, at time f, the transfer signal ϕ1 shifts from "Lo'" to "H" (0 V). Then, the transfer thyristor T1 turns OFF, and the laser diode LD1 goes to the OFF state.

Then, when, at time g, the transfer signal ϕ2 shifts from "Lo'" to "Lo" (5 V), the laser diode LD2 goes to the ON state.

In this way, the transfer thyristor T is made to double as the transfer thyristor T and the setting thyristor S illustrated in FIG. 5.

As described above with reference to the first exemplary embodiment, when the laser diode LD2 is to be lit, the transfer signals ϕ1 and ϕ2 are maintained in the state at time A.

Suppose that the environmental temperature T falls to the environmental temperature $T_1$, and the wavelength λ"2 of the laser diode LD2 is displaced toward an end of the wavelength channel ch (wavelength Λ) and the wavelength λ"3 of the laser diode LD3 is displaced (shifted) toward the central portion of the wavelength channel ch (wavelength Λ). The following operation may be performed in this case. That is, the laser diode LD2 is extinguished, the laser diode LD3 is lit up, and the transfer signals ϕ1 and ϕ2 are maintained in the state at time B.

Suppose that the environmental temperature T rises to the environmental temperature $T_2$, and the wavelength λ'2 of the laser diode LD2 is displaced toward an end of the wavelength channel ch (wavelength Λ) and the wavelength λ'1 of the laser diode LD1 is displaced (shifted) toward the central portion of the wavelength channel ch (wavelength Λ). The following operation may be performed in this case. That is, by means of the transfer signals ϕ1 and ϕ2, the lighting-enabled state is transferred down to the laser diode LD135, followed by sequentially bringing the laser diodes LD into the lighting-enabled state again beginning with the laser diode LD1 and then lighting the laser diode LD1. Alternatively, all the signals (the transfer signals ϕ1 and ϕ2) are set to "H" (0 V) to initialize the laser component C, followed by sequentially bringing the laser diodes LD into the lighting-enabled state beginning with the laser diode LD1 and then lighting the laser diode LD1. Then, the transfer signals ϕ1 and ϕ2 are maintained in the state at time C.

As described above, with the laser generating unit 6 according to the second exemplary embodiment, the laser diode LD of the laser component C lights up in low light quantity condition when the transfer signals ϕ1 and ϕ2 are at the "Lo'" level. This light quantity may be set to a value that does not affect the overall operation.

The fact that the transfer thyristor T doubles as the setting thyristor S, and the absence of the lighting signal line 75 allow for miniaturization of the laser component C.

For the laser component C, instead of using the laser diode LD, the transfer thyristor T may be constructed as a laser thyristor if this does not adversely affect transfer and light emission characteristics. For example, laser oscillation may be produced with the p-anode layer 81 and the n-cathode layer 84 used as cladding layers. This configuration eliminates the need to stack the tunnel junction layer 85, the p-anode layer 86, the light emitting layer 87, and the n-cathode layer 88 in the case of the arrangement illustrated in FIG. 12A. This facilitates fabrication of the laser component C.

Third Exemplary Embodiment

The optical intensity of the laser diode LD is subject to fluctuations (variations) caused by factors such as an oscillation delay that occurs upon application of voltage, or relaxation oscillation that occurs after the laser diode LD starts to oscillate. The term optical intensity as used herein refers to radiant intensity (or luminosity).

Figure 17:
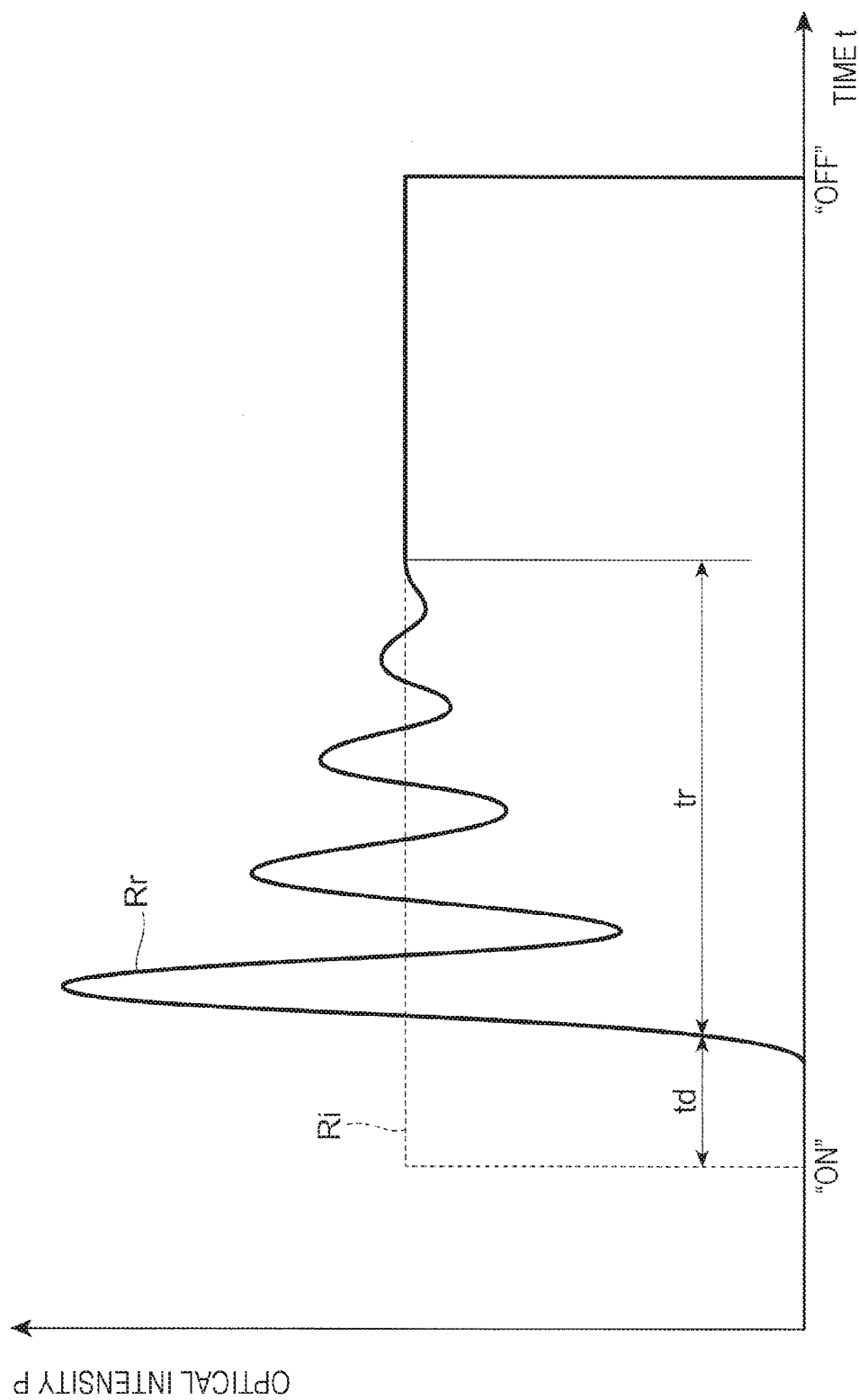
FIG. 17 illustrates changes in the optical intensity of a laser diode with time.

FIG. 17 illustrates changes in the optical intensity P of the laser diode LD with time. The vertical axis represents optical intensity P, and the horizontal axis represents time t.

Suppose that voltage is applied to the laser diode LD at the "On" timing along time t, and the application of voltage to the laser diode LD is stopped at the "Off" timing. At this time, an ideal response waveform Ri is such that a predetermined optical intensity P is maintained from the "On" timing to the "Off" timing.

Factors such as an oscillation delay or relaxation oscillation occurring at the "On" timing tend to give rise to, for example, fluctuations (variations) in optical intensity P or fluctuations (variations) in the amount of light (radiant energy) obtained in the period of time from the "On" timing to the "Off" timing. Consequently, such oscillation delay, relaxation oscillation, or other factors make it difficult to shorten the interval of time between the "On" timing and the "Off" timing. In other words, it is difficult to perform high speed optical switching.

In actuality, there is an oscillation delay time td between the "On" timing and the start of oscillation of the laser diode LD. Even after oscillation begins, relaxation oscillation that causes fluctuations in optical intensity P occurs (see a relaxation oscillation waveform Rr). The relaxation oscillation continues for a relaxation oscillation duration tr.

For example, the sum of the oscillation delay time td and the relaxation oscillation duration tr equals approximately five nsec.

Once the relaxation oscillation duration tr elapses, however, the fluctuations in optical intensity P represented by the relaxation oscillation waveform Rr subside. Thereafter, the optical intensity P is set by the current passed through the laser diode LD.

Accordingly, in the third exemplary embodiment, the lighting signal ϕI is supplied in two steps. That is, with the optical intensity P represented by a level "0/1", before the time at which a transition to the optical intensity P corresponding to a level "1" (ON state of level "1") occurs, a period of low optical intensity P regarded as (corresponding to) level "0" (ON state of level "0") is provided. The optical intensity P at level "0" represents the optical intensity when the laser diode LD is in its OFF state. The optical intensity P at level "1" represents the optical intensity at which light is desired to be emitted.

Instead of being a binary value of "0/1", the level of optical intensity may be multivalued including a level "m: m is an integer equal to or greater than 1" and a level "0". In the following, assuming that level "1" includes level "m", a description will be given using level "0" and level "1". A level may be referred to as logical value.

Figure 18A:
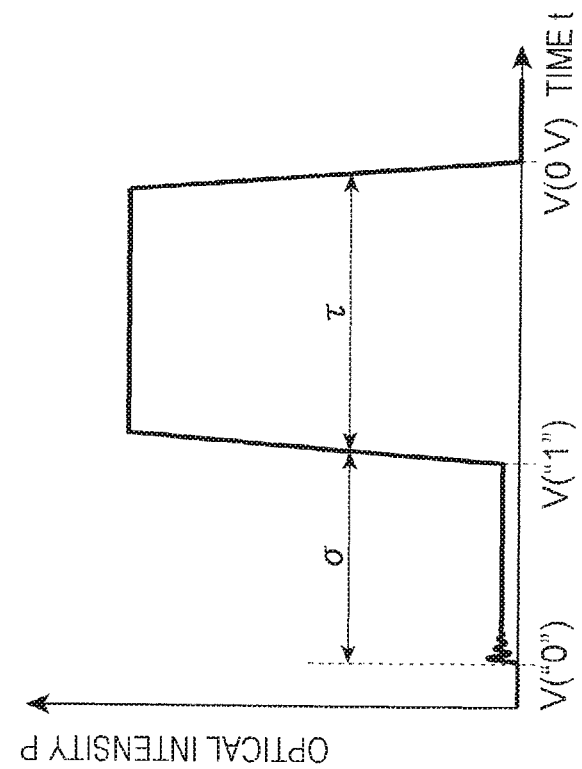
Figure 18B:
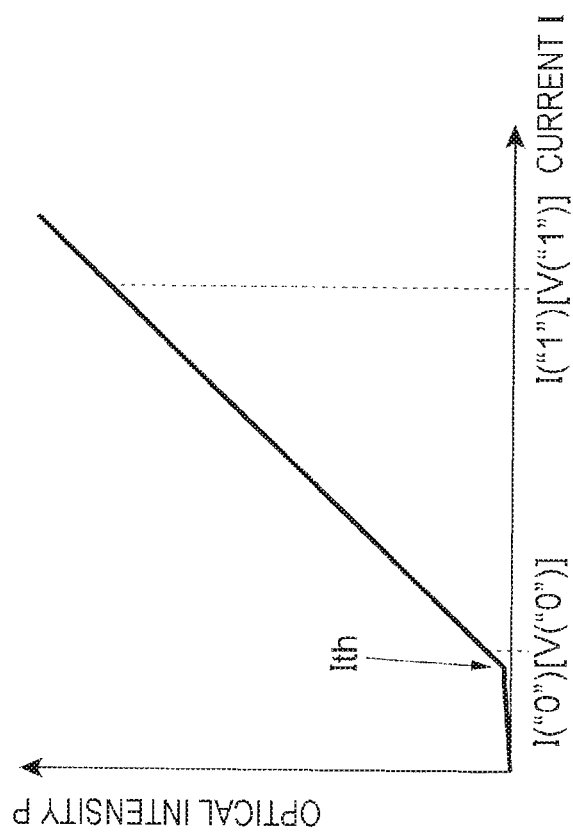

FIGS. 18A and 18B illustrate the optical intensity P of the laser diode LD. FIG. 18A illustrates optical intensity P with respect to current I, and FIG. 18B illustrates changes in optical intensity P with respect to time t.

As illustrated in FIG. 18A, the laser diode LD starts to oscillate once the current I exceeds a threshold current Ith. Accordingly, it is assumed that the following currents are supplied: a current I ("0") equal to or higher than the threshold current Ith and at which the optical intensity P is regarded as level "0", and a current I ("1") corresponding to the optical intensity P at level "1". It is assumed that the voltage applied to the laser diode LD to supply the current I ("0") is V ("0"), and the voltage applied to the laser diode LD to supply the current I ("1") is V ("1"). For example, V ("0") is set to 1.5 V, and V ("1") is set to 1.7 V.

As illustrated in FIG. 18B, first, the voltage applied to the laser diode LD is set to V ("0"), and the laser diode LD is made to light up (oscillate) in the ON state of level "0". An oscillation delay or relaxation oscillation is allowed to occur in this state. Thereafter, the voltage applied to the laser diode LD is set to V ("1"), causing the laser diode LD to switch to the ON state of level "1". Then, the voltage applied to the laser diode LD is set to 0 V ("H") to turn OFF the laser diode LD.

When the voltage V ("1") is applied to the laser diode LD on which V ("0") has been applied, the laser diode LD immediately goes to the ON state of level "1". During the period of level "1" (period τ in FIG. 18B), the laser diode LD is not subject to the influence of an oscillation delay or relaxation oscillation. Such an oscillation delay or relaxation oscillation is absorbed in a period σ preceding the period τ and representing the ON state of level "0".

Like the laser generating unit 6 according to the first exemplary embodiment, the laser generating unit 6 according to the third exemplary embodiment includes the laser component C including the laser diodes LD arranged to form a light emitting device array, and the control unit 10 that controls the laser component C. The configuration of the third exemplary embodiment is otherwise the same as that of the first exemplary embodiment, and thus differences from the first exemplary embodiment will be described below.

Figure 19:
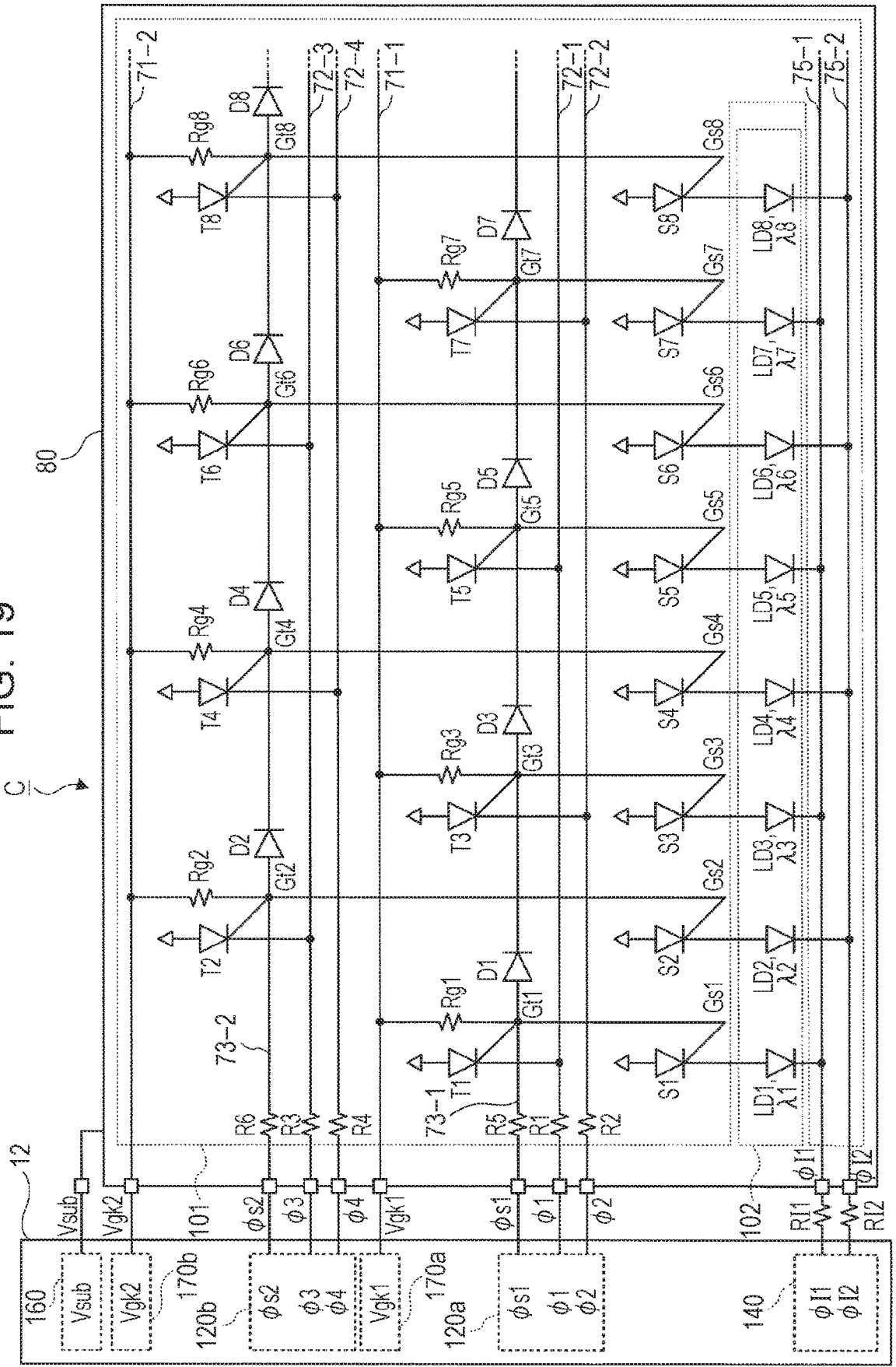
FIG. 19 is an equivalent circuit diagram of a laser component, and illustrates a signal output unit that outputs signals such as signals used to drive the laser component.

FIG. 19 is an equivalent circuit diagram of the laser component C, and illustrates the signal output unit 12 that outputs signals such as signals used to drive the laser component C. It is to be noted that the laser component C and the signal output unit 12 are complex in configuration in comparison to the signal output unit 12 according to the first exemplary embodiment illustrated in FIG. 5.

Signal Output Unit 12

The signal output unit 12 includes transfer signal generating units 120a and 120b that generate signals for sequentially setting the transfer thyristors T to the ON state, the lighting signal generating unit 140 that generates signals for causing the laser diodes LD to light up, the reference-potential supply unit 160 that supplies the reference potential Vsub, and power-supply-potential supply units 170a and 170b that respectively supply power supply potentials Vgk1 and Vgk2 that are required for driving.

The transfer signal generating unit 120a generates the transfer signals φ1 and φ2 and a start signal φs1, and the transfer signal generating unit 120b generates transfer signals φ3 and φ4 and a start signal φs2. For the ease of illustration, FIG. 19 depicts the transfer signal generating unit 120a and the transfer signal generating unit 120b separately. The transfer signal generating units 120a and 120b will be sometimes referred to as transfer signal generating unit 120 when not distinguished from each other. The transfer signals φ1 to φ4 will be sometimes referred to as transfer signal φI when not distinguished from each other.

The lighting signal generating unit 140 supplies lighting signals φI1 and φI2 (to be referred to as lighting signal φI when not distinguished from each other).

The power-supply-potential supply unit 170a supplies the power supply potential Vgk1, and the power-supply-potential supply unit 170b supplies the power supply potential Vgk2. For the ease of illustration, FIG. 19 depicts the power-supply-potential supply unit 170a and the power-supply-potential supply unit 170b separately. The power-supply-potential supply units 170a and 170b will be sometimes referred to as power-supply-potential supply unit 170 when not distinguished from each other. The power supply potentials Vgk1 and Vgk2 will be sometimes referred to as Vgk when not distinguished from each other.

Laser Component C

Like the laser component C according to the first exemplary embodiment, the laser component C includes the laser diodes LD1, LD2, LD3, and so on, the setting thyristor S1, S2, S3, and so on, the transfer thyristors T1 and T2, T3, and so on, the coupling diodes D1, D2, D3, and so on, and the power line resistors Rg1, Rg2, Rg3, and so on. FIG. 19 illustrates the portion of the laser component C related to the laser diodes LD1 to LD8.

With each two of the odd-numbered transfer thyristors T1, T3, T5, and so on paired in numerical order, each of the odd-numbered coupling diodes D1, D3, D5, and so on is located between each two paired transfer thyristors T. With each two of the even-numbered transfer thyristors T2, T4, T6, and so on paired in numerical order, each of the even-numbered coupling diodes D2, D4, D6, and so on is located between each two paired transfer thyristors T. The number of coupling diodes D is, for example, 133 assuming that the number of laser diodes LD is 135.

The laser component C includes the current-limiting resistors R1 to R4. The current-limiting resistors R1 to R4 are respectively disposed in transfer signal lines 72-1 to 72-4 (to be referred to as transfer signal line 72 when not distinguished from each other) on which the transfer signals φ1 to φ4 described later are transmitted, to prevent excessive current from flowing through the transfer signal lines 72-1 to 72-4. Further, the laser component C includes the current-limiting resistors R5 and R6. The current-limiting resistors R5 and R6 are respectively disposed in start signal lines 73-1 and 73-2 (to be referred to as start signal line 73 when not distinguished from each other) on which the start signal φs1 and φs2 are transmitted, to prevent excessive current from flowing through the start signal lines 73-1 and 73-2. The current-limiting resistors R1 to R6 will be sometime referred to as current-limiting resistor R.

In this case, components such as the transfer thyristors T1 and T2, T3, and so on, the setting thyristor S1, S2, S3, and so on, the power line resistor Rg1, Rg2, Rg3, and so on, the coupling diodes D1, D2, D3, and so on, the multiple current-limiting resistors R1 to R6, the transfer signal lines 72-1 to 72-4, the start signal lines 73-1 and 73-2, and lighting signal lines 75-1 and 75-2 that will be described later constitute the driving unit 101, and the light emitting device (laser device) array made up of the laser diodes LD1, LD2, LD3, and so on constitutes the light emitting unit 102.

Next, electrical connection of various elements in the laser component C will be described.

The respective anodes of the transfer thyristor T and the setting thyristor S are connected to the substrate 80 of the laser component C (anode-common configuration).

These anodes are supplied with the reference potential Vsub from the reference-potential supply unit 160 via the back electrode 91 (see FIG. 6B described above with reference to the first exemplary embodiment), which is a Vsub terminal disposed on the back of the substrate 80.

This connection represents an example of configuration when the substrate 80 is a p-type substrate. The polarity is reversed if an n-type substrate is used. If an intrinsic (i-type) substrate with no impurity doped is to be used, the terminal to be connected to the reference potential Vsub is disposed at the side of the substrate 80 where the driving unit 101 and the light emitting unit 102 are located.

The anode of the laser diode LD is connected to the cathode of the same-numbered setting thyristor S.

The gate Gs of the setting thyristor S is connected to the gate Gt of the same-numbered transfer thyristor T.

Let n (n is an integer equal to or greater than 1) be a number representing the transfer thyristor T among the odd-numbered transfer thyristors T1, T3, T5, T7, and so on along the array of the transfer thyristors T. In this case, the cathodes of the transfer thyristors T that are numbered 1+4×(n−1) (the transfer thyristors T1, T5, and so on in FIG. 19) are connected to the transfer signal line 72-1. The transfer signal line 72-1 is connected to the φ1 terminal via the current-limiting resistor R1. The transfer signal φ1 is transmitted to the φ1 terminal from the transfer signal generating unit 120a.

Among the odd-numbered transfer thyristors T1, T3, T5, T7, and so on, the cathodes of the transfer thyristors T that are numbered 3+4×(n−1) (the transfer thyristors T3, T7, and so on in FIG. 19) are connected to the transfer signal line 72-2. The transfer signal line 72-2 is connected to the φ2 terminal via the current-limiting resistor R2. The transfer signal φ2 is transmitted to the φ2 terminal from the transfer signal generating unit 120a.

The gates Gt of the transfer thyristors T that are numbered 1+4×(n−1) (the transfer thyristors T1, T5, and so on in FIG. 19) are connected to the anodes of the same-numbered coupling diodes D. The cathodes of these coupling diodes D are connected to the gates Gt of the transfer thyristors T that are numbered 3+4×(n−1) (the transfer thyristors T3, T7, and so on in FIG. 19).

The anode of the gate Gt1 is connected to the φs1 terminal via the current-limiting resistor R5. The start signal φs1 is transmitted to the φs1 terminal from the transfer signal generating unit 120a.

Let n (n is an integer equal to or greater than 1) be a number representing the transfer thyristor T among the even-numbered transfer thyristors T2, T4, T6, T8, and so on along the array of the transfer thyristors T. In this case, the cathodes of the transfer thyristors T that are numbered 2+4×(n−1) (the transfer thyristors T2, T6, and so on in FIG. 19) are connected to the transfer signal line 72-3. The transfer signal line 72-3 is connected to a φ3 terminal via the current-limiting resistor R3. The transfer signal φ3 is transmitted to the φ3 terminal from the transfer signal generating unit 120b.

Among the even-numbered transfer thyristors T2, T4, T6, T8, and so on, the cathodes of the transfer thyristors T that are numbered 4+4×(n−1) (the transfer thyristors T4, T8, and so on in FIG. 19) are connected to the transfer signal line 72-4. The transfer signal line 72-4 is connected to a φ4 terminal via the current-limiting resistor R4. The transfer signal φ4 is transmitted to the φ4 terminal from the transfer signal generating unit 120b.

The gates Gt of the transfer thyristors T that are numbered 2+4×(n−1) (the transfer thyristors T2, T6, and so on in FIG. 19) are connected to the anodes of the same-numbered coupling diodes D. The cathodes of these coupling diodes D are connected to the gates Gt of the transfer thyristors T that are numbered 4+4×(n−1) (the transfer thyristors T4, T8, and so on in FIG. 19).

The anode of the gate Gt2 is connected to the φs2 terminal via the current-limiting resistor R6. The start signal φs2 is transmitted to the φs2 terminal from the transfer signal generating unit 120b.

The respective gates Gt1, Gt3, Gt5, Gt7, and so on of the odd-numbered transfer thyristors T1, T3, T5, T7, and so on are connected to the power supply line 71-1 via the same-numbered power line resistors Rg. The power supply line 71-1 is connected to the Vgk1 terminal. The power supply potential Vgk1 is supplied to the Vgk1 terminal from the power-supply-potential supply unit 170a.

The respective gates Gt2, Gt4, Gt6, Gt8, and so on of the even-numbered transfer thyristors T2, T4, T6, T8, and so on are connected to the power supply line 71-2 via the same-numbered power line resistors Rg. The power supply line 71-2 is connected to the Vgk2 terminal. The power supply potential Vgk2 is supplied to the Vgk2 terminal from the power-supply-potential supply unit 170b.

The cathodes of the odd-numbered laser diodes LD1, LD3, LD5, LD7, and so on are connected to a φI1 terminal via the lighting signal line 75-1. The lighting signal φI1 is transmitted to the φI1 terminal from the lighting signal generating unit 140 via a current-limiting resistor RI1 disposed outside the laser component C.

The cathodes of the even-numbered laser diodes LD2, LD4, LD6, LD8, and so on are connected to a 412 terminal via the lighting signal line 75-2. The lighting signal φI2 is transmitted to the φI2 terminal from the lighting signal generating unit 140 via a current-limiting resistor RI2 disposed outside the laser component C.

The lighting signal lines 75-1 and 75-2 will be referred to as lighting signal line 75 when not distinguished from each other.

The current-limiting resistors RI1 and RI2 may be disposed inside the laser component C. The current-limiting resistors RI1 and RI2 will be sometimes referred to as current-limiting resistor RI.

As described above, with the laser component C according to the third exemplary embodiment, the set of odd-numbered laser diodes LD1, LD3, LD5, and so on (the set of odd-numbered laser diodes LD), and the set of even-numbered laser diodes LD2, LD4, LD6, and so on (the set of even-numbered laser diodes LD) are constructed independently and combined in the numerical order of the laser diodes LD.

The plan layout and cross-sectional structure of the laser component C according to the third exemplary embodiment may be those obtained by partially modifying the laser component C according to the first exemplary embodiment illustrated in FIGS. 6A and 6B. Accordingly, this will not be described further in detail.

Operation of Laser Generator 6

Timing Chart

Figure 20:
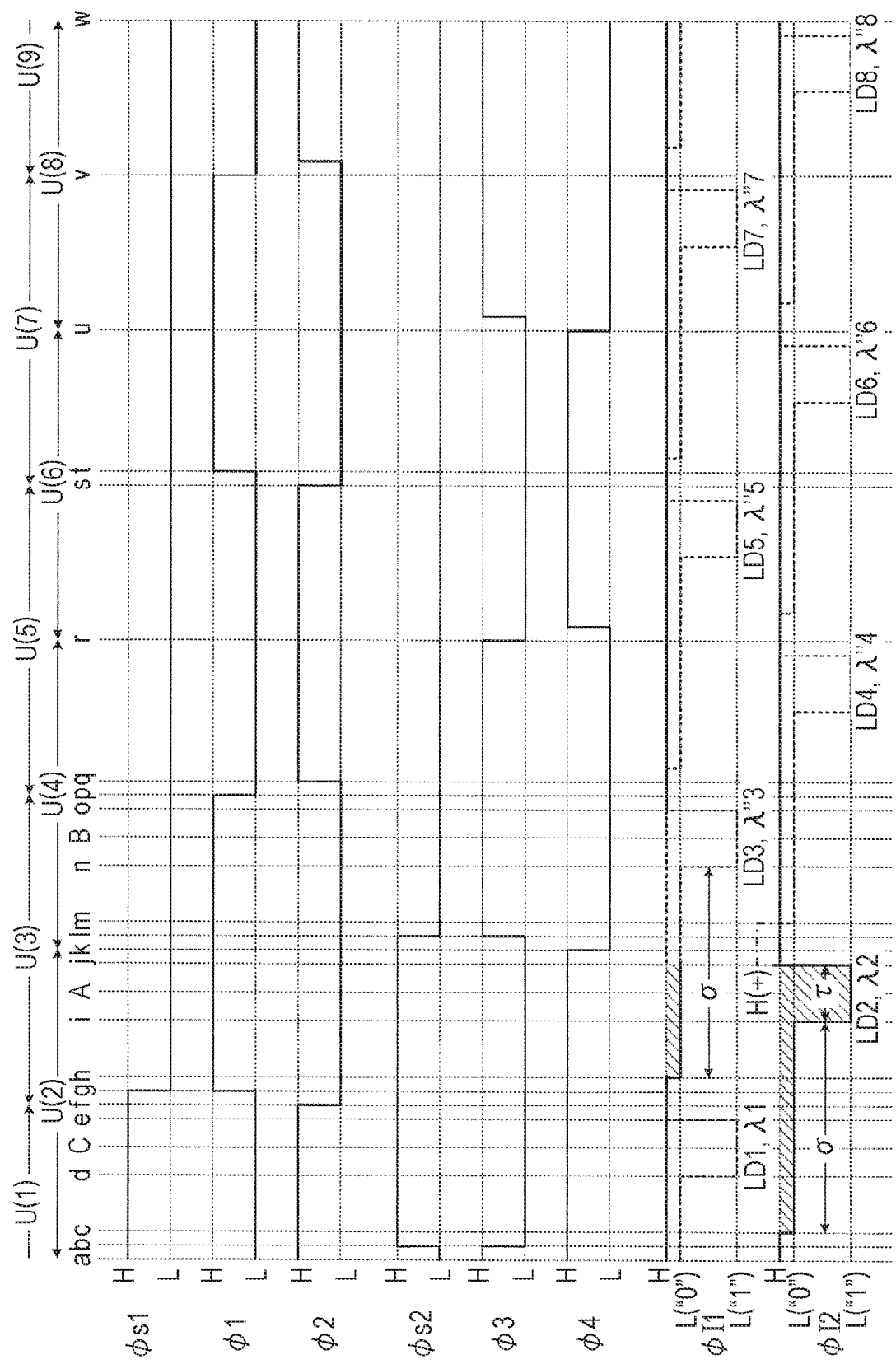
FIG. 20 is a timing chart illustrating the operation of a laser generating unit according to a third second exemplary embodiment.

FIG. 20 is a timing chart illustrating the operation of the laser generating unit 6 according to the third exemplary embodiment.

The timing chart illustrated in FIG. 20 represents control of the lighting (to be referred to as lighting control) of eight laser diodes, the laser diodes LD1 to LD8, of the laser component C. It is assumed in FIG. 20 that the laser diode LD2 is to be lit when the environmental temperature T is the reference environmental temperature $T_0$. That is, it is assumed that the wavelength λ2 emitted by the laser diode LD2 lies in the central portion of the wavelength channel ch of wavelength Λ to which the laser component C belongs.

Thus, the laser diode LD1 and the laser diodes LD3, LD4, LD5, and so on are not lit up.

Now, suppose that the environmental temperature T has fallen to the environmental temperature $T_1$ ($T_1 < T_0$). Then, the wavelengths λ1 to λ8 of the laser diodes LD1 to LD8 are respectively displaced (shifted) to shorter wavelengths λ"1 to λ"8. Then, conversely to FIG. 4B, the wavelength λ"2 of the laser diode LD2 is displaced (shifted) toward the shorter-wavelength end of the wavelength channel ch. Meanwhile, the wavelength λ"3 of the laser diode LD3 enters (shifts to) the central portion of the wavelength channel ch. Accordingly, the laser diode LD to be lit is switched from the laser diode LD2 to the laser diode LD3.

Conversely, suppose that the environmental temperature T has risen to the environmental temperature $T_2$ ($T_2>T_0$). Then, the wavelengths $\lambda 1$ to $\lambda 8$ of the laser diodes LD1 to LD8 are respectively displaced (shifted) to longer wavelengths $\lambda'1$ to $\lambda'8$. Then, similarly as described above with reference to FIG. 4B, the wavelength $\lambda'2$ of the laser diode LD2 is shifted toward the longer-wavelength end of the wavelength channel ch. Meanwhile, the wavelength $\lambda'1$ of the laser diode LD1 is shifted toward the central portion of the wavelength channel ch. Accordingly, the laser diode LD to be lit is switched from the laser diode LD2 to the laser diode LD1.

It is assumed that in FIG. 20, time passes in alphabetical order from time a to time w. The laser diode LD1 is lighting-controlled in the period U(1) (from time a to time f), the laser diode LD2 is lighting-controlled in the period U(2) (from time a to time k), and the laser diode LD3 is lighting-controlled in the period U(3) (from time f to time p). The laser diodes LD that are numbered 4 or higher are subsequently lighting-controlled in the same manner. The period U(1) represents the period for activating the laser component C, and differs from the other periods. It is assumed that the periods U(2), U(3), U(4), and so on are of the same length, and will be referred to as period U when not distinguished from each other.

For example, the period from time e to time k in the latter half of the period U(2), which is a period for performing lighting-control of the laser diode LD2, overlaps the first half of the period U(3), which is a period for performing lighting control of the laser diode LD3. That is, the period U for performing lighting-control of the set of odd-numbered laser diodes LD, and the period U for performing lighting-control of the set of even-numbered laser diodes LD are shifted relative to each other by ½ of the period U.

The transfer signals φ1 to φ4 respectively transmitted to the φ1 to φ4 terminals, and the start signals φs1 and φs2 respectively transmitted to the φ1s and φs2 terminals each have two levels of potentials, "H" (0 V) and "L" (−3.3 V).

The start signal φs1 causes propagation of the ON state to be started for the odd-numbered transfer thyristors T. Likewise, the start signal φs2 causes propagation of the ON state to be started for the even-numbered transfer thyristors T.

The start signal φs1 is "H" at time a, shifts from "H" to "L" at time g, and then maintains its "L" level.

The start signal φs2 is "L" at time a, and shifts from "L" to "H" at time b. Then, the start signal φs2 shifts from "H" to "L" at time l, and thereafter maintains its "L" level.

Each of the transfer signals φ1 to φ4 repeats its waveform every two consecutive periods U (e.g., the period U(3) and the period U(5), or the period U(2) and the period U(4)).

The transfer signal φ1 is "L" at time a, and shifts from "L" to "H" at time g. Then, the transfer signal φ1 shifts from "H" to "L" at time p, and shifts from "L" to "H" at time t. The same is repeated thereafter. That is, the period U(3) that begins at time f and the period U(4) that ends at time r represents one repetition cycle.

The transfer signal φ2 is "H" at time a, and shifts from "H" to "L" at time f. Then, the transfer signal φ2 shifts from "L" to "H" at time q, and shifts from "H" to "L" at time s. The same is repeated thereafter. That is, the period U(1) that begins at time a and the period U(3) that ends at time p represents one repetition cycle.

The transfer signal φ2 has a waveform that is shifted by the period U relative to the repeated waveform of the transfer signal φ1.

The transfer signal φ3 has a waveform shifted by ½ of the period U relative to that of the transfer signal φ1. The transfer signal φ4 has a waveform shifted by ½ of the period U relative to that of the transfer signal φ2.

The lighting signals φI1 and φI2 each have at least the following three levels of potentials: "H" (0 V), "L ("0")", and "L ("1")". For example, "L ("0")" is −4.8 V, which is the sum of V ("0") of −1.5 V that causes the laser diode LD to turn to the ON state of level "0" and −3.3 V that is applied to the setting thyristor S. Further, "L ("1")" is −5.0 V, which is the sum of V ("1") of −1.7 V that causes the laser diode LD to turn to the ON state of level "1" and −3.3 V that is applied to the setting thyristor S. To indicate the difference in optical intensity, in FIG. 20, the voltages of the lighting signals φI1 and φI2 are not illustrated based on their proportional relationship.

The lighting signal φI2 will be described with reference to the period U(2) in which the laser diode LD2 is lit up. The lighting signal φI2 is "H" at time a. Then, the lighting signal 412 shifts from "H" to "L ("0")" at time c. Then, the lighting signal 412 shifts from "L ("0")" to "L ("1")" at time i, and shifts from "L ("1")" to "H" at time j. Then, the lighting signal φI2 maintains its "H" level at time k.

To light up the other laser diodes LD, the above-mentioned timing may be shifted by the period U. The lighting signal φI1 represents a waveform shifted relative to the lighting signal φI2 by ½ of the period U. The period from time c to time i corresponds to the period 6 representing the ON state of level "0", and the period from time i to time j corresponds to the period t representing the ON state of level "1".

As will be described later, a period "H (+)" of a positive (+) potential may be provided instead of the period of "H" (0 V).

Next, the lighting control of the laser diodes LD will be described with reference to FIG. 20 taken together with FIG. 19. In FIG. 20, the ON state (each of the ON state of level "0" and the ON state of level "1") of the laser diode LD is indicated by diagonal lines.

First, the lighting control of the set of odd-numbered laser diodes LD will be described.

Time a

At time a, when the start signal φs1 is "H", the gate Gt1 of the transfer thyristor T1 goes to "H" (0 V). As described above, the threshold voltage of a thyristor is equal to the potential at the gate minus the forward potential Vd (1.5 V) of the p-n junction. Thus, the threshold voltage of the transfer thyristor T1 becomes −1.5 V.

The gate Gt3 of the transfer thyristor T3 turns to −1.5 V via the coupling diode D1. This causes the threshold voltage of the transfer thyristor T3 to become −3.0 V. The gate Gt5 of the transfer thyristor T5 goes to −3 V via the coupling diode D3. This causes the threshold voltage of the transfer thyristor T5 to become −4.5 V. Each of the transfer thyristors T numbered 7 or higher has its gate Gt set to "L (−3.3 V)", which is the power supply potential Vgk1, via the corresponding power line resistor Rg, and thus has a threshold voltage of −4.8 V.

At this time, the transfer signal φ1 is "L" (−3.3 V), which is larger in absolute value than the threshold voltage (−1.5 V) of the transfer thyristor T1. Thus, the transfer thyristor T1 turns ON, and the gate Gt1 is maintained at "H" (0 V). Thyristors to which the transfer signal φ1 is transmitted, such as the transfer thyristor T5, have a threshold voltage (−4.5 V) that is larger in absolute value than the "L" (−3.3 V) level of the transfer signal φ1. Thus, these thyristors do not turn ON.

Meanwhile, since the transfer signal ϕ2 is "H" (0 V), the cathode and anode (the substrate 80) of each of the transfer thyristors T3, T7, and so on both become "H" (0 V), and thus these transfer thyristors do not turn ON.

Since the gate Gs1 of the setting thyristor S is connected to the gate Gt1, when the gate Gt1 goes to "H" (0 V), the gate Gs1 goes to "H" (0 V). Thus, the threshold voltage of the setting thyristor S becomes −1.5 V, causing the setting thyristor S to be set to the turn-ON-enabled state.

Time a is the timing to shift the lighting signal ϕI1 from "H" to "L ("0")" for cases where the laser diode LD1 is to be lit. Since the laser diode LD1 is not to be lit in this case as described above, the lighting signal ϕI1 is "H" at time a. Thus, the laser diode LD1 is in its OFF state.

Time d

Times b and c are not related to the odd-numbered laser diodes LD.

Time d is the timing to shift the lighting signal ϕI1 from "L ("0")" to "L ("1")" (−5.0 V) for cases where the laser diode LD1 is to be lit. Since the laser diode LD1 is not to be lit in this case, the lighting signal ϕI1 is "H" (0 V) at time d.

Thus, the laser diode LD1 is in its OFF state.

Time e

Time e is the timing to shift the lighting signal ϕI1 from "L ("1")" to "H" (0 V)" for cases where the laser diode LD1 is to be lit. Since the laser diode LD1 is not to be lit in this case, the lighting signal ϕI1 is "H" (0 V) at time e.

Time f

At time f, as the transfer signal ϕ2 is shifted from "H" (0 V) to "L" (−3.3 V), the transfer thyristor T3 having a threshold voltage set to −3.0 V turns ON. Then, the gate Gt2 is set to 0 V. This causes the gate Gs3 of the setting thyristor S3 to become 0 V. Then, the threshold voltage of the setting thyristor S3 becomes −1.5 V, causing the setting thyristor S3 to be set to the turn-ON-enabled state.

Further, the gate Gt5 of the transfer thyristor T5 goes to −1.5 V via the coupling diode D3. Thus, the threshold voltage of the transfer thyristor T5 becomes −3 V.

At this time, the lighting signal ϕI1 is "H". Thus, the setting thyristor S3 does not turn ON, and the laser diode LD3 does not light up.

At this time, the transfer thyristors T1 and T3 are both in their ON state.

Time g

At time g, the start signal ϕs1 is shifted from "H" to "L", and the transfer signal ϕ1 is shifted from "L" to "H".

Then, the anode and cathode of the transfer thyristor T1 both become "H", causing the transfer thyristor T1 to turn OFF. Further, the gate Gt1 goes to "L" (−3.3 V), and the threshold voltage of the transfer thyristor T1 becomes −4.8 V.

That is, the transfer thyristor T1 goes to the OFF state, and thus the ON state is transferred (propagated) from the transfer thyristor T1 to the transfer thyristor T3.

Time h

At time h, as the lighting signal ϕI1 shifts from "H" to "L ("0")", the setting thyristor S3 turns ON, and the laser diode LD3 goes to the ON state of level "0". By turning the laser diode LD3 to the ON state of level "0", an oscillation delay and relaxation oscillation are caused to occur in the laser diode LD3 first so that a steady state is subsequently achieved.

Time A

Time i is not related to the odd-numbered laser diodes LD.

At time A, the laser diode LD2 is in the ON (lit) state as will be described later, and this state is maintained. Thus, the states of the transfer signals ϕ1 and ϕ2 and the lighting signal ϕI1 at this timing are maintained.

The reason for setting the laser diode LD3 to the ON state of level "0" is to prepare for a case where, due to a change in environmental temperature T, the laser diode LD2 is extinguished and the laser diode LD3 is lit up.

Next, the lighting control of the even-numbered laser diodes LD will be described.

Time a

At time a, the start signal ϕs2 is "L", the transfer signal ϕ3 is "H", and the transfer signal ϕ4 is "H". At this time, as can be appreciated from FIG. 19, the gate Gt2 of the transfer thyristor T2 is "L" (−3.3 V), and thus threshold voltage of the transfer thyristor T2 is −4.8 V. Likewise, the gate Gt2 of the setting thyristor S2 is also "L" (−3.3 V), and the threshold voltage of the setting thyristor S2 is −4.8 V.

Since the transfer signal ϕ3 is "H", the cathode and anode (the substrate 80) of the transfer thyristor T3, to which the transfer signal ϕ3 is supplied, are both "H" (0 V), and thus the transfer thyristor T3 is in its OFF state.

Since the lighting signal ϕI2 is "H" (0 V), the setting thyristor S3 and the laser diode LD3 are in their OFF state.

The operations of the other thyristors (the transfer thyristors T and the setting thyristors S) not related to the laser diode LD of interest, and the laser diodes LD other than the laser diode LD of interest are the same as that described above with reference to the odd-numbered laser diodes LD, and thus will not be described further in detail.

Time b

When the start signal ϕs2 goes from "L" to "H", the gate Gt2 of the transfer thyristor T2 and the gate Gs2 of the setting thyristor S2 both go to "H" (0 V), and the threshold voltage of the transfer thyristor T2 and the setting thyristor S2 becomes −1.5 V.

Then, the transfer signal ϕ3 supplied to the cathode of the transfer thyristor T2 shifts from "H" to "L" (−3.3 V), and the transfer thyristor T2 thus turns ON.

Since the lighting signal ϕI2 is maintained at the "H" level, the setting thyristor S2 does not turn ON, and the laser diode LD2 is also in its OFF state.

Time c

Time c is the timing to shift the lighting signal ϕI2 from "H" to "L ("0")" to light the laser diode LD2. When the lighting signal 412 shifts from "H" to "L ("0")", the setting thyristor S2 turns ON, and the laser diode LD2 goes to the ON state of level "0".

Time i

Times d to h are not related to the lighting control of the even-numbered laser diodes LD.

Time i is the timing to shift the lighting signal 412 from "L ("0")" to "L ("1")" to light the laser diode LD2. When the lighting signal 412 goes from "L ("0")" to "L ("1")", the laser diode LD2 goes to the ON (lit) state of level "1".

Time A

Time A is the timing at which the laser diode LD2 is lit up and maintained in that state. Thus, the states of the transfer signals ϕ3 and ϕ4 and the lighting signal ϕI2 at this timing are maintained.

Now, suppose that the environmental temperature T has fallen to the environmental temperature $T_1$ ($T_1 < T_0$). As described above, the laser diode LD to be lit is switched from the laser diode LD2 to the laser diode LD3 at this time. The following describes a method for switching from the laser diode LD2 to the laser diode LD3.

First, the lighting control of the odd-numbered laser diodes LD will be described.

Time n

Times j, k, l, and m are not related to the lighting control of the odd-numbered laser diodes LD.

Time n is the timing to shift the lighting signal ϕI1 from "L ("0")" to "L ("1")" to light the laser diode LD3. When the lighting signal ϕI1 goes from "L ("0")" to "L ("1")", the laser diode LD3 goes to the ON (lit) state of level "1".

Time B

Time B is the timing at which the laser diode LD3 is lit up and maintained in that state. Thus, the states of the transfer signals ϕ1 and ϕ2 and the lighting signal ϕI1 at this timing are maintained.

Next, the lighting control of the even-numbered laser diodes LD will be described.

Time j

At time j, as the lighting signal 412 is shifted from "L ("1")" to "H" (0 V), the cathode of the laser diode LD2 and the anode (the substrate 80) of the setting thyristor S2 both go to "H" (0 V). Thus, the setting thyristor S2 turns OFF, and the laser diode LD2 goes to the OFF state and is extinguished.

At this time, the lighting signal ϕI2 may be set to a potential ("H (+)" indicated by a broken line for the lighting signal 412 in FIG. 20) that lies on the positive side with respect to "H" (0 V). By setting the lighting signal ϕI2 to the potential that is on the positive side, the electrons (carriers) are pulled away from each of the n-gate layer 82 and the p-gate layer 83 of the setting thyristor S, enabling faster extinguishing of the laser diode LD2.

Time k

At time k, as the transfer signal ϕ4 is shifted from "H" (0 V) to "L" (−3.3 V), in the same manner as with the transfer thyristor T3 at time f, the transfer thyristor T4 having a threshold voltage of −3.0 V turns ON. Then, the gate Gt4 is set to 0 V. This causes the gate Gs4 of the setting thyristor S4 to become 0 V. Then, the threshold voltage of the setting thyristor S4 becomes −1.5 V, causing the setting thyristor S4 to be set to the turn-ON-enabled state.

Further, the gate Gt6 of the transfer thyristor T6 goes to −1.5 V via the coupling diode D4. Thus, the threshold voltage of the transfer thyristor T6 becomes −3 V.

At this time, the lighting signal 412 is "H". Thus, the setting thyristor S4 does not turn ON, and the laser diode LD4 does not light up.

At this time, the transfer thyristors T2 and T4 both turn to their ON state.

Time l

At time l, the start signal ϕs2 is shifted from "H" to "L", and the transfer signal ϕ3 is shifted from "L" to "H".

Then, in the same manner as with the transfer thyristor T1 at time g, the cathode and anode of the transfer thyristor T2 both become "H", causing the transfer thyristor T2 to turn OFF.

That is, the transfer thyristor T2 goes to the OFF state, and thus the ON state is transferred (propagated) from the transfer thyristor T2 to the transfer thyristor T4.

Time m

At time m, as the lighting signal ϕI2 shifts from "H" to "L ("0")", in the same manner as with the setting thyristor S3 and the laser diode LD3 at time h, the setting thyristor S4 turns ON, and the laser diode LD4 goes to the ON state of level "0". By turning the laser diode LD4 to the ON state of level "0", an oscillation delay and relaxation oscillation are caused to occur in the laser diode LD4 first so that a steady state is subsequently achieved.

Time B

Time n is not related to the even-numbered laser diodes LD.

As described above, time B is the timing at which the laser diode LD3 is lit up and maintained in that state. Thus, the states of the transfer signals ϕ3 and ϕ4 and the lighting signal ϕI2 at this timing are maintained.

The reason for setting the laser diode LD4 to the ON state of level "0" is to prepare for a case where, due to a change in environmental temperature T, the laser diode LD3 is extinguished and the laser diode LD4 is lit up.

If the laser diodes LD are to be sequentially switched in increasing order of their emission wavelengths λ at the reference environmental temperature $T_0$, the laser diodes LD may be switched in their numerical order as described above.

Next, suppose that the environmental temperature T has risen to the environmental temperature $T_2$ ($T_2>T_0$). As described above, the laser diode LD to be lit is switched from the laser diode LD2 to the laser diode LD1 at this time. This may be accomplished by using the transfer signals ϕ1, ϕ2, ϕ3, and ϕ4 to transfer the lighting-enabled state down to the laser diode LD135, followed by sequentially bringing the laser diodes LD into the lighting-enabled state again beginning with the laser diode LD1 and then lighting the laser diode LD1. Alternatively, this may be accomplished by setting all the signals (the transfer signals ϕ1, ϕ2, ϕ3, and ϕ4, the start signals ϕs1 and ϕs2, and the lighting signals ϕI1 and ϕI2) to "H" (0 V) to initialize the laser component C, followed by sequentially bringing the laser diodes LD into the lighting-enabled state beginning with the laser diode LD1 and then lighting the laser diode LD1.

Then, the transfer signals ϕ1 ϕ2, ϕ3, and ϕ4, the start signals ϕs1 and ϕs2, and the lighting signals ϕI1 and ϕI2 may be maintained in the state at time C.

As described above, the gate terminals Gt of the transfer thyristors T are connected to each other via the corresponding coupling diodes D. Thus, a change in the potential of a given gate Gt causes a change in the potential of the gate Gt that is connected via the coupling diode D that is in forward biased condition to the gate Gt whose potential has changed. This in turn causes a change in the threshold voltage of the transfer thyristor T having the gate whose potential has changed. When the threshold voltage of the transfer thyristor T has a value higher than (a negative value smaller in absolute value than) the power supply potential Vgk1 or Vgk2 ("L" (−3.3 V)), the transfer thyristor T turns ON at the timing when the corresponding transfer signals ϕ (the transfer signals ϕ1 to ϕ4) shift from "H" (0 V) to "L" (−3.3 V).

At this time, the threshold voltage is −1.5 V for the setting thyristor S whose gate Gs is connected to the gate Gt of the transfer thyristor T that is in the ON state. Thus, when the corresponding lighting signal ϕI (the lighting signal ϕI1 or ϕI2) shifts from "H" (0 V) to "L" ("0"), the setting thyristor S turns ON and goes to the ON state of level "0". When the lighting signal ϕI (the lighting signal ϕI1 or ϕI2) goes from "L ("0")" to "L ("1")", the laser diode LD goes to the ON (lit) state of level "1".

That is, as the transfer thyristor T is placed in the ON state, the target laser diode LD on which to perform lighting control is specified. At this time, the lighting signal ϕI (the lighting signal ϕI1 or ϕI2) at the "L ("0")" level causes the setting thyristor S connected in series with the target laser diode LD to turn ON, and causes the laser diode LD to turn to the ON state of level "0", and the lighting signal ϕI (the lighting signal ϕI1 or ϕI2) at the "L ("1")" level causes the laser diode LD to turn to the ON (lit) state of level "1".

The transfer thyristors T belonging to the set of odd-numbered laser diodes LD are driven by using the start signal $\phi s1$ and the transfer signals $\phi 1$ and $\phi 2$ to thereby perform lighting control of the set of odd-numbered laser diodes LD. The transfer thyristors T belonging to the set of even-numbered laser diodes LD are driven by using the start signal $\phi s2$ and the transfer signals $\phi 3$ and $\phi 4$ to thereby perform lighting control of the set of even-numbered laser diodes LD. Further, the period in which the set of odd-numbered laser diodes LD is lit at level "1", and the period in which the set of odd-numbered laser diodes LD is lit at level "1" are alternated on the time axis. That is, multiple transfer paths are provided for individual sets of laser diodes LD, such as one transfer path for the set of odd-numbered laser diodes LD and one transfer path for the set of even-numbered laser diodes LD. Further, while the laser diodes LD belonging to one of the set of even-numbered laser diodes LDs and the set of odd-numbered laser diodes LD are lit at level "1", the laser diodes LD belonging to the other one of the set of even-numbered laser diodes LDs and the set of odd-numbered laser diodes LD are lit at level "0". This configuration causes lighting of the laser diodes LD at level "1" to be switched at short intervals of time. That is, the target laser diode LD that is to emit light is switched from one laser diode LD to another at high speed (fast response is achieved). For example, the target laser diode LD is switched from one laser diode LD to another in a period equivalent to the length of time from time j to time n. If only the set of odd-numbered laser diodes LD is used, for example, the target laser diode LD is switched from one laser diode LD to another in a period equivalent to the length of time from the time e to time i.

The period σ of level "0" may be set in accordance with the state of oscillation delay or relaxation oscillation.

Although the above description is directed to a case where there are two (stages of) transfer paths, one for the set of odd-numbered laser diodes LD and one for the set of even-numbered laser diodes LD, three or more (stages of) transfer paths may be provided to achieve faster response.

The laser diode LD may be maintained in the ON state of level "0" at all times. That is, a direct-current voltage (direct-current bias) may be applied to the laser diode LD to place the laser diode LD in the ON state of level "0".

The third exemplary embodiment may be applied to the second exemplary embodiment.

Although the laser component C according to the third exemplary embodiment uses the start signals $\phi s1$ and $\phi s2$, as with the laser component C according to the first exemplary embodiment, the laser component C according to the third exemplary embodiment may use the start diode SD.

Fourth Exemplary Embodiment

With the laser component C according to the first exemplary embodiment, the laser diodes LD are lighting-controlled by being switched in numerical order (in the direction of the array of the laser diodes LD). In contrast, in a fourth exemplary embodiment, in the middle of lighting control, the next laser diode LD to be lighting-controlled is switched from one laser diode LD to another either in numerical order (in the direction of the array of the laser diodes LD) or in reverse numerical order (in the direction opposite to the direction of the array).

The fourth exemplary embodiment is similar to the first exemplary embodiment, except for the portion corresponding to the laser component C and the signal output unit 12 that will be described below. Accordingly, the following description will focus on differences, and like features will not be described further in detail. For the laser component C and the signal output unit 12 as well, like features are designated by the same reference signs, and will not be described further in detail.

Figure 21:
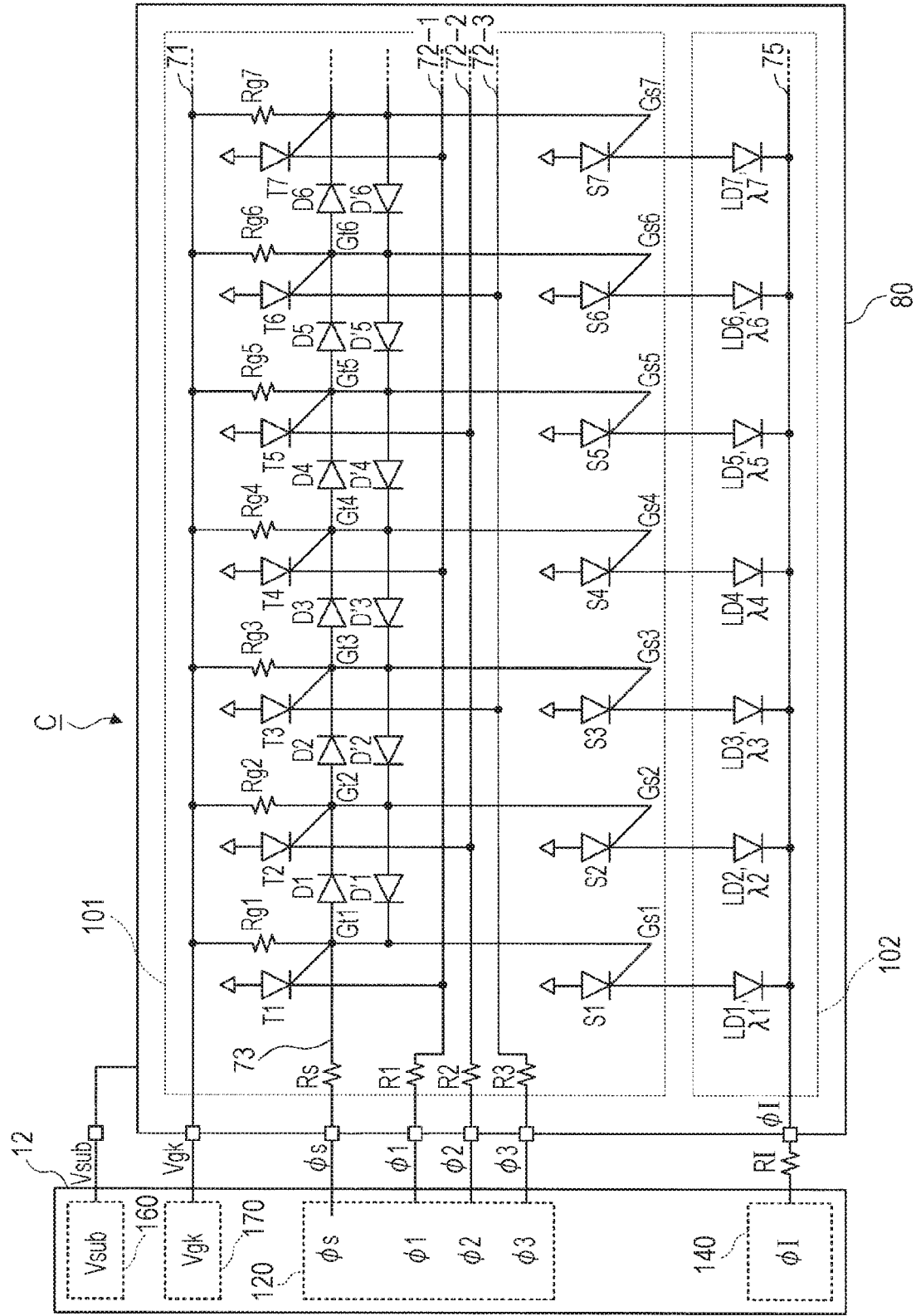
FIG. 21 is an equivalent circuit diagram of a laser component according to a fourth exemplary embodiment, and illustrates a signal output unit that outputs signals such as signals used to drive the laser component.

FIG. 21 is an equivalent circuit diagram of the laser component C according to the fourth exemplary embodiment, and illustrates the signal output unit 12 that outputs signals such as signals used to drive the laser component C. FIG. 21 illustrates the portion of the laser component C corresponding to the laser diodes LD1 to LD7. The same description below will apply to the subsequently numbered laser diodes LD.

Signal Output Unit 12

The transfer signal generating unit 120 of the signal output unit 12 outputs (transmits) the start signal $\phi s$, and the transfer signals $\phi 1$, $\phi 2$, and $\phi 3$ (to be referred to as transfer signal $\phi I$ when not distinguished from each other).

Laser Component C

The laser component C includes coupling diodes D'1, D'2, D'3, and so on (to be referred to as coupling diode D' when not distinguished from each other) respectively disposed in parallel with the coupling diodes D1, D2, D3, and so on. Each coupling diode D' is connected such that the direction of current flow through the coupling diode D' is opposite to the direction of current flow through the coupling diode D.

The anode of the coupling diode D1 and the cathode of the coupling diode D'1 are connected to a $\phi s$ terminal. The start signal $\phi s$ is transmitted to the $\phi s$ terminal from the signal output unit 12.

It is assumed in this case that the laser diodes LD are arranged in numerical order such that their emission wavelengths λ at the reference environmental temperature $T_O$ progressively increase.

The laser component C includes the transfer signal lines 72-1, 72-2, and 72-3 (to be referred to transfer signal line 72 when not distinguished from each other), the start signal line 73, and current-limiting resistors R1, R2, R3, and Rs (to be referred to as current-limiting resistor R when not distinguished from each other). The transfer signal line 72-1 is connected to the $\phi 1$ terminal via the current-limiting resistor R1. The transfer signal $\phi 1$ is transmitted to the $\phi 1$ terminal from the transfer signal generating unit 120. The transfer signal line 72-2 is connected to the $\phi 2$ terminal via the current-limiting resistor R2. The transfer signal $\phi 2$ is transmitted to the $\phi 2$ terminal from the transfer signal generating unit 120. The transfer signal line 72-3 is connected to the $\phi 3$ terminal via the current-limiting resistor R3. The transfer signal $\phi 3$ is transmitted to the $\phi 3$ terminal from the transfer signal generating unit 120. The start signal line 73 is connected to the $\phi s$ terminal via the current-limiting resistor Rs. The start signal $\phi s$ is transmitted to the $\phi s$ terminal from the transfer signal generating unit 120.

The laser diodes LD, the setting thyristors S, and the transfer thyristors T are divided in numerical order into three sets. The three sets include a first set of laser diodes, setting thyristors, and transfer thyristors that are numbered 1+3×(n−1) (n is an integer equal to or greater than 1; the same applies hereinafter), such as the laser diodes LD1, LD4, LD7, and so on, a second set of laser diodes, setting thyristors, and transfer thyristors that are numbered 2+3×(n−1), such as the laser diodes LD2, LD5, and so on, and a third set of laser diodes, setting thyristors, and transfer thyristors that are numbered 3+3×(n−1), such as the laser diodes LD3, LD6, and so on.

The cathodes of the transfer thyristors T in the first set are connected to the transfer signal line 72-1, the cathodes of the transfer thyristors T in the second set are connected to the transfer signal line 72-2, and the cathodes of the transfer thyristors T in the third set are connected to the transfer signal line 72-3.

Operation of Laser Generator 6

Timing Chart

Figure 22:
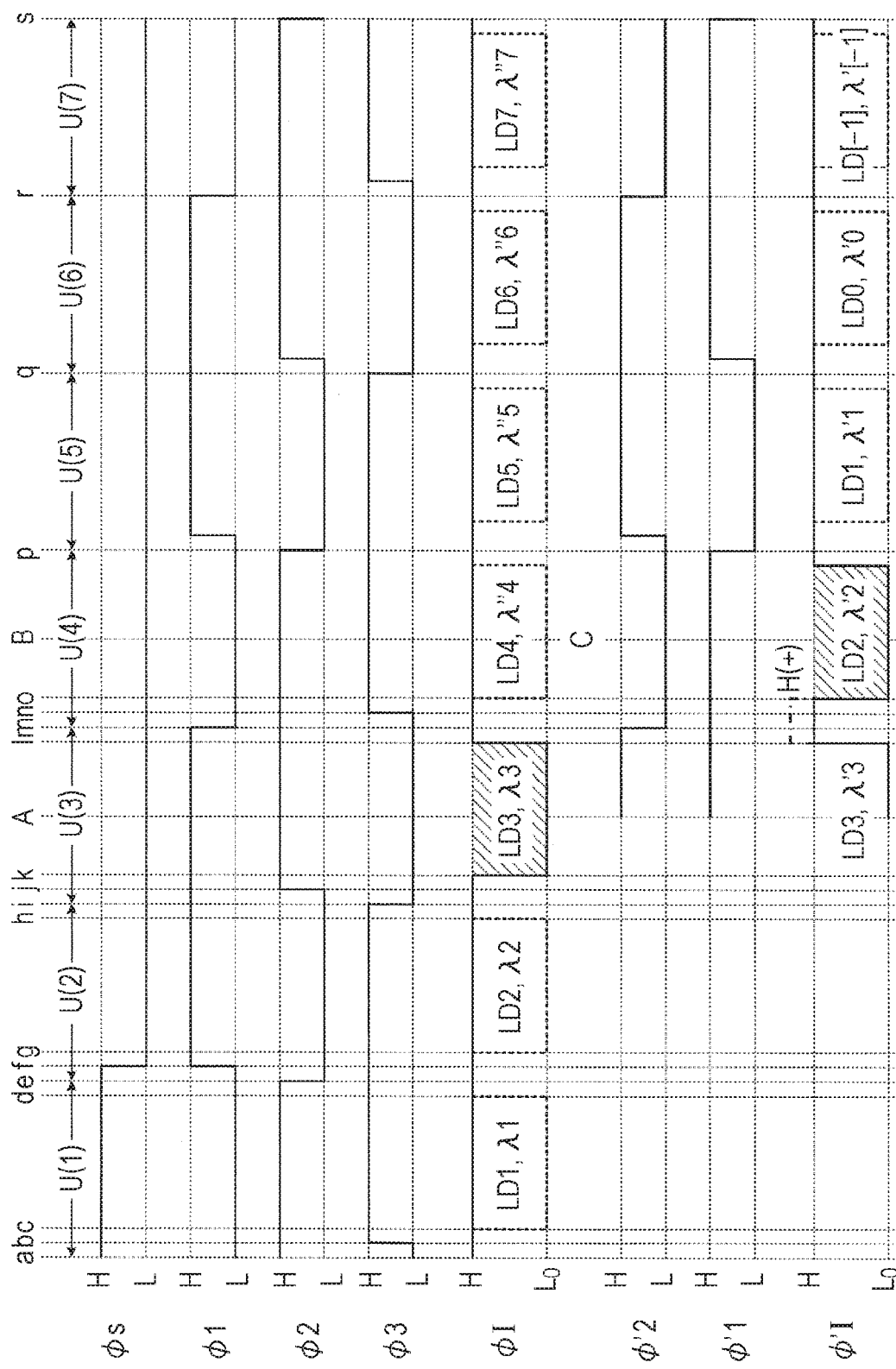
FIG. 22 is a timing chart illustrating the operation of a laser generating unit according to the fourth exemplary embodiment.

FIG. 22 is a timing chart illustrating the operation of the laser generating unit 6 according to the fourth exemplary embodiment.

The timing chart illustrated in FIG. 22 represents lighting control of seven laser diodes, the laser diodes LD1 to LD7, of the laser component C. It is assumed in FIG. 22 that the laser diode LD3 is to be lit up when the environmental temperature T is the reference environmental temperature $T_0$. That is, it is assumed that the wavelength λ3 emitted by the laser diode LD3 lies in the central portion of the wavelength channel ch of wavelength Λ to which the laser component C belongs.

Now, suppose that the environmental temperature T has fallen to the environmental temperature $T_1$ ($T_1 < T_0$). Then, the respective wavelengths λ1 to λ7 of the laser diodes LD1 to LD7 are displaced (shifted) to shorter wavelengths λ"1 to λ"7. Then, conversely to FIG. 4B, the wavelength λ"3 of the laser diode LD3 is shifted toward the shorter-wavelength end of the wavelength channel ch. Meanwhile, the wavelength λ"4 of the laser diode LD4 is shifted toward the central portion of the wavelength channel ch. Accordingly, the laser diode LD to be lit is switched from the laser diode LD3 to the laser diode LD4.

Conversely, suppose that the environmental temperature T has risen to the environmental temperature $T_2$ ($T_2 > T_0$). Then, the respective wavelengths λ1 to λ7 of the laser diodes LD1 to LD7 are displaced (shifted) to longer wavelengths λ'1 to λ'7. Then, similarly as described above with reference to FIG. 4B, the wavelength λ'3 of the laser diode LD3 is shifted toward the longer-wavelength end of the wavelength channel ch. Meanwhile, the wavelength λ"1 of the laser diode LD1 is shifted toward the central portion of the wavelength channel ch. Accordingly, the laser diode LD to be lit is switched from the laser diode LD2 to the laser diode LD1.

A method for switching the laser diodes LD will be described below in detail.

It is assumed that in FIG. 22, time passes in alphabetical order from time a to time s. Time A is set between time k and time 1, and time B and time C are set between time o and time p.

If the laser diodes LD are to be lighting-controlled in numerical order, the laser diodes LD1, LD2, and LD3 are brought into the ON (lit) state of level "1" respectively in the period U(1) (from time a to time e), the period U(2) (from time e to time i), and the period U(3) (from time i to time m). The laser diodes LD that are numbered 4 or higher are subsequently lighting-controlled in the same manner. If the laser diodes LD are to be lighting-controlled in reverse numerical order, the above-mentioned correspondence relationship is lost.

The power supply potential Vgk is at "L" (−3.3 V) level, and the reference potential Vsub is at "H" (0 V) level.

First, a description will be given of a case where the laser diode LD3 is lit up when the environmental temperature is the reference environmental temperature $T_0$.

The transfer signals φ1 to φ3, and the start signal φs will be described with reference to the periods U(1) to U(3) (from time a to time l). The transfer signals φ1 to φ3, and the start signal φs transmitted to the φs terminal each have two levels of potentials, "H" (0 V) and "L" (−3.3 V). In the following description, "H" (0 V) and "L" (−3.3 V) will be sometimes abbreviated as "H" and "L", respectively.

The transfer signal φ1 is "L" at time a, shifts from "L" to "H" at time f, and shifts from "H" to "L" at time m.

The transfer signal φ2 is "H" at time a, shifts from "H" to "L" at time e, and shifts from "L" to "H" at time j. The transfer signal φ2 maintains its "H" level at time k.

The transfer signal φ3 is "L" at time a, shifts from "L" to "H" at time b, and shifts from "H" to "L" at time i. The transfer signal φ3 maintains its "L" level at time k.

Each of the transfer signals φ1 to φ3 has a period of "L" level whose length is equivalent to the length of time represented as follows: period U+period of time from time i to time j, and has a period of "H" level whose length is equivalent to the length of time represented as follows: 2×period U− period of time from time i to time j. The respective periods of "L" level (e.g., from time e to time f) of the transfer signals φ1 and φ2 partially overlap. The same applies to the transfer signals φ2 and φ3, and the same applies to the transfer signals φ3 and φ1.

The transfer signals φ1 to φ3 repeat their respective waveforms from time a to time l.

Meanwhile, the start signal φs is "H" at time a, and shifts from "H" to "L" at time f when the transfer signal φ1 shifts from "L" to "H". Thereafter, the start signal φs maintains its "L" level.

The lighting signal φI has a period of level "Lo" when the laser diode LD turns to the ON state (lit state). The lighting signal φI is "H" at other times.

Referring also to FIG. 21, a case where the laser diode LD3 is to be lit will be described below with reference to FIG. 22.

Time a

At time a, the start signal φs is "H" (0 V), and thus the threshold voltage of the transfer thyristor T1 is −1.5 V. At this time, the transfer signal φ1 is "L" (−3.3 V), and the transfer thyristor T1 thus turns ON. The threshold voltage of the setting thyristor S1 is also −1.5 V. Since the lighting signal φI is "H", the laser diode LD1 is in its OFF (extinguished) state.

At this time, the transfer thyristor T2 whose gate Gt2 is connected to the gate Gt1 of the transfer thyristor T1 (to be referred to as "transfer thyristor T2 connected to the transfer thyristor T1" hereinafter) by the coupling diode D1 that is in forward biased condition has a threshold voltage set to −3.0 V. The transfer thyristor T3 connected to the transfer thyristor T2 by the coupling diode D2 that is in forward biased condition has a threshold voltage set to −4.5 V. The transfer thyristors T numbered 4 or higher have a threshold voltage set to −4.8 V.

At this time, the transfer signal φ2 is "H". Thus, the transfer thyristor T2, and the transfer thyristors T with their cathodes connected to the transfer signal line 72-2 on which the transfer signal φ2 is transmitted are in their OFF state. At this time, the transfer signal φ3 is "L" (−3.3 V). Since the transfer thyristor T3 has a threshold voltage of −4.5 V, the transfer thyristor T3 is in its OFF state. Since the other transfer thyristors T with their cathodes connected to the transfer signal line 72-3 on which the transfer signal φ3 is transmitted have a threshold voltage of −4.8 V, these transfer thyristors T are in their OFF state.

Time b

At time b, the transfer signal φ3 shifts from "L" to "H". However, since the transfer thyristors T with their cathodes connected to the transfer signal line 72-3 on which the transfer signal φ3 is transmitted have been in their OFF state, these transfer thyristors T maintain their OFF state.

Times c and d

Time c is the timing to bring the laser diode LD1 into the ON state. Since the laser diode LD3 is to be lit in the present case, however, the lighting signal φI is maintained at the "H" level.

Time d is the timing to bring the laser diode LD1 into the OFF state. Since the laser diode LD3 is to be lit in the present case, however, the lighting signal φI is maintained at the "H" level.

Time e

At time e, the transfer signal φ2 shifts from "H" to "L". Then, the transfer thyristor T2 whose threshold voltage has become −3.0 V turns ON. This causes the threshold voltage of the setting thyristor S2 to become −1.5 V.

Then, the threshold voltage of the transfer thyristor T3 connected to the transfer thyristor T2 by the coupling diode D2 that is in forward biased condition becomes −3.0 V. Since the threshold voltages of the other transfer thyristors T are the same as described above, this will not be described further in detail.

Time f

At time f, the start signal φs shifts from "H" to "L", and the transfer signal φ1 shifts from "L" to "H". Then, the transfer thyristor T1 turns OFF. At this time, the transfer thyristor T1 is connected to the transfer thyristor T2 by the diode D'1 that is in forward biased condition. Thus, the gate Gt1 of the transfer thyristor T1 becomes −1.5 V, and the threshold voltage of the transfer thyristor T1 becomes −3.0 V. Although the start signal φs goes to "L" (−3.3 V), the gate Gt1 of the transfer thyristor T1 is maintained at −1.5 V due to the current-limiting resistor Rs.

Times g and h

Time g is the timing to bring the laser diode LD2 into the ON state. Since the laser diode LD3 is to be lit in the present case, however, the lighting signal φI is maintained at the "H" level.

Time h is the timing to bring the laser diode LD2 into the OFF state. Since the laser diode LD3 is to be lit in the present case, however, the lighting signal φI is maintained at the "H" level.

Time i

At time i, the transfer signal φ3 shifts from "H" to "L". Then, the transfer thyristor T3 whose threshold voltage has become −3.0 V turns ON. This causes the threshold voltage of the setting thyristor S3 to become −1.5 V.

Then, the threshold voltage of the transfer thyristor T4 connected to the transfer thyristor T3 by the coupling diode D3 that is in forward biased condition becomes −3.0 V.

Time j

At time j, the transfer signal φ2 shifts from "L" to "H". Then, the transfer thyristor T2 turns OFF. At this time, the transfer thyristor T2 is connected to the transfer thyristor T3 by the diode D'2 that is in forward biased condition. Thus, the gate Gt2 of the transfer thyristor T2 becomes −1.5 V, and the threshold voltage of the transfer thyristor T2 becomes −3.0 V. The threshold voltage of the transfer thyristor T1 connected to the transfer thyristor T2 by the coupling diode D'1 that is in forward biased condition becomes −4.5 V.

Time k

At time k, the lighting signal φI shifts from "H" (0 V) to "Lo" (−5 V).

Then, the setting thyristor S3 whose threshold voltage has become −1.5 V turns ON, and the laser diode LD3 lights up.

Time A

At time A, the laser diode LD3 is in the lit state, and this state is maintained. Thus, the states of the start signal φs, the transfer signals φ1, φ2, and φ3, and the lighting signal φI at this timing are maintained.

Now, suppose that the environmental temperature T has fallen to the environmental temperature $T_1$ ($T_1<T_0$). As described above, the laser diode LD to be lit is switched from the laser diode LD3 to the laser diode LD4 at this time. The following describes a method for switching from the laser diode LD3 to the laser diode LD4.

Time l

At time l, the lighting signal φI shifts from "Lo" (−5 V) to "H" (0 V).

Then, the setting thyristor S3 turns OFF, causing the laser diode LD3 to be extinguished.

Time m

At time m, the transfer signal φ1 shifts from "H" to "L". Then, the transfer thyristor T4 whose threshold voltage has become −3.0 V turns ON. This causes the threshold voltage of the setting thyristor S4 to become −1.5 V.

Then, the threshold voltage of the transfer thyristor T5 connected to the transfer thyristor T2 by the coupling diode D5 that is in forward biased condition becomes −3.0 V.

Time n

At time n, the transfer signal φ3 shifts from "L" to "H". Then, the transfer thyristor T3 turns OFF. At this time, the transfer thyristor T3 is connected to the transfer thyristor T4 by the diode D'3 that is in forward biased condition. Thus, the gate Gt3 of the transfer thyristor T3 becomes −1.5 V, and the threshold voltage of the transfer thyristor T3 becomes −3.0 V. The threshold voltage of the transfer thyristor T2 connected to the transfer thyristor T3 by the coupling diode D'2 that is in forward biased condition becomes −4.5 V.

Time o

At time o, the lighting signal φI shifts from "H" (0 V) to "Lo" (−5 V).

Then, the setting thyristor S4 whose threshold voltage has become −1.5 V turns ON, and the laser diode LD4 lights Up.

Time B

At time B, the laser diode LD4 is in the lit state, and this state is maintained. Thus, the states of the start signal φs, the transfer signals φ1, φ2, and φ3, and the lighting signal φI at this timing are maintained.

That is, the laser diode LD to be lit has been switched from the laser diode LD3 to the laser diode LD4.

If the laser diodes LD are to be sequentially switched in increasing order of their emission wavelengths λ at the reference environmental temperature $T_0$, the laser diodes LD may be switched in their numerical order as described above.

Next, suppose that the environmental temperature T has risen to the environmental temperature $T_2$ ($T_2>T_0$). As described above, the laser diode LD to be lit is switched from the laser diode LD3 to the laser diode LD2 at this time. The following describes a method for switching from the laser diode LD3 to the laser diode LD2.

In the foregoing description, the transfer signals φ1 to φ3 are caused to enter the period of "L" level in this order. After time A, the transfer signals φ1 to φ3 are caused to enter the period of "L" level in reverse order.

That is, after time A, the transfer signal φ2 is replaced by a transfer signal φ'2, the transfer signal φ3 is replaced by a transfer signal φ'3, and the lighting signal φI is replaced by a lighting signal φ'I.

Time l

At time l, the lighting signal φ'I shifts from "Lo" (−5 V) to "H" (0 V).

Then, the setting thyristor S3 turns OFF, causing the laser diode LD3 to be extinguished.

Time m

At time m, the transfer signal φ'2 shifts from "H" to "L". Then, the transfer thyristor T2 whose threshold voltage has become −3.0 V turns ON. This causes the threshold voltage of the setting thyristor S2 to become −1.5 V.

Then, the threshold voltage of the transfer thyristor T1 connected to the transfer thyristor T2 by the coupling diode D'1 that is in forward biased condition becomes −3.0 V.

Time n

At time n, the transfer signal φ3 shifts from "L" to "H". Then, the transfer thyristor T3 turns OFF. At this time, the transfer thyristor T3 is connected to the transfer thyristor T2 by the diode D'2 that is in forward biased condition. Thus, the gate Gt3 of the transfer thyristor T3 becomes −1.5 V, and the threshold voltage of the transfer thyristor T3 becomes −3.0 V. The threshold voltage of the transfer thyristor T4 connected to the transfer thyristor T3 by the coupling diode D3 that is in forward biased condition becomes −4.5 V.

Time o

At time o, the lighting signal φ'I shifts from "H" (0 V) to "Lo" (−5 V).

Then, the setting thyristor S2 whose threshold voltage has become −1.5 V turns ON, and the laser diode LD2 goes to the ON (lit) state.

Time C

At time C, the laser diode LD2 is in the ON (lit) state, and that state is maintained. Thus, the states of the start signal φs, the transfer signals φ1, φ2, and φ3, and the lighting signal φI at this timing are maintained.

That is, the laser diode LD to be lit has been switched from the laser diode LD3 to the laser diode LD2.

If the laser diodes LD are to be sequentially switched in decreasing order of their emission wavelengths λ at the reference environmental temperature $T_0$, the laser diodes LD may be switched in their reverse numerical order. Although there is no laser diode LD numbered lower than the laser diode LD1 in the direction opposite to the direction of the array of the laser diodes LD, in FIG. 22, laser diodes LD0 and LD[−1] are additionally depicted to indicate that this arrangement is also applicable to cases other than when the laser diode LD to be lit is switched from the laser diode LD2 to the laser diode LD1.

As described above, in the fourth exemplary embodiment, the laser diodes LD are switched in the direction of the array of the laser diodes LD or in the direction opposite to the direction of the array. This further facilitates correction for shifting of the wavelength output by the laser generating unit 6.

Although the laser component C according to the fourth exemplary embodiment uses the start signal φs, as with the laser component C according to the first exemplary embodiment, the laser component C according to the fourth exemplary embodiment may use the start diode SD.

Fifth Exemplary Embodiment

With the laser component C according to the second exemplary embodiment, the laser diodes LD are lighting-controlled by being switched in numerical order. In contrast, in a fifth exemplary embodiment, in the middle of lighting control, the next laser diode LD to be lighting-controlled is switched from one laser diode LD to another in either numerical order or reverse numerical order.

The fifth exemplary embodiment is a combination of the second exemplary embodiment and the fourth exemplary embodiment, except for the portion corresponding to the laser component C and the signal output unit 12 that will be described below. Accordingly, the following description will focus on differences, and like features will not be described further in detail. For the laser component C and the signal output unit 12 as well, like features are designated by the same reference signs, and will not be described further in detail.

Figure 23:
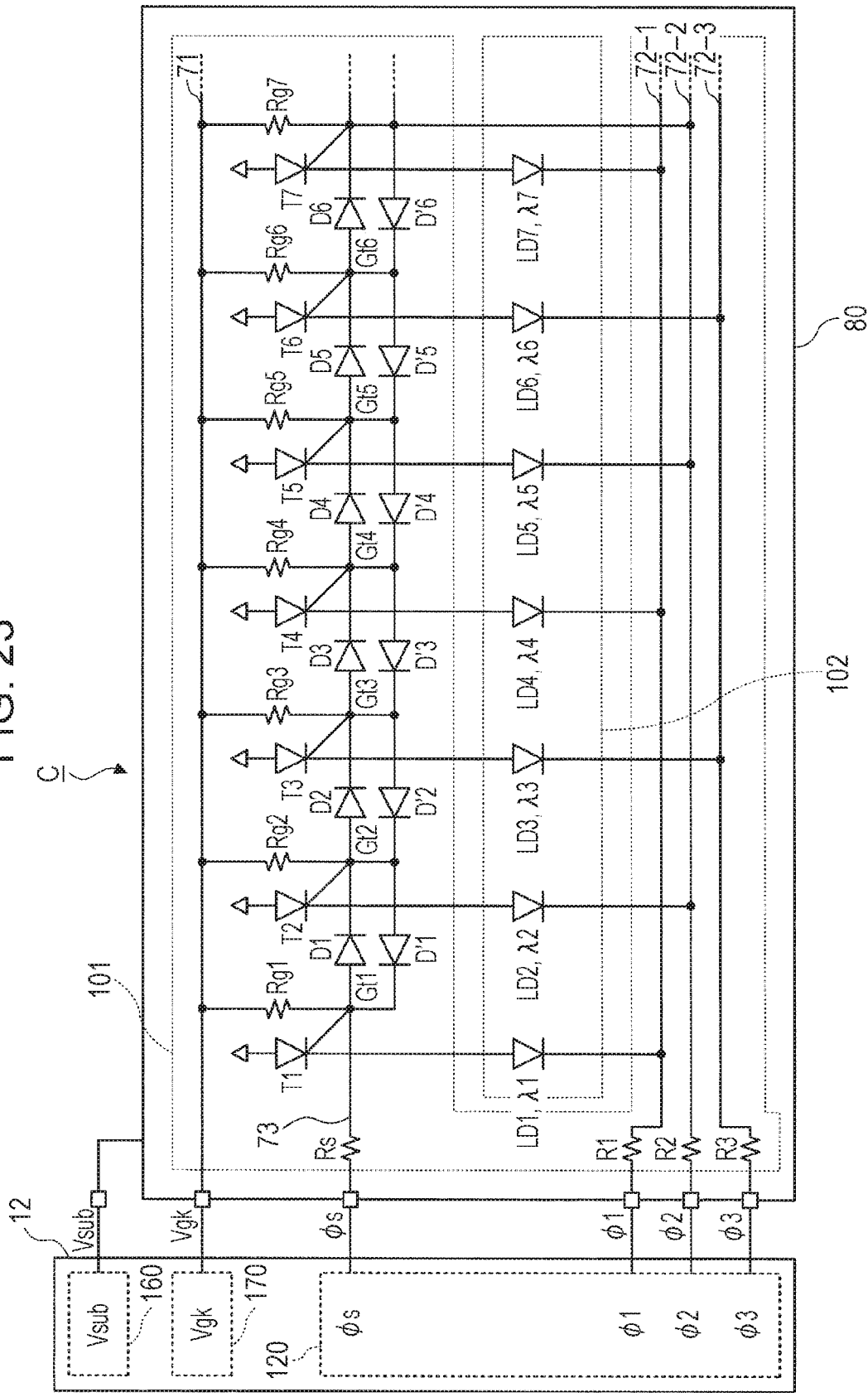
FIG. 23 is an equivalent circuit diagram of a laser component according to a fifth exemplary embodiment, and illustrates a signal output unit that outputs signals such as signals used to drive the laser component.

FIG. 23 is an equivalent circuit diagram of the laser component C according to the fifth exemplary embodiment, and illustrates the signal output unit 12 that outputs signals such as signals used to drive the laser component C. FIG. 23 illustrates the portion of the laser component C corresponding to the laser diodes LD1 to LD7. The same description below will apply to the subsequently numbered laser diodes LD.

Signal Output Unit 12

The transfer signal generating unit 120 of the signal output unit 12 outputs (transmits) the start signal φs, and the transfer signals φ1, φ2, and φ3 (to be referred to as transfer signal φ when not distinguished from each other). The signal output unit 12 does not include the lighting signal generating unit 140 according to the fourth exemplary embodiment.

Laser Component C

As with the laser component C according to the fourth exemplary embodiment, the laser component C includes coupling diodes D'1, D'2, D'3, and so on respectively disposed in parallel with the coupling diodes D1, D2, D3, and so on. Each coupling diode D' is connected such that the direction of current flow through the coupling diode D' is opposite to the direction of current flow through the coupling diode D.

The anode of the coupling diode D1 and the cathode of the coupling diode D'1 are connected to the φs terminal. The start signal φs is transmitted to the φs terminal from the signal output unit 12.

It is assumed in this case that the laser diodes LD are arranged in numerical order such that their emission wavelengths λ at the reference environmental temperature $T_0$ progressively increase.

With the laser component C according to the fifth exemplary embodiment, the setting thyristors S of the laser component C according to the fourth exemplary embodiment are not provided, and the transfer thyristors T and the laser diodes LD are electrically connected in series.

The laser component C includes the transfer signal lines 72-1, 72-2, and 72-3 (to be referred to transfer signal line 72 when not distinguished from each other), the start signal line 73, and the current-limiting resistors R1, R2, R3, and Rs (to be referred to as current-limiting resistor R when not distinguished from each other). The transfer signal line 72-1 is connected to the φ1 terminal via the current-limiting resistor R1. The transfer signal φ1 is transmitted to the φ1 terminal from the transfer signal generating unit 120. The transfer signal line 72-2 is connected to the φ2 terminal via the current-limiting resistor R2. The transfer signal φ2 is transmitted to the φ2 terminal from the transfer signal generating unit 120. The transfer signal line 72-3 is connected to the φ3 terminal via the current-limiting resistor R3. The transfer signal φ3 is transmitted to the φ3 terminal from the transfer signal generating unit 120. The start signal line 73 is connected to the φs terminal via the current-limiting resistor Rs. The start signal ϕs is transmitted to the ϕs terminal from the transfer signal generating unit 120.

The laser diodes LD and the transfer thyristors T are divided in numerical order into three sets. The three sets include a first set of laser diodes and transfer thyristors that are numbered 1+3×(n−1) (n is an integer equal to or greater than 1; the same applies hereinafter), such as the laser diodes LD1, LD4, LD7, and so on, a second set of laser diodes and transfer thyristors that are numbered 2+3×(n−1), such as the laser diodes LD2, LD5, and so on, and a third set of laser diodes and transfer thyristors that are numbered 3+3×(n−1), such as the laser diodes LD3, LD6, and so on.

The cathodes of the laser diodes LD in the first set are connected to the transfer signal line 72-1, the cathodes of the laser diodes LD in the second set are connected to the transfer signal line 72-2, and the cathodes of the laser diodes LD in the third set are connected to the transfer signal line 72-3.

Operation of Laser Generator 6

Since the operation of the laser generating unit 6 according to the fifth exemplary embodiment is readily understood from the operation of the laser generating unit 6 according to the second exemplary embodiment and the operation of the laser generating unit 6 according to the fourth exemplary embodiment, this will not be described further in detail.

Sixth Exemplary Embodiment

With the laser component C according to the third exemplary embodiment, the laser diodes LD are lighting-controlled by being switched in numerical order. In contrast, in a sixth exemplary embodiment, in the middle of lighting control, the next laser diode LD to be lighting-controlled is switched from one laser diode LD to another in either numerical order or reverse numerical order.

Figure 24:
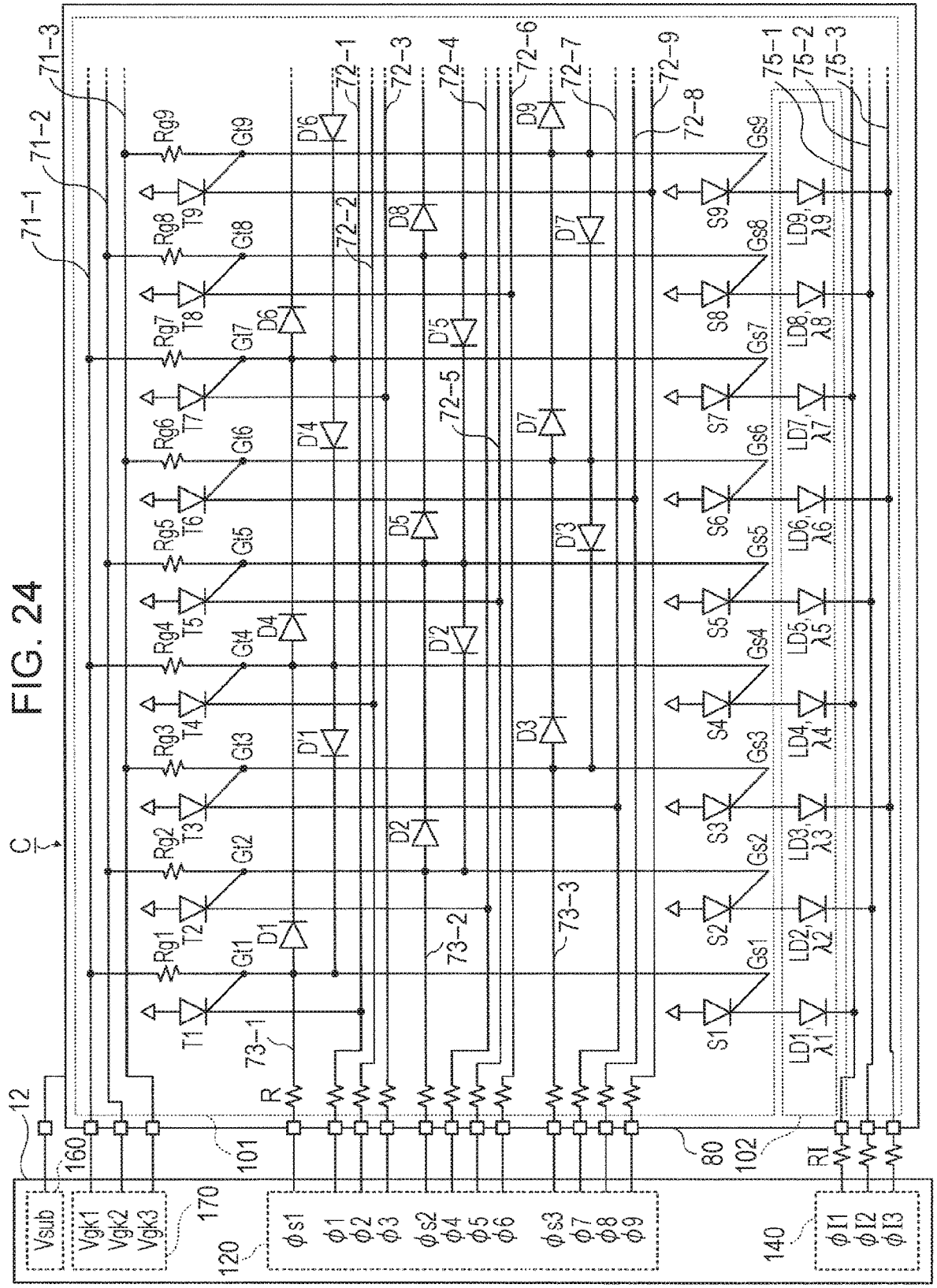
FIG. 24 is an equivalent circuit diagram illustrating the circuit configuration of a laser component according to a sixth exemplary embodiment, and a signal output unit that outputs signals such as signals used to drive the laser component.

FIG. 24 is an equivalent circuit diagram illustrating the circuit configuration of the laser component C according to the sixth exemplary embodiment and the signal output unit 12 that outputs signals such as signals used to drive the laser component C.

The laser component C and the signal output unit 12 according to the sixth exemplary embodiment are similar to those in the third exemplary embodiment except for the features described above. Accordingly, the following description will focus on differences, and like features are designated by the same reference signs and will not be described further in detail.

FIG. 24 depicts the portion of the laser component C corresponding to the laser diodes LD1 to LD9, the setting thyristors S1 to S9, and the transfer thyristors T1 to T9. The same description below will apply to the subsequently numbered diodes and thyristors.

Signal Output Unit 12

The signal output unit 12 includes the transfer signal generating unit 120, the lighting signal generating unit 140, the reference-potential supply unit 160, and the power-supply-potential supply unit 170.

The transfer signal generating unit 120 generates transfer signals ϕ1 ϕ2, ϕ3, ϕ4, ϕ5, ϕ6, ϕ7, ϕ8, and ϕ9 (to be referred to as transfer signal ϕ when not distinguished from each other), and start signals ϕs1, ϕs2, and ϕs3 (to be referred to as start signal ϕs when not distinguished from each other).

The lighting signal generating unit 140 transmits lighting signals ϕI1, ϕI2, and ϕI3 (to be referred to as lighting signal ϕI when not distinguished from each other).

The power-supply-potential supply unit 170 supplies power supply potentials Vgk1, Vgk2, and Vgk3 (to be referred to as power supply potential Vgk when not distinguished from each other).

Laser Component C

The laser diodes LD, the setting thyristors S, and the transfer thyristors T of the laser component C are divided in numerical order into three sets. The three sets include a first set of laser diodes, setting thyristors, and transfer thyristors that are numbered 1+3×(n−1) (n is an integer equal to or greater than 1; the same applies hereinafter), such as the laser diodes LD1, LD4, LD7, and so on, a second set of laser diodes, setting thyristors, and transfer thyristors that are numbered 2+3×(n−1), such as the laser diodes LD2, LD5, LD8, and so on, and a third set of laser diodes, setting thyristors, and transfer thyristors that are numbered 3+3× (n−1), such as the laser diodes LD3, LD6, LD9, and so on.

The gates Gt of the transfer thyristors T in the first set are connected to the power supply line 71-1 via the corresponding power line resistors Rg. The power supply potential Vgk1 is supplied to the power supply line 71-1 from the power-supply-potential supply unit 170.

The gates Gt of the transfer thyristors T in the second set are connected to the power supply line 71-2 via the corresponding power line resistors Rg. The power supply potential Vgk2 is supplied to the power supply line 71-2 from the power-supply-potential supply unit 170.

The gates Gt of the transfer thyristors T in the third set are connected to the power supply line 71-3 via the corresponding power line resistors Rg. The power supply potential Vgk3 is supplied to the power supply line 71-3 from the power-supply-potential supply unit 170.

The cathodes (corresponding to the n-ohmic electrode 321 illustrated in FIGS. 7A and 7C) of the laser diodes LD in the first set are connected to the lighting signal line 75-1. The lighting signal ϕI1 is transmitted to the lighting signal line 75-1 from the lighting signal generating unit 140.

The cathodes of the laser diodes LD in the second set are connected to the lighting signal line 75-2. The lighting signal ϕI2 is transmitted to the lighting signal line 75-2 from the lighting signal generating unit 140.

The cathodes of the laser diodes LD in the third set are connected to the lighting signal line 75-3. The lighting signal ϕI3 is transmitted to the lighting signal line 75-3 from the lighting signal generating unit 140.

In each of the above-mentioned sets, the gates Gt of the transfer thyristors T are connected to each other by the coupling diode D and the coupling diode D′ that are connected in parallel in opposite directions. For example, in the first set, the gate Gt1 of the transfer thyristor T1 and the gate Gt4 of the transfer thyristor T4 are connected by the coupling diode D1 and the coupling diode D′1, and the gate Gt4 of the transfer thyristor T4 and the gate Gt7 of the transfer thyristor T7 are connected by the coupling diode D4 and the coupling diode D′4.

Further, the cathodes of the transfer thyristors T in the first set are connected to the transfer signal lines 72-1, 72-2, and 72-3 in a cyclic manner in the following numerical order: the transfer thyristors T1, T4, T7, and so on. The transfer signals ϕ1, ϕ2, and ϕ3 are respectively transmitted to the transfer signal lines 72-1, 72-2, and 72-3. The anode of the coupling diode D1 and the cathode of the coupling diode D′1, which are connected to the gate Gt1 of the transfer thyristor T1, are connected such that the start signal ϕs1 is transmitted to each of the anode and the cathode.

The cathodes of the transfer thyristors T in the second set are connected to transfer signal lines 72-4, 72-5, and 72-6 in a cyclic manner in the following numerical order: the transfer thyristors T2, T5, T8, and so on. The transfer signals φ4, φ5, and φ6 are respectively transmitted to the transfer signal lines 72-4, 72-5, and 72-6. The transfer signal lines 72-4, 72-5, and 72-6 are connected to the terminals φ4, φ5, and φ6. The anode of the coupling diode D2 and the cathode of the coupling diode D'2, which are connected to the gate Gt2 of the transfer thyristor T2, are connected such that the start signal φs2 is transmitted to each of the anode and the cathode.

Likewise, the cathodes of the transfer thyristors T in the third set are connected to transfer signal lines 72-7, 72-8, and 72-9 in a cyclic manner in the following numerical order: the transfer thyristors T3, T6, T9, and so on. The transfer signals φ7, φ8, and φ9 are respectively transmitted to the transfer signal lines 72-7, 72-8, and 72-9. The anode of the coupling diode D3 and the cathode of the coupling diode D'3, which are connected to the gate Gt3 of the transfer thyristor T3, are connected such that the start signal φs3 is transmitted to each of the anode and the cathode.

In FIG. 24, symbols representing individual signals (such as φ1 representing the transfer signal φ1), and symbols representing the terminals to which the corresponding signals are supplied (such as φ1 representing the φ1 terminal) are the same, and thus symbols representing terminals are not illustrated.

Further, the current-limiting resistors are labeled R and RI.

Operation of Laser Generator 6

Timing Chart

Figure 25:
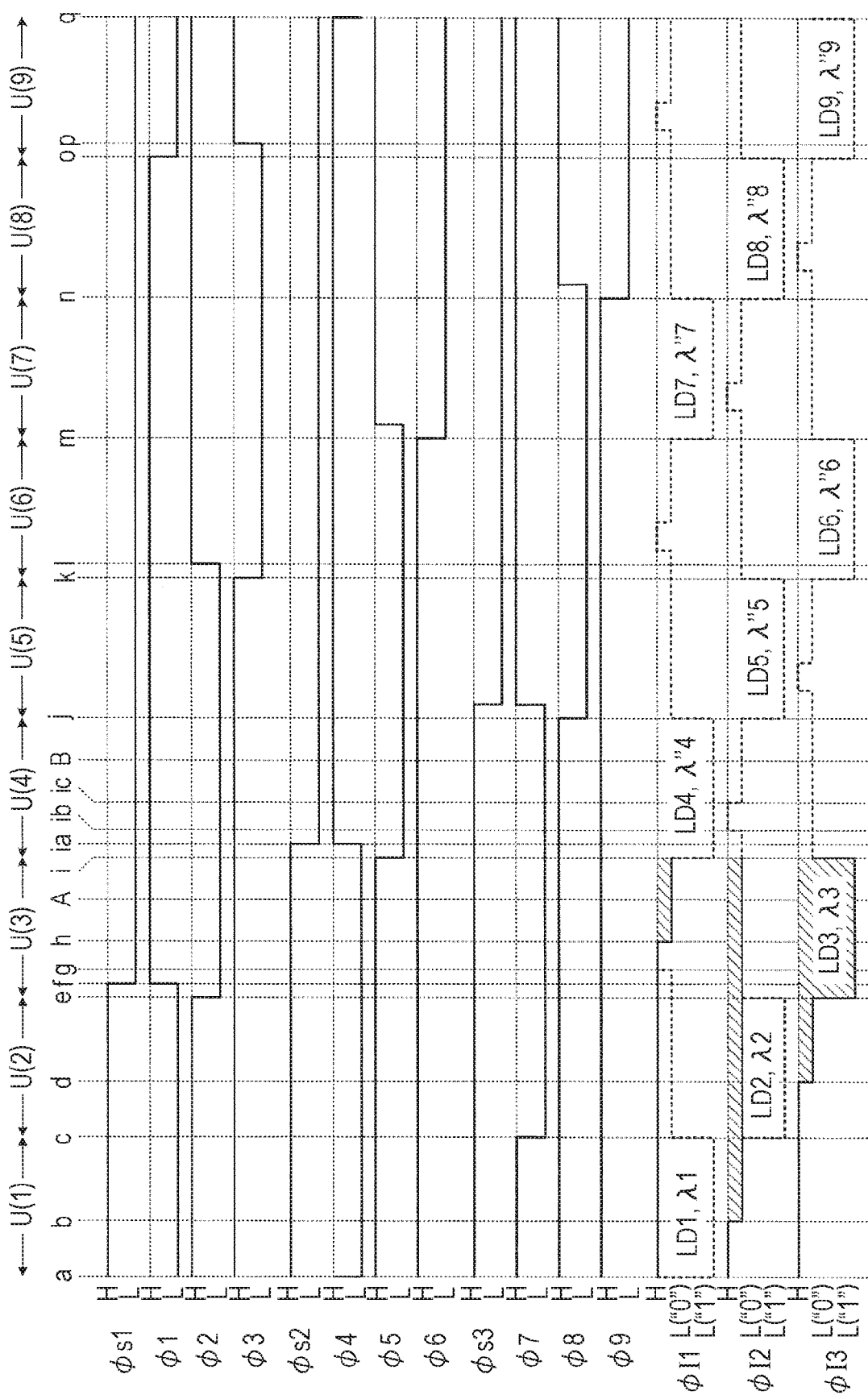
FIG. 25 is a timing chart illustrating the operation of a laser generating unit according to the sixth exemplary embodiment.

FIG. 25 is a timing chart illustrating the operation of the laser generating unit 6 according to the sixth exemplary embodiment.

The timing chart illustrated in FIG. 25 represents lighting control of nine laser diodes, the laser diodes LD1 to LD9, of the laser component C. It is assumed in FIG. 25 that the laser diode LD3 is to be lit when the environmental temperature T is the reference environmental temperature $T_0$. That is, it is assumed that the wavelength λ3 emitted by the laser diode LD3 lies in the central portion of the wavelength channel ch of wavelength Λ to which the laser component C belongs.

Now, suppose that the environmental temperature T has fallen to the environmental temperature $T_1$ ($T_1 < T_0$). Then, the respective wavelengths λ1 to λ9 of the laser diodes LD1 to LD9 are displaced (shifted) to shorter wavelengths λ"1 to λ"9. Then, conversely to FIG. 4B, the wavelength λ"3 of the laser diode LD3 is displaced (shifted) toward the shorter-wavelength end of the wavelength channel ch. Meanwhile, the wavelength λ"4 of the laser diode LD4 is displaced (shifted) toward the central portion of the wavelength channel ch. Accordingly, the laser diode LD to be lit is switched from the laser diode LD3 to the laser diode LD4.

Conversely, suppose that the environmental temperature T has risen to the environmental temperature $T_2$ ($T_2 > T_0$). Then, the respective wavelengths λ1 to λ9 of the laser diodes LD1 to LD9 are displaced (shifted) to longer wavelengths λ'1 to λ'9. Then, similarly as described above with reference to FIG. 4B, the wavelength λ'3 of the laser diode LD3 is displaced (shifted) toward the longer-wavelength end of the wavelength channel ch. Meanwhile, the wavelength λ'2 of the laser diode LD2 is displaced (shifted) toward the central portion of the wavelength channel ch. Accordingly, the laser diode LD to be lit is switched from the laser diode LD3 to the laser diode LD2.

A method for switching the laser diodes LD will be described below in detail.

It is assumed that in FIG. 25, time passes in alphabetical order from time a to time q. Time A is set between time h and time i, and times ia, ib, ic, and B are set between time i and time j.

If the laser diodes LD are to be lighting-controlled in numerical order, the laser diodes LD1, LD2, and LD3 go to the ON (lit) state of level "1" respectively in the period U(1) (from time a to time c), the period U(2) (from time c to time e), and the period U(3) (from time e to time i). The laser diodes LD that are numbered 4 or higher are subsequently lighting-controlled in the same manner. If the laser diodes LD are to be lighting-controlled in reverse numerical order, the above-mentioned correspondence relationship is lost. It is assumed in this case that the periods U(1), U(2), U(3), and so on are of the same length, and will be referred to as period U when not distinguished from each other.

The power supply potentials Vgk1, Vgk2, and Vgk3 are at "L" (−3.3 V) level, and the reference potential Vsub is at "H" (0 V) level.

The transfer signals φ1 to φ3 respectively transmitted to the φ1 to φ3 terminals corresponding to the first set, and the start signal φs1 transmitted to the φ1 terminal corresponding to the first set each have two levels of potentials, "H" (0 V) and "L" (−3.3 V). In the following description, "H" (0 V) and "L" (−3.3 V) will be sometimes abbreviated as "H" and "L", respectively.

The transfer signal φ1 is "L" at time a, shifts from "L" to "H" at time f, and shifts from "H" to "L" at time o.

The transfer signal φ2 is "H" at time a, shifts from "H" to "L" at time e, and shifts from "L" to "H" at time l.

The transfer signal φ3 is "H" at time a, shifts from "H" to "L" at time k, and shifts from "L" to "H" at time p.

The transfer signals φ1 to φ3 repeat their respective waveforms from time a to time q.

Meanwhile, the start signal φs1 is "H" at time a, and shifts from "H" to "L" at time f when the transfer signal φ1 shifts from "L" to "H". Thereafter, the start signal φs1 maintains its "L" level.

The transfer signals φ4, φ5, and φ6 corresponding to the second set are shifted backward by the period U on the time axis relative to the transfer signals φ1, φ2, and φ3 corresponding to the first set.

The transfer signals φ7, φ8, and φ9 corresponding to the third set are shifted backward by the period U on the time axis relative to the transfer signals φ4, φ5, and φ6 corresponding to the second set.

Each of the transfer signals φ1 to φ9 has a period of "L" level whose length is equivalent to the length of time represented as follows: 3×period U+period of time from time k to time l, and has a period of "H" level whose length is equivalent to the length of time represented as follows: 6×period U−period of time from time k to time l. The respective periods of "L" level (e.g., from time g to time h) of the transfer signals φ1 and φ2 partially overlap. The same applies to the transfer signals φ2 and φ3, and the same applies to the transfer signals φ3 and φ1. Likewise, the same applies to the other transfer signals φ.

The lighting signal φI shifts from "H", which represents the OFF (extinguished) state, to "L ("0")" before the laser diode LD goes to the ON state (lit state). The lighting signal φI then shifts to "L ("1")". As will be described later, while the lighting signal φI corresponding to one of the lighting signals φI1, φI2, and φI3 is maintained at "L ("1")", the other two lighting signals φI are maintained at "L ("0")".

The lighting signal φI2 is shifted backward by the period U on the time axis relative to the lighting signal φI1.

Likewise, the lighting signal ϕI3 is shifted backward by the period U on the time axis relative to the lighting signal ϕI2.

In the sixth exemplary embodiment, the laser diode LD3 is the laser diode LD to be lit. In this case, if the wavelength λ emitted by the laser diode LD3 is displaced toward an end of the wavelength channel ch, the laser diode LD to be lit is switched from the laser diode LD3 to another laser diode LD with a wavelength longer than that of the laser diode LD3 (the laser diode LD4 in this case) or to another laser diode LD with a wavelength shorter than that of the laser diode LD3 (the laser diode LD2 in this case). Accordingly, to ensure that an oscillation delay or relaxation oscillation occurring upon lighting up the laser diode LD does not impede fast switching of the laser diodes LD, the laser diode LD to be switched is retained in the ON state of level "0" (the "L ("0")" state of the lighting signal ϕI) in advance.

Referring also to FIG. 24, a case where the laser diode LD3 is to be lit will be described below with reference to FIG. 25.

Time a

At time a, the start signal ϕs1 is "H" (0 V), and thus the threshold voltage of the transfer thyristor T1 is −1.5 V. At this time, the transfer signal ϕ1 is "L" (−3.3 V), and the transfer thyristor T1 thus turns ON. The threshold voltage of the setting thyristor S1 is also −1.5 V.

Time a is the timing to shift the laser diode LD1 to the ON (lit) state of level "1". However, since the laser diode LD3 is to be lit in the present case as described above, the laser diode LD1 does not need to be maintained in the ON state of level "0". Thus, the lighting signal ϕI1 is maintained at its "H" level.

At this time, the transfer thyristor T4 connected by the coupling diode D1 that is in forward biased condition has a threshold voltage of −3.0 V.

Likewise, the transfer thyristor T2 also turns ON.

Since the start signal ϕs3 is "H", the threshold voltage of the transfer thyristor T3 is −1.5 V. However, since the transfer signal ϕ7 is "H", the transfer thyristor T3 is in its OFF state.

Time b

Time b is the timing to bring the laser diode LD2 into the ON (lit) state of level "0". Since the laser diode LD3 is to be lit in the present case as described above, the laser diode LD2 is placed in the ON state of level "0". Accordingly, the lighting signal ϕI2 is shifted from "H" to "L ("0")". This causes the laser diode LD2 to go to the ON state of level "0".

Time c

At time c, the transfer signal ϕ7 shifts from "H" to "L", and thus the transfer thyristor T3 turns ON.

Time c is the timing to shift the laser diode LD1 from the ON (lit) state of level "1" to the ON state of level "0". Further, time c is the timing to shift the laser diode LD2 to the ON (lit) state of level "1". However, since the laser diode LD3 is to be lit in the present case, the laser diode LD1 is maintained in the OFF state, and the laser diode LD2 is maintained in the ON state of level "0". Accordingly, the lighting signal ϕI1 is maintained at "H", and the lighting signal ϕI2 is maintained at "L ("0")".

The lighting signal ϕI3 is "H" at this time.

Time d

At time d, as the lighting signal ϕI3 shifts from "H" to "L ("0")", the laser diode LD3 goes to the ON state of level Time e At time e, the transfer signal ϕ2 shifts from "H" to "L" (−3.3 V). Then, the transfer thyristor T4 whose threshold voltage has become −3.0 V turns ON. Then, the threshold voltage of the transfer thyristor T7 goes to −3.0 V via the coupling diode D4.

Time e is the timing to shift the laser diode LD2 from the ON (lit) state of level "1" to the ON state of level "0". However, since the laser diode LD3 is to be lit in the present case, the lighting signal ϕI2 is maintained at "L ("0")", and the laser diode LD2 is maintained in the ON state of level "0".

Further, when the lighting signal ϕI3 shifts from "L ("0")" to "L ("1")", the laser diode LD3 shifts from the ON state of level "0" to the ON (lit) state of level "1".

Time f

At time f, the transfer signal ϕ1 goes from "L" to "H", and the start signal ϕs1 goes from "H" to "L". When the transfer signal ϕ1 goes from "L" to "H", the cathode of the transfer thyristor T1 goes to "H", and thus the transfer thyristor T1 turns OFF.

At this time, the gate Gt1 of the transfer thyristor T1 is connected to the gate Gt4 of the transfer thyristor T4 by the coupling diode D′1. The coupling diode D1 is reverse biased, whereas the coupling diode D′1 is forward biased, and the gate Gt1 becomes −1.5 V. This causes the threshold voltage of the transfer thyristor T1 to become −3.0 V. That is, when the transfer thyristor T4 goes to the ON state, the threshold voltage of the transfer thyristors T1 and T7 becomes −3.0 V due to the coupling diodes D1 and D′1 that are connected in parallel and biased in opposite directions.

Although the gate Gs1 of the setting thyristor S1 also becomes −1.5 V, since the lighting signal ϕI1 is "H", the OFF state is maintained.

Time g

Time g is the timing to shift the lighting signal ϕI1 from "L ("0")" to "H" when the laser diode LD1 is placed in the ON state. Since the laser diode LD3 is to be lit in the present case, the lighting signal ϕI1 is maintained at "H".

Time h

Time h is the timing to shift the laser diode LD4 from the OFF state to the ON state of level "0" for cases where the laser diode LD4 is to be lit. Since the laser diode LD3 is to be lit in the present case, as described above, the laser diode LD4 is set to the ON state of level "0". Accordingly, the lighting signal ϕI1 is shifted from "H" to "L ("0")", and the setting thyristor S4 with a threshold voltage of −1.5 V turns ON, causing the laser diode LD4 to shift from the OFF state to the ON state of level "0".

Time A

At time A, the laser diode LD3 is ON (lit) at level "1", and the laser diodes LD2 and LD4, which are respectively located immediately upstream and downstream of the laser diode LD3 in the array, are ON at level "0", and this state is maintained. Thus, the states of the start signals ϕs1 to ϕs3, the transfer signals ϕ1 to ϕ9, and the lighting signals ϕI1 to ϕI3 at this timing are maintained.

Now, suppose that the environmental temperature T has fallen to the environmental temperature $T_1$ ($T_1 < T_0$). As described above, the laser diode LD to be lit is switched from the laser diode LD3 to the laser diode LD4 at this time. The following describes a method for switching the laser diode LD to be turned ON (lit) from the laser diode LD3 to the laser diode LD4.

Time i

At time i, the transfer signal ϕ5 is shifted from "H" to "L". Further, the lighting signal ϕI1 is shifted from "L ("0")" to "L ("1")", and the lighting signal ϕI3 is shifted from "L ("1")" to "L ("0")".

When the transfer signal ϕ5 goes from "H" to "L", the transfer thyristor T5 turns ON. This causes the threshold voltage of the setting thyristor S5 to become −1.5 V.

When the lighting signal ϕI1 goes from "L ("0")" to "L ("1")", the laser diode LD3 goes from the ON state of level "0" to the ON (lit) state of level "1".

When the lighting signal ϕI3 goes from "L ("1")" to "L ("0")", the laser diode LD3 goes from the ON (lit) state of level "1" to the ON state of level "0".

That is, the laser diode LD to be turned ON (lit) is switched from the laser diode LD3 to the laser diode LD4.

Time ia

At time ia, the transfer signal ϕ4 is shifted from "L" to "H", and the start signal ϕs2 is shifted from "H" to "L".

When the transfer signal ϕ4 goes from "L" to "H", the transfer thyristor T2 turns OFF.

At this time, the gate Gt2 of the transfer thyristor T2 is connected to the gate Gt5 of the transfer thyristor T5 by the coupling diode D'2 that is in forward biased condition. Thus, the gate Gt2 becomes −1.5 V. Further, the gate Gt8 of the transfer thyristor T8 is connected to the gate Gt5 of the transfer thyristor T5 by the coupling diode D5 that is in forward biased condition. Thus, the gate Gt8 becomes −1.5 V. This causes the respective gates Gs2 and Gs8 of the setting thyristors S2 and S8 to also become −3.0 V. At this time, since the laser diode LD2 is in the ON state of level "0", the lighting signal ϕI2 is −1.5 V, and thus the setting thyristors S2 and S8 are in their OFF state.

Time ib

At time ib, the lighting signal ϕI2 is shifted from "L ("0")" to "H".

When the lighting signal 4I2 goes from "L ("0")" to "H", the laser diode LD2 goes to the OFF state.

Time ic

At time ic, the lighting signal ϕI2 is shifted from "H" to "L ("0")".

When the lighting signal 4I2 goes from "H" to "L ("0")", the laser diode LD5 goes from the OFF state to the ON state of level "0".

Time B

At time B, the laser diode LD4 is ON (lit) at level "1", and the laser diodes LD3 and LD5, which are respectively located immediately upstream and downstream of the laser diode LD4 in the array, are ON at level "0", and this state is maintained. Thus, the states of the start signals ϕs1 to ϕs3, the transfer signals ϕ1 to ϕ9, and the lighting signals ϕI1 to ϕI3 at this timing are maintained.

Since the laser diode LD4 has been thus maintained in its ON state of level "0", the laser diode LD4 is not subject to the influence of an oscillation delay or relaxation oscillation upon turning to the ON (lit) state of level "1".

Suppose that the environmental temperature T has risen to the environmental temperature $T_2$ ($T_2 > T_0$). As described above, the laser diode LD to be lit is switched from the laser diode LD3 to the laser diode LD2 at this time. The following describes a method for switching the laser diode LD to be turned ON (lit) from the laser diode LD3 to the laser diode LD2.

In the fourth exemplary embodiment described above, when the laser diodes LD are to be switched (transferred) in numerical order (in the direction of the array of the laser diodes LD), the transfer signals ϕ1 to ϕ3 are made to enter the "L" period in numerical order in a cyclic manner. In contrast, when the laser diodes LD are to be switched (transferred) in reverse numerical order (reverse direction), the transfer signals ϕ1 to ϕ3 are made to enter the "L" period in reverse numerical order in a cyclic manner.

In the sixth exemplary embodiment as well, when the laser diodes LD are to be switched (transferred) in numerical order (in the direction of the array of the laser diodes LD), the transfer signals ϕ1, ϕ4, ϕ7, ϕ2, ϕ5, ϕ8, ϕ3, ϕ6, and ϕ9 are made to enter the "L" period in this order in a cyclic manner. In contrast, when the laser diodes LD are to be switched (transferred) in reverse numerical order (reverse direction), the transfer signals ϕ1, ϕ4, ϕ7, ϕ2, ϕ5, ϕ8, ϕ3, ϕ6, and ϕ9 may be made to enter the "L" period in reverse order in a cyclic manner.

Figure 26:
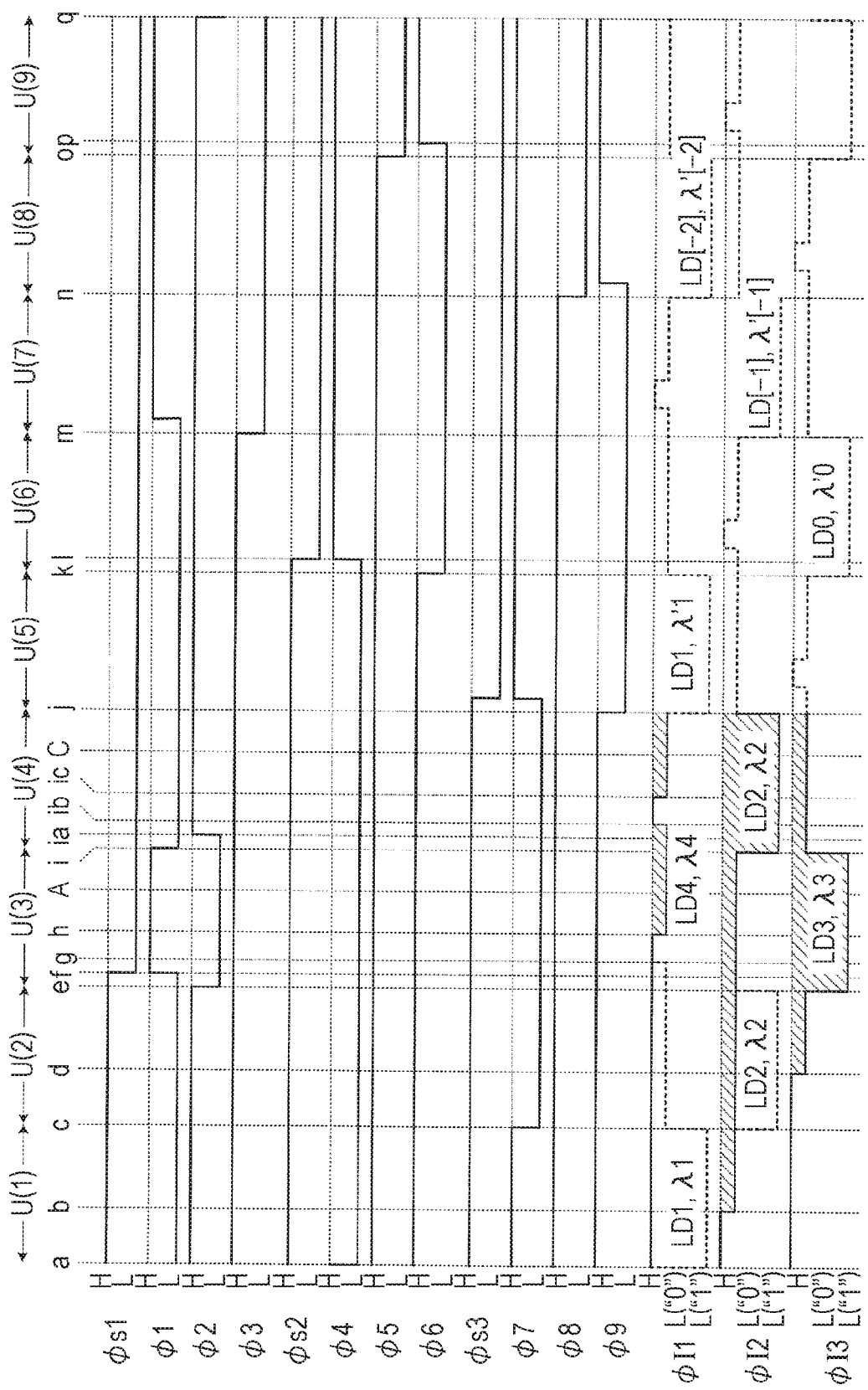
FIG. 26 is a timing chart for cases where the laser diodes of a laser component are switched in reverse numerical order in the laser generating unit according to the sixth exemplary embodiment.

FIG. 26 is a timing chart for cases where the laser diodes LD of the laser component C are switched in reverse numerical order in the laser component C according to the sixth exemplary embodiment. In this case, the laser diode LD to be turned ON (lit) is switched from the laser diode LD3 to the laser diode LD2. Although there is no laser diode LD numbered lower than the laser diode LD1 in the direction opposite to the direction of the array of the laser diodes LD, in FIG. 26, laser diodes LD0, LD[−1], and LD[−2] are additionally depicted to indicate that this arrangement is also applicable to cases other than when the laser diode LD to be lit is switched from the laser diode LD3 to the laser diode LD2.

Times a, b, c, and so on are the same as those in FIG. 25.

The operation from time a to time A is the same as that described above with reference to FIG. 25.

Time i

At time i, the transfer signal ϕ1 is shifted from "H" to "L". Further, the lighting signal ϕI2 is shifted from "L ("0")" to "L ("1")", and the lighting signal ϕI3 is shifted from "L ("1")" to "L ("0")".

When the transfer signal ϕ1 goes from "H" to "L", the transfer thyristor T1 with the threshold voltage set to −3.0 V turns ON, causing the threshold voltage of the setting thyristor S1 to become −1.5 V.

When the lighting signal ϕI2 goes from "L ("0")" to "L ("1")", the laser diode LD2 goes from the ON state of level "0" to the ON (lit) state of level "1". Then, when the lighting signal ϕI3 goes from "L ("1")" to "L ("0")", the laser diode LD3 goes from the ON (lit) state of level "1" to the ON state of level "0".

Thus, the laser diode LD to be turned ON (lit) has been switched from the laser diode LD3 to the laser diode LD2.

Time ia

At time ia, the transfer signal ϕ2 is shifted from "L" to "H".

When the transfer signal ϕ2 goes from "L" to "H", the transfer thyristor T4 turns OFF.

As a result, the gate Gt4 of the transfer thyristor T4 becomes −1.5 V due to the coupling diode D1 that is in forward biased condition. However, the setting thyristor S4 maintains its ON state, and the laser diode LD4 maintains its ON (lit) state.

Time ib

At time ib, the lighting signal ϕ1 is shifted from "L ("0")" to "H".

When the lighting signal ϕI1 goes from "L ("0")" to "H", the setting thyristor S4 turns OFF, and the laser diode LD4 shifts from the ON state of level "0" to the OFF state. This causes the threshold voltage of the setting thyristor S4 to become −3.0 V.

Time ic

At time ic, the lighting signal ϕI1 is shifted from "H" to "L ("0")".

When the lighting signal ϕ1 is shifted from "H" to "L ("0")", the setting thyristor S1 with a threshold voltage of −1.5 V turns ON, causing the laser diode LD1 to shift from the OFF state to the ON state of level "0".

Time C

At time C, the laser diode LD2 is ON (lit) at level "1", and the laser diodes LD1 and LD3, which are respectively located immediately upstream and downstream of the laser diode LD2, are ON at level "0". This state is maintained at this timing. The states of the start signals φs1 to φs3, the transfer signals φ1 to φ9, and the lighting signals φI1 to φI3 at this timing are maintained.

Since the laser diode LD2 has been thus maintained in its ON state of level "0", the laser diode LD2 is not subject to the influence of an oscillation delay or relaxation oscillation upon turning to the ON (lit) state of level "1".

As described above, in the sixth exemplary embodiment, when a given laser diode LD is in the ON (lit) state of level "1", the laser diodes LD immediately upstream and downstream of this laser diode LD are maintained in their ON state of level "0". Therefore, irrespective of whether the laser diode LDs are switched in the direction of the array of the laser diodes LD (in numerical order) or in the direction opposite to the direction of the array, switching of the laser diodes LD is accomplished without being subject to the influence of an oscillation delay or relaxation oscillation. In the sixth exemplary embodiment, the laser diodes LD are switched in the direction of the array of the laser diodes LD or in the direction opposite to this direction. This enables fast correction for shifting of the wavelength output by the laser generating unit 6.

Although the laser component C according to the sixth exemplary embodiment uses the start signals φs1, φs2, and φs3, as with the laser component C according to the first exemplary embodiment, the laser component C according to the sixth exemplary embodiment may use the start diode SD.

Seventh Exemplary Embodiment

The laser diode LD, which is an example of a laser device in the laser component C of the laser generating unit 6 according to each of the first to sixth exemplary embodiments, has the light emitting layer 87 sandwiched by the p-anode layer 86 and the n-cathode layer 88 that act as cladding layers.

However, instead of the laser diode LD, the laser device used may be a vertical cavity surface emitting laser (VCSEL) that has the light emitting layer 87 sandwiched by two distributed Bragg reflectors (DBRs) (to be referred to as DBR layers hereinafter), and emits light in a direction perpendicular to the light emitting layer 87. The vertical cavity surface emitting laser VCSEL oscillates when the two DBR layers have a reflectance equal to or higher than, for example, 99%. The emission wavelength is determined by the thickness of the light emitting layer 87 sandwiched by the two DBR layers.

The plan layout and cross-section of the laser component C according to the seventh exemplary embodiment are similar to those of the laser component C according to the first exemplary embodiment illustrated in FIGS. 6A and 6B. Accordingly, the laser diode LD in the arrangement according to the first exemplary embodiment may be replaced by the vertical cavity surface emitting laser VCSEL.

A description will be given below of the island 301 formed by stacking the vertical cavity surface emitting laser VCSEL and the setting thyristor S, which represents a feature different from the first exemplary embodiment.

Figure 27:
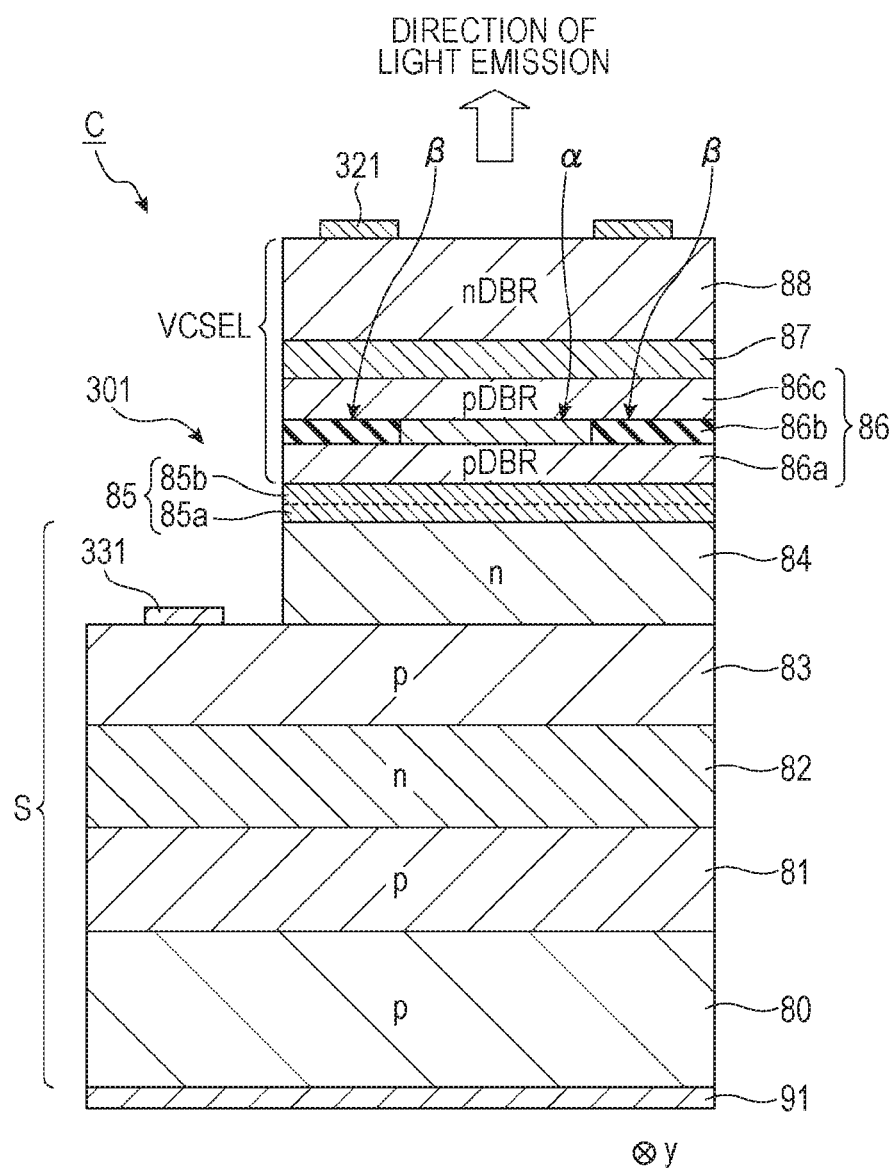
FIG. 27 is a detailed illustration of an island formed by stacking a setting thyristor and a vertical cavity surface emitting laser in a laser component according to a seventh exemplary embodiment.

FIG. 27 is a detailed illustration of the island 301 formed by stacking the setting thyristor S and the vertical cavity surface emitting laser VCSEL in the laser component C according to the seventh exemplary embodiment.

With the laser component C according to the seventh exemplary embodiment, the p-anode layer 86 and the n-cathode layer 88 are constructed as DBR layers. The p-anode layer 86 includes the current confinement layer 86b. That is, the p-anode layer 86 is formed by stacking the lower p-anode layer 86a, the current confinement layer 86b, and the upper p-anode layer 86c in this order, with the lower p-anode layer 86a and the upper p-anode layer 86c being constructed as DBR layers.

Laser is emitted in a direction perpendicular to the substrate 80. Thus, the n-ohmic electrode 321 has an opening in the central portion.

The lower p-anode layer 86a, the upper p-anode layer 86c, and the n-cathode layer 88 will be sometimes respectively referred to as lower p-anode (DBR) layer 86a, upper p-anode (DBR) layer 86c, and n-cathode (DBR) layer 88. In FIG. 27, these layers are designated as pDBR and nDBR.

Each DBR layer is formed by a combination of a low refractive index layer of, for example, $Al_{0.9}Ga_{0.1}As$ with a high Al composition, and a high refractive index layer of, for example, $Al_{0.2}Ga_{0.8}As$ with a low Al composition. The film thickness (optical path length) of each of the low refractive index layer and the high refractive index layer is set to, for example, 0.25 (¼) of the center wavelength. The composition ratio of Al in each of the low refractive index layer and the high refractive index layer may be varied in the range of 0 to 1.

The film thickness (optical path length) of the current confinement layer 86b is determined by the specific structure employed. If the priority is extraction efficiency or process reproducibility, the film thickness (optical path length) of the current confinement layer 86b is desirably set to an integer multiple of the film thickness (optical path length) of each of the low refractive index layer and the high refractive index layer that form the DBR layers, for example, to 0.75 (¾) of the center wavelength. If this integer is an odd value, it is desirable to sandwich the current confinement layer 86b by a high refractive index layer and a high refractive index layer. If this integer is an even value, it is desirable to sandwich the current confinement layer 86b by a high refractive index layer and a low refractive index layer. That is, the current confinement layer 86b is desirably disposed so as to minimize periodic perturbation of the refractive index due to the DBR layers. Conversely, if it is desired to reduce the influence of the oxidized portion (refractive index or distortion), it is desirable that the current confinement layer 86b have a film thickness of several tens nm, and be inserted at the nodes of standing waves that appear in the DBR layers.

The laser component C according to the seventh exemplary embodiment is fabricated by partially modifying the fabrication method according to the first exemplary embodiment illustrated in FIGS. 12A to 12F.

For example, a patterned substrate formed by providing the surface of the substrate 80 with irregularities (steps) is used, with the speed of growth of each semiconductor layer changing with the depth or width of the steps. This causes the thickness of the light emitting layer 87 to vary, allowing multiple vertical cavity surface emitting lasers VCSEL forming the laser device array to emit different wavelengths.

In the semiconductor laminate forming step illustrated in FIG. 12A, the lower p-anode layer 86a and the upper p-anode layer 86c of the p-anode layer 86, and the n-cathode layer 88 are formed as DBR layers. A portion of a semiconductor layer, such as a portion of the lower p-anode layer 86a or the upper p-anode layer 86c of the p-anode layer 86, or a portion of the n-cathode layer 88, may be formed as a DBR layer.

The laser component C according to the seventh exemplary embodiment may be fabricated as described above.

Instead of the tunnel junction layer 85, a group III-V compound layer with a metal-like conductivity may be used.

The vertical cavity surface emitting laser VCSEL may be employed for the first to sixth exemplary embodiments.

Eighth Exemplary Embodiment

With the laser component C according to each of the first to sixth exemplary embodiments, the laser diode LD is disposed over the setting thyristor S disposed over the substrate 80.

In the eighth exemplary embodiment, the laser diode LD is disposed over the substrate 80, and the setting thyristor S is disposed over the laser diode LD.

Since the eighth embodiment is otherwise of the same configuration as the first exemplary embodiment, the following describes the island 301 formed by stacking the setting thyristor S and the laser diode LD, which represents a feature different from the first exemplary embodiment.

FIG. 28 is a detailed illustration of the island 301, which is formed by stacking the setting thyristor S and the laser diode LD, of the laser component C according to the eighth exemplary embodiment. The same reference signs as those used in the first exemplary embodiment are used in the eighth exemplary embodiment.

The p-anode layer 86, the light emitting layer 87, the n-cathode layer 88, the tunnel junction layer 85, the p-anode layer 81, the n-gate layer 82, the p-gate layer 83, and the n-cathode layer 84 are stacked in this order over the substrate 80. The p-anode layer 86 and the n-cathode layer 88 are cladding layers. Accordingly, the p-anode layer 86 and the n-cathode layer 88 will be sometimes respectively referred to as p-anode (cladding) layer 86 and n-cathode (cladding) layer 88.

The p-anode layer 86 includes the lower p-anode layer 86a, the current confinement layer 86b, and the upper p-anode layer 86c.

As with the n-cathode layer 88 according to the first exemplary embodiment, the n-cathode layer 88 is made up of the lower n-cathode layer 88a and the upper diffraction grating layer 88b. The upper diffraction grating layer 88b, which is a portion with diffraction gratings (banded irregularities) formed at predetermined pitches, is contiguous with the lower n-cathode layer 88a.

Although the tunnel junction layer 85 may be stacked over the upper diffraction grating layer 88b, desirably, an n-cathode layer with a refractive index different from that of the n-cathode layer 88 is disposed over the upper diffraction grating layer 88b, and the tunnel junction layer 85 is stacked over this n-cathode layer.

That is, as with the laser diode LD according to the first exemplary embodiment illustrated in FIGS. 7A to 7C, the laser component C according to the eighth exemplary embodiment emits light along the surface of the substrate 80.

As described above with reference to the seventh exemplary embodiment, the p-anode layer 86 and the n-cathode layer 88, which are cladding layers, may be constructed as DBR layers. In this case, the laser diode LD becomes a vertical cavity surface emitting laser VCSEL. The vertical cavity surface emitting laser VCSEL with the p-anode layer 86 and the n-cathode layer 88 formed as DBR layers emits light in a direction perpendicular to the substrate 80.

Instead of the tunnel junction layer 85, a group III-V compound layer with a metal-like conductivity may be used.

The configuration in which the laser diode LD or the vertical cavity surface emitting laser VCSEL is disposed over the substrate 80, and the setting thyristor S is disposed over the laser diode LD or the vertical cavity surface emitting laser VCSEL, may be employed for the first to sixth exemplary embodiments.

With the laser component C of the laser generating unit 6 according to the first to eighth exemplary embodiments, the conductivity types of the laser device (the laser diode LD or the vertical cavity surface emitting laser VCSEL) and the thyristors (the transfer thyristor T and the setting thyristor S) may be reversed, and the polarity of the circuit may be changed. That is, the anode common configuration may be changed to a cathode common configuration.

The transfer thyristor T and the setting thyristor S according to each exemplary embodiment may have a structure other than the four-layer p-n-p-n structure as long as the structure achieves the functions of the transfer thyristor T and the setting thyristor S in each exemplary embodiment. For example, the structure employed may be a p-i-n-i-n structure, a p-i-p-i-n structure, an n-p-i-p structure, or a p-n-i-n structure that exhibits characteristics of a thyristor. In this case, one of the i-layer, the n-layer, and the i-layer sandwiched between "p" and "n" of the p-i-n-i-n-structure, or one of the n-layer and the i-layer sandwiched between "p" and "n" of the p-n-i-n structure may serve as a gate layer, and an n-ohmic electrode disposed over the gate layer may serve as a terminal corresponding to the gate Gt (the gate Gs). Alternatively, one of the i-layer, the p-layer, and the i-layer sandwiched between "n" and "p" of the p-i-p-i-n structure, or one of the p-layer and the i-layer sandwiched between "n" and "p" of the n-p-i-p structure may serve as a gate layer, and a p-ohmic electrode disposed over the gate layer may serve as a terminal corresponding to the gate Gt (the gate Gs).

The foregoing description is directed to use of a p-type GaAs substrate as an example of the substrate 80. The following describes an example of various semiconductor layers (the semiconductor laminate formed in the semiconductor laminate forming step illustrated in FIG. 12A) that are formed when other substrates are used.

First, an example of a semiconductor laminate formed when a GaN substrate is used will be described below.

The p-anode layer 81 is a p-type $Al_{0.9}GaN$ layer with an impurity concentration of $1 \times 10^{18}/cm^3$, for example. The Al composition may be varied in the range from 0 to 1.

The n-gate layer 82 is an n-type $Al_{0.9}GaN$ layer with an impurity concentration of $1 \times 10^{17}/cm^3$, for example. The Al composition may be varied in the range from 0 to 1.

The p-gate layer 83 is a p-type $Al_{0.9}GaN$ layer with an impurity concentration of $1 \times 10^{17}/cm^3$, for example. The Al composition may be varied in the range from 0 to 1.

The n-cathode layer 84 is an n-type $Al_{0.9}GaN$ layer with an impurity concentration of $1 \times 10^{18}/cm^3$, for example. The Al composition may be varied in the range from 0 to 1.

The tunnel junction layer 85 is formed by a junction (see FIG. 12B) of the $n^{++}$ layer 85a doped with a high concentration of n-type impurities and the $p^{++}$ layer 85b doped with a high concentration of p-type impurities. The $n^{++}$ layer 85a and the $p^{++}$ layer 85b each have a high impurity concentration of, for example, $1 \times 10^{20}/cm^3$. The impurity concentration of a typical junction is on the order of $10^{17}/cm^3$ to $10^{18}/cm^3$. Examples of combinations of the $n^{++}$ layer 85a and the $p^{++}$ layer 85b (to be referred to as $n^{++}$ layer 85a/$p^{++}$ layer 85b hereinafter) include $n^{++}$GaN/$p^{++}$GaN, $n^{++}$GaInN/ p$^{++}$GaInN, and n$^{++}$AlGaN/p$^{++}$AlGaN. These combinations may be changed with each other.

The p-anode (cladding) layer 86 is formed by stacking the lower p-anode (cladding) layer 86a, the current confinement layer 86b, and the upper p-anode (cladding) layer 86c in this order (see FIG. 12C).

The lower p-anode (cladding) layer 86a and the upper p-anode (cladding) layer 86c are, for example, p-type Al$_{0.9}$GaN layers with an impurity concentration of $1\times10^{18}/$cm$^3$. The Al composition may be varied in the range from 0 to 1.

It is difficult to use an oxidized confinement layer as a current confinement layer on a GaN substrate. Accordingly, it is desired to employ a structure in which a tunnel junction layer or metal-like-conductivity group III-V compound layer is disposed in the portion corresponding to the current-passing portion α, or use the n-cathode (cladding) layer 88 formed as a ridge or buried structure. Alternatively, it is also effective to use ion implantation as a current confinement method.

The light emitting layer 87 has a quantum well structure formed by an alternate stack of well and barrier layers. The well layer is made of, for example, GaN, InGaN, or AlGaN, and the barrier layer is made of, for example, AlGaN or GaN.

The light emitting layer 87 may be made of quantum lines (quantum wires) or quantum boxes (quantum dots). The light emitting layer 87 may be formed by a combination of a well layer, a barrier layer, and spacer layers disposed above and below these layers. The light emitting layer 87 may be formed by, for example, a resonator structure.

The n-cathode (cladding) layer 88 is an n-type Al$_{0.9}$GaN layer with an impurity concentration of $1\times10^{18}$/cm$^3$, for example. The Al composition may be varied in the range from 0 to 1.

Next, an example of a semiconductor laminate formed when an InP substrate is used will be described below.

The p-anode layer 81 is a p-type InGaAsP layer with an impurity concentration of $1\times10^{18}$/cm$^3$, for example. The Ga composition and the Al composition may be varied in the range from 0 to 1.

The n-gate layer 82 is an n-type InGaAsP layer with an impurity concentration of $1\times10^{17}$/cm$^3$, for example. The Ga composition and the Al composition may be varied in the range from 0 to 1.

The p-gate layer 83 is a p-type InGaAsP layer with an impurity concentration of $1\times10^{17}$/cm$^3$, for example. The Ga composition and the Al composition may be varied in the range from 0 to 1.

The n-cathode layer 84 is an n-type InGaAsP layer with an impurity concentration of $1\times10^{18}$/cm$^3$, for example. The Ga composition and the Al composition may be varied in the range from 0 to 1.

The tunnel junction layer 85 is formed by a junction (see FIG. 12B) of the n$^{++}$ layer 85a doped with a high concentration of n-type impurities and the p$^{++}$ layer 85b doped with a high concentration of p-type impurities. The n$^{++}$ layer 85a and the p$^{++}$ layer 85b each have a high impurity concentration of, for example, $1\times10^{20}$/cm$^3$. The impurity concentration of a typical junction is on the order of $10^{17}$/cm$^3$ to $10^{18}$/cm$^3$. Examples of combinations of the n$^{++}$ layer 85a and the p$^{++}$ layer 85b (to be referred to as n$^{++}$ layer 85a/p$^{++}$ layer 85b hereinafter) include n$^{++}$InP/p$^{++}$InP, n$^{++}$InAsP/p$^{++}$InAsP, n$^{++}$InGaAsP/p$^{++}$InGaAsP, and n$^{++}$InGaAsPSb/p$^{++}$InGaAsPSb. These combinations may be changed with each other.

The p-anode (cladding) layer 86 is formed by stacking the lower p-anode (cladding) layer 86a, the current confinement layer 86b, and the upper p-anode (cladding) layer 86c in this order (see FIG. 12C).

The lower p-anode (cladding) layer 86a and the upper p-anode (cladding) layer 86c are, for example, p-type InGaAsP layers with an impurity concentration of $1\times10^{18}/$cm$^3$. The Ga composition and the Al composition may be varied in the range from 0 to 1.

It is difficult to use an oxidized confinement layer as a current confinement layer on an InP substrate. Accordingly, it is desired to employ a structure in which a tunnel junction layer or metal-like-conductivity group III-V compound layer is disposed in the portion corresponding to the current-passing portion α, or use the n-cathode (cladding) layer 88 formed as a ridge or buried structure. Alternatively, it is also effective to use ion implantation as a current confinement method.

The light emitting layer 87 has a quantum well structure formed by an alternate stack of well and barrier layers. The well layer is made of, for example, InAs, InGaAsP, AlGaInAs, or GaInAsPSb, and the barrier layer is made of, for example, InP, InAsP, InGaAsP, or AlGaInAsP.

The light emitting layer 87 may be made of quantum lines (quantum wires) or quantum boxes (quantum dots). The light emitting layer 87 may be formed by a combination of a well layer, a barrier layer, and spacer layers disposed above and below these layers. The light emitting layer 87 may be formed by, for example, a resonator structure.

The n-cathode (cladding) layer 88 is an n-type InGaAsP layer with an impurity concentration of $1\times10^{18}$/cm$^3$, for example. The Ga composition and the Al composition may be varied in the range from 0 to 1.

These semiconductor layers are stacked by, for example, metal organic chemical vapor deposition (MOCVD) or molecular beam epitaxy (MBE) to form a semiconductor laminate.

The present invention is not limited to the above exemplary embodiments but may be practiced with various modifications without departing from the scope of the invention. The exemplary embodiments may be applied to each other.

Further, the configuration according to the exemplary embodiments of the invention may be also employed for a p-type/n-type/i-type layer made of an organic material.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A laser component comprising:
   a plurality of laser devices arranged in an array to include different emission wavelengths; and
   a driving unit that, while switching each of the laser devices along the array into a turn-ON-enabled state that enables the laser device to turn to an ON state, brings one of the laser devices that has an emission wavelength corresponding to a predetermined wavelength into an ON state and maintains the ON state.

2. The laser component according to claim 1,
wherein the laser devices are arranged such that their emission wavelengths are in increasing or decreasing order in a direction of the array.

3. The laser component according to claim 1,
wherein the driving unit is capable of switching each of the laser devices into the turn-ON-enabled state in a direction of the array and in a direction opposite to the direction of the array.

4. The laser component according to claim 2,
wherein the driving unit is capable of switching each of the laser devices into the turn-ON-enabled state in a direction of the array and in a direction opposite to the direction of the array.

5. The laser component according to claim 1,
wherein each of the laser devices has an ON state of level "m (m is an integer equal to or greater than 1)", an ON state regarded to be of level "0", and an OFF state of level "0", and
wherein the laser devices are divided into a plurality of sets of laser devices, and the driving unit includes a plurality of transfer paths that sequentially transfer the turn-ON-enabled state for each of the sets such that while laser devices included in one of the sets is in the ON state of level "m", laser devices included in another one of the sets are placed in the ON state of level "0".

6. The laser component according to claim 1,
wherein the driving unit includes a plurality of setting thyristors, each of the setting thyristors being stacked together with a corresponding one of the laser devices such that a tunnel junction layer or a group III-V compound layer having a metal-like conductivity is interposed between the setting thyristor and the laser device, each of the setting thyristors setting, upon turning ON, the corresponding one of the laser devices to the turn-ON-enabled state.

* * * * *